(12) United States Patent  
Chakihara et al.

(10) Patent No.: US 8,809,934 B2  
(45) Date of Patent: *Aug. 19, 2014

(54) SEMICONDUCTOR DEVICE AND A MANUFACTURING METHOD THEREOF

(71) Applicant: Renesas Electronics Corporation, Kawasaki (JP)

(72) Inventors: Hiraku Chakihara, Kanagawa (JP); Yasushi Ishii, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/958,574

(22) Filed: Aug. 4, 2013

(65) Prior Publication Data

US 2014/0035027 A1 Feb. 6, 2014

Related U.S. Application Data

(60) Continuation of application No. 13/772,470, filed on Feb. 21, 2013, now Pat. No. 8,507,340, which is a division of application No. 12/951,012, filed on Nov. 20, 2010, now Pat. No. 8,395,203.

(30) Foreign Application Priority Data

Nov. 25, 2009 (JP) ................................. 2009-267029

(51) Int. Cl.
*H01L 29/788* (2006.01)
*H01L 21/8238* (2006.01)
*H01L 29/792* (2006.01)
*H01L 29/66* (2006.01)
*H01L 21/28* (2006.01)
*H01L 29/423* (2006.01)
*H01L 27/115* (2006.01)

(52) U.S. Cl.
CPC ........ *H01L 29/792* (2013.01); *H01L 29/66833* (2013.01); *H01L 21/28282* (2013.01); *H01L 21/28273* (2013.01); *H01L 29/42324* (2013.01); *H01L 27/115* (2013.01)

USPC ................... 257/316; 257/324; 257/E21.179; 257/E27.103; 257/E29.129; 257/E29.3; 257/E29.309; 438/211; 438/257

(58) Field of Classification Search
CPC ............ H01L 29/792; H01L 29/66833; H01L 21/28282; H01L 21/28273; H01L 29/42324; H01L 27/115
USPC ................................................... 257/316, 324
See application file for complete search history.

(56) References Cited

U.S. PATENT DOCUMENTS 6,043,530 A 3/2000 Chang
7,259,422 B1 8/2007 Hisamoto et al.
(Continued)

FOREIGN PATENT DOCUMENTS

JP 2003-309193 A 10/2003
JP 2005-347679 A 12/2005
JP 2007-251079 A 9/2007

*Primary Examiner* — Alonzo Chambliss

(74) *Attorney, Agent, or Firm* — Miles & Stockbridge P.C.

(57) ABSTRACT

A lamination pattern having a control gate electrode, a first insulation film thereover, and a second insulation film thereover is formed over a semiconductor substrate. A memory gate electrode is formed adjacent to the lamination pattern. A gate insulation film is formed between the control gate and the semiconductor substrate. A fourth insulation film, including a lamination film of a silicon oxide film, a silicon nitride film, and another silicon oxide film, is formed between the memory gate electrode and the semiconductor substrate and between the lamination pattern and the memory gate electrode. At the sidewall on the side of the lamination pattern adjacent to the memory gate electrode, the first insulation film is retreated from the control gate electrode and the second insulation film, and the upper end corner portion of the control gate electrode is rounded.

16 Claims, 24 Drawing Sheets

(56) References Cited

U.S. PATENT DOCUMENTS

| | | |
|---|---|---|
| 7,759,209 B2 | 7/2010 | Machida et al. |
| 7,767,522 B2 | 8/2010 | Toba et al. |
| 8,269,266 B2 | 9/2012 | Toba et al. |
| 8,395,203 B2 | 3/2013 | Chakihara et al. |
| 8,507,340 B2 * | 8/2013 | Chakihara et al. ............ 438/211 |
| 2003/0198086 A1 | 10/2003 | Shukuri |
| 2004/0188753 A1 | 9/2004 | Kawashima et al. |
| 2005/0272198 A1 | 12/2005 | Hamamura et al. |
| 2007/0215930 A1 | 9/2007 | Machida et al. |
| 2008/0153232 A1 | 6/2008 | Wong et al. |
| 2010/0039385 A1 | 2/2010 | Schneider |

* cited by examiner

FIG. 4

| APPLIED VOLTAGE / OPERATION | Vd | Vcg | Vmg | Vs | Vb |
|---|---|---|---|---|---|
| WRITE | 1V | Vdd | 12V | 6V | 0 |
| ERASE | 0 | 0 | −6V | 6V | 0 |
| READ | Vdd | Vdd | Vdd | 0 | 0 |

Vdd = 1.5V

SEMICONDUCTOR DEVICE AND A MANUFACTURING METHOD THEREOF

CROSS-REFERENCE TO RELATED APPLICATIONS

The disclosure of Japanese Patent Application No. 2009-267029 filed on Nov. 25, 2009 including the specification, drawings and abstract is incorporated herein by reference in its entirety.

BACKGROUND OF THE INVENTION

The present invention relates to a semiconductor device and a manufacturing method thereof. More particularly, it relates to a technology effectively applicable to a semiconductor device having a nonvolatile memory and a manufacturing method thereof.

As electrically writable/erasable nonvolatile semiconductor storage devices, EEPROMs (Electrically Erasable and Programmable Read Only Memories) have been widely used. The storage devices (memories) typified by currently and widely used flash memories have conductive floating gate electrodes surrounded by an oxide film and trapping insulation films under gate electrodes of MISFETs. The storage devices use charge storage states at the floating gates and the trapping insulation film as storage information, and read out the information as a threshold value of each transistor. The trapping insulation film denotes an insulation film capable of storing electric charges. As one example thereof, mention may be made of a silicon nitride film. Injection/discharge of charges into such charge storage regions causes each MISFET to be shifted in threshold value and to operate as a storage element. The flash memories include a split gate type cell using a MONOS (Metal-Oxide-Nitride-Oxide-Semiconductor) film. Such a memory has the following advantages: use of a silicon nitride film as a charge storage region leads to an excellent data holding reliability because electric charges are stored discretely as compared with a conductive floating gate, and the excellent data holding reliability can reduce the film thickness of the oxide films over and under the silicon nitride film, which enables a lower voltage for write/erase operation; and other advantages.

Japanese Unexamined Patent Publication No. 2005-347679 (PTL 1) and Japanese Unexamined Patent Publication No. 2003-309193 (PTL 2) each describe the following technology: in a MONOS type nonvolatile memory, over a selection gate electrode (control gate electrode), an insulation film is formed, and at the sidewall of a lamination film including the selection gate electrode (control gate electrode), and the insulation film formed thereover, a memory gate electrode (memory gate) is formed.

Japanese Unexamined Patent Publication No. 2007-251079 (PTL 3) discloses a problem of preventing a short circuit between the control gate electrode and the memory gate electrode of a MONOS type nonvolatile memory. As a solving means therefor, there is described the following technology: over the control gate electrode and the memory gate electrode of the MONOS type nonvolatile memory, silicide is formed, and the surface of the silicide is oxidized, thereby to improve the reliability and the manufacturing yield of the semiconductor device.

CITED LITERATURE

Patent Literature

[PTL 1]
Japanese Unexamined Patent Publication No. 2005-347679
[PTL 2]
Japanese Unexamined Patent Publication No. 2003-309193
[PTL 3]
Japanese Unexamined Patent Publication No. 2007-251079

SUMMARY OF THE INVENTION

A study by the present inventors revealed the following.

A split gate type nonvolatile memory using a MONOS film has the following structure: a control gate electrode and a memory gate electrode are adjacent to each other; under the control gate electrode, a silicon oxide film as a gate insulation film exists; under the memory gate electrode, a lamination gate insulation film having a charge storage part exists; and the lamination gate insulation film also extends between the memory gate electrode and the control gate electrode adjacent thereto. Therefore, the control gate electrode and the memory gate electrode are insulated and isolated from each other via the lamination gate insulation film. As the lamination gate insulation film, for example, an ONO (Oxide-Nitride-Oxide) film is formed as a lamination structure of silicon oxide films and a silicon nitride film. Below, the lamination gate insulation film will be described as an ONO film.

However, the control gate electrode and the memory gate electrode are adjacent to each other via a thin ONO film. This structure causes a fear of a short-circuit failure or a leakage current between the control gate electrode and the memory gate electrode. The short-circuit failure between the control gate electrode and the memory gate electrode reduces the manufacturing yield of a semiconductor device having a nonvolatile memory. Whereas, the leakage current between the control gate electrode and the memory gate electrode reduces the performances of a semiconductor device having a nonvolatile memory.

It is an object of the present invention to provide a technology capable of improving the performances of a semiconductor device.

Further, it is another object of the present invention to provide a technology capable of improving the manufacturing yield of a semiconductor device.

The foregoing and other objects and novel features of the present invention will be apparent from the description of this specification and the accompanying drawings.

Summaries of the representative ones of the inventions disclosed in the present application will be described in brief as follows.

A semiconductor device in accordance with a representative embodiment includes: a semiconductor substrate; a lamination pattern formed over the top of the semiconductor substrate; a second gate electrode formed over the top of the semiconductor substrate, and adjacent to the lamination pattern; a first gate insulation film formed between the first gate electrode and the semiconductor substrate; and a third insulation film formed between the second gate electrode and the semiconductor substrate, and between the lamination pattern and the second gate electrode. The lamination pattern has the first gate electrode, a first insulation film over the first gate electrode, and a second insulation film over the first insulation film. Further, the third insulation film has a charge storage part in the inside thereof. Then, at the sidewall on the side of the lamination pattern adjacent to the second gate electrode, the first insulation film is retreated from the first gate electrode and the second insulation film, and the upper end corner portion of the first gate electrode is rounded.

Further, a method for manufacturing a semiconductor device in accordance with a representative embodiment is a method for manufacturing a semiconductor device, the semiconductor device, including: a semiconductor substrate; a first gate electrode and a second gate electrode formed over the top of the semiconductor substrate, and adjacent to each other; a first gate insulation film formed between the first gate electrode and the semiconductor substrate; and a second gate insulation film formed between the second gate electrode and the semiconductor substrate, and having a charge storage part in the inside thereof. Then, the method includes the steps of: (a) preparing the semiconductor substrate; (b) forming an insulation film for the first gate insulation film over the main surface of the semiconductor substrate; (c) forming a first conductor film for the first gate electrode over the insulation film; (d) forming a first insulation film over the first conductor film; and (e) forming a second insulation film over the first insulation film. The method further includes the steps of: (f) patterning the second insulation film, the first insulation film, and the first conductor film, and forming a lamination pattern having the first conductor film forming the first gate electrode, the first insulation film over the first conductor film, and the second insulation film over the first insulation film; and (g) side etching the first insulation film at a sidewall of the lamination pattern, and retreating the first insulation film from the first conductor film and the second insulation film. Then, the method still further includes the steps of: (h) after the step (g), forming a third insulation film for the second gate insulation film, and having a charge storage part in the inside thereof over the main surface of the semiconductor substrate and the sidewall of the lamination pattern; and (i) forming the second gate electrode adjacent to the lamination pattern via the third insulation film over the third insulation film.

Effects obtainable by the representative ones of the inventions disclosed in the present application will be described in brief as follows.

In accordance with representative embodiments, it is possible to improve the performances of the semiconductor device.

Further, it is possible to improve the manufacturing yield of the semiconductor device.

BRIEF DESCRIPTION OF THE DRAWINGS

FIG. 4 is a table showing one example of the conditions for application of voltages to respective sites of a selection memory cell for "write", "erase", and "read";

PREFERRED EMBODIMENTS OF THE INVENTION

Figure 1:
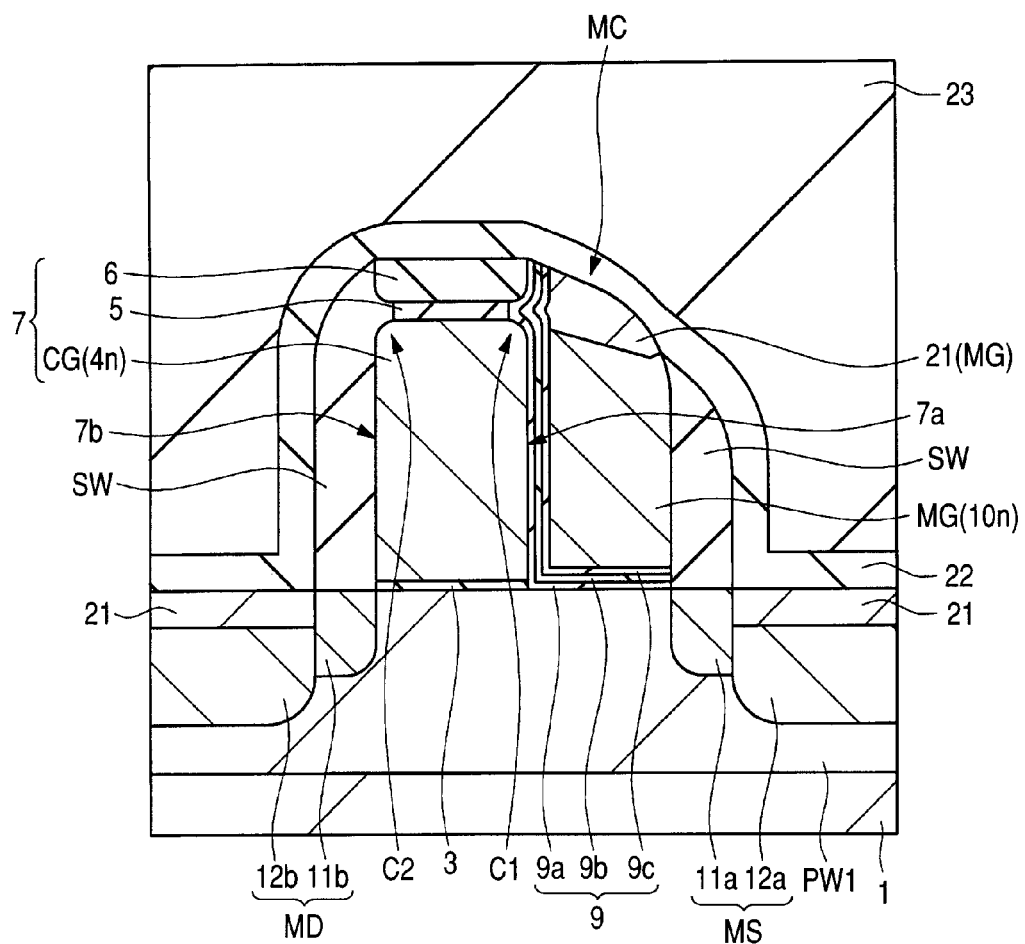
FIG. 1 is an essential part cross-sectional view of a semiconductor device which is one embodiment of the present invention.

In description of the following embodiment, the embodiment may be described in a plurality of divided sections or embodiments for convenience, if required. However, unless otherwise specified, these are not independent of each other, but are in a relation such that one is a modification example, or details, complementary explanation, or the like of a part or the whole of the other. Further, in the following embodiments, when a reference is made to the number of elements, and the like (including number, numerical value, quantity, range, or the like), the number of elements is not limited to the specific number, but may be greater than or less than the specific number, unless otherwise specified, and except the case where the number is apparently limited to the specific number in principle, and other cases. Further in the following embodiments, it is needless to say that the constitutional elements (including element steps, or the like) are not always essential, unless otherwise specified, and except the case where they are apparently considered essential in principle, and other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and ranges.

Below, embodiments of the present invention will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle, unless particularly required.

Further, in drawings to be used in embodiments, hatching may be omitted for ease of understanding of the drawings even in a cross-sectional view. Whereas, for ease of understanding of the drawings, hatching may be provided even in a plan view

Embodiment 1

The present invention is a semiconductor device including a nonvolatile memory (nonvolatile storage element, flash memory, or nonvolatile semiconductor storage device). The nonvolatile memory mainly uses a trapping insulation film (charge storable insulation film) as a charge storage part. In the following embodiments, a nonvolatile memory will be described with reference to a memory cell based on an n channel type MISFET (MISFET: Metal Insulator Semiconductor Field Effect Transistor), and using a trapping insulation film. Further, the polarities (the polarity of applied voltage and the polarity of carriers for write/erase/read) in the following embodiments are for describing the operation in the case of a memory cell based on an n channel type MISFET. When a memory cell is based on a p channel type MISFET, by reversing all the polarities of applied voltages, the conductivity type of carriers, and the like, it is possible to obtain the same operation in principle.

A semiconductor device of the present embodiment and a manufacturing method thereof will be described by reference to the accompanying drawings.

Figure 2:
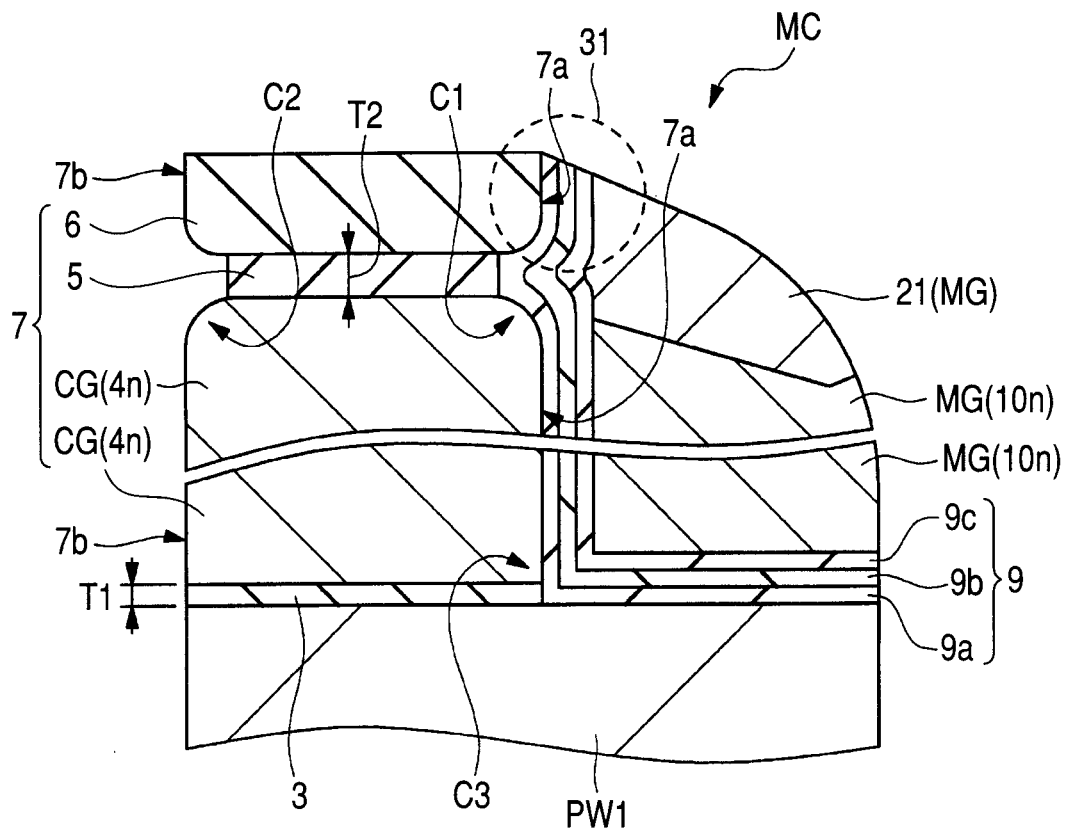
FIG. 2 is a partially enlarged cross-sectional view of a portion of FIG. 1 on an enlarged scale.
Figure 3:
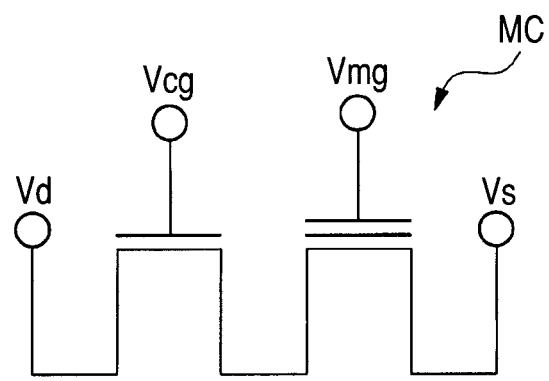
FIG. 3 is an equivalent circuit diagram of a memory cell.

FIG. 1 is an essential part cross-sectional view of the semiconductor device of the present embodiment. The semiconductor device of the present embodiment is a semiconductor device including a nonvolatile memory. FIG. 1 shows an essential part cross-sectional view of a memory cell region of the nonvolatile memory. FIG. 2 is a partially enlarged cross-sectional view (essential part cross-sectional view) of a memory cell MC in the semiconductor device of the present embodiment, and shows a part of FIG. 1 on an enlarged scale. FIG. 3 is the equivalent circuit diagram of the memory cell MC. Incidentally, FIG. 2 shows only a lamination pattern 7, a memory gate electrode MG, and insulation films 3 and 9, and a substrate region (a part of a semiconductor substrate 1 forming a p type well PW1) immediately under them of the structure of FIG. 1 for facilitating understanding thereof.

The nonvolatile memory shown in FIGS. 1 to 3 is a split gate type memory cell using a MONOS film.

As shown in FIGS. 1 and 2, in the semiconductor substrate (semiconductor wafer) 1 including a p type single-crystal silicon having a specific resistance of, for example, about 1 to 10 Ωcm, there is formed an element isolation region for isolating elements (which corresponds to an element isolation region 2 described later, but is herein not shown). In an active region isolated (defined) by the element isolation region, the p type well PW1 is formed. In the p type well PW1 in the memory cell region, there is formed the memory cell MC of a nonvolatile memory including a memory transistor and a control transistor (selection transistor) as shown in FIGS. 1 and 2. In each memory cell region, a plurality of memory cells MC are formed in an array. Each memory cell region is electrically isolated from other regions by the element isolation regions.

As shown in FIGS. 1 to 3, the memory cell MC of the nonvolatile memory in the semiconductor device of the present embodiment is a split gate type memory cell using a MONOS film, and includes two MISFETs of a control transistor (selection transistor) having a control gate electrode (selection gate electrode) CG, and a memory transistor having a memory gate electrode (gate electrode for memory) MG, coupled to each other.

Herein, a MISFET (Metal Insulator Semiconductor Field Effect Transistor) including a gate insulation film having a charge storage part, and a memory gate electrode MG is referred to as a memory transistor (transistor for storage). Whereas, a MISFET including a gate insulation film and a control gate electrode CG is referred to as a control transistor (selection transistor or transistor for memory cell selection). Therefore, the memory gate electrode MG is the gate electrode of the memory transistor. The control gate electrode CG is the gate electrode of the control transistor. The control gate electrode CG and the memory gate electrode MG are gate electrodes forming (the memory cell of) the nonvolatile memory.

Below, the configuration of the memory cell MC will be specifically described.

As shown in FIGS. 1 and 2, the memory cell MC of the nonvolatile memory has n type semiconductor regions MS and MD for source and drain, respectively, formed in the p type well PW1 of the semiconductor substrate 1, the lamination pattern 7 formed over the top of the semiconductor substrate 1 (p type well PW1), and a memory gate electrode MG formed over the top of the semiconductor substrate 1 (p type well PW1), and adjacent to the lamination pattern 7. The lamination pattern 7 has the control gate electrode CG, an insulation film 5 over the control gate electrode CG, and an insulation film 6 over the insulation film 5. Then, the memory cell MC of the nonvolatile memory further has an insulation film (gate insulation film) 3 formed between the control gate electrode CG and the semiconductor substrate 1 (p type well PW1), and an insulation film 9 formed between the memory gate electrode MG and the semiconductor substrate 1 (p type well PW1) and between the memory gate electrode MG and the lamination pattern 7 (control gate electrode CG).

The lamination pattern 7 and the memory gate electrode MG extend and are disposed side by side along the main surface of the semiconductor substrate 1 with the insulation film 9 interposed between the opposing side surfaces (sidewalls) thereof. The control gate electrode CG and the memory gate electrode MG are formed over the top of the semiconductor substrate 1 (p type well PW1), and over between the semiconductor region MD and the semiconductor region MS via the insulation films 3 and 9 (wherein, for the control gate electrode CG, via the insulation film 3, and for the memory gate electrode MG, via the insulation film 9). On the side of the semiconductor region MS, the memory gate electrode MG is situated. On the side of the semiconductor region MD, the control gate electrode CG is situated.

The lamination pattern 7 including the control gate electrode CG and the memory gate electrode MG are adjacent to each other with the insulation film 9 interposed therebetween. The memory gate electrode MG is formed in a sidewall spacer form over the sidewall (side surface) 7a of the lamination pattern 7 via the insulation film 9. This results in that the control gate electrode CG and the memory gate electrode MG are adjacent to each other with the insulation film 9 interposed therebetween. Further, the insulation film 9 extends across both regions of a region between the memory gate electrode MG and the semiconductor substrate 1 (p type well PW1) and a region between the memory gate electrode MG and the lamination pattern 7 (control gate electrode CG).

A portion of the insulation film 3 formed between the control gate electrode CG and the semiconductor substrate 1 (p type well PW1) (i.e., a portion of the insulation film 3 under the control gate electrode CG) functions as the gate insulation film of the control transistor. Whereas, a portion of the insulation film 9 between the memory gate electrode MG and the semiconductor substrate 1 (p type well PW1) (i.e., a portion of the insulation film 9 under the memory gate electrode MG) functions as the gate insulation film of the memory transistor (the gate insulation film having a charge storage part in the inside thereof).

The insulation film 9 is a gate insulation film (ONO film) of a lamination structure in which as an insulation film for storing electric charges (i.e., a charge storage part), for example, a silicon nitride film 9b, and as insulation films situated thereover and thereunder, for example, a silicon oxide film 9c and a silicon oxide film 9a are stacked. Namely, the insulation film 9 includes a lamination film having the silicon oxide film (oxide film) 9a, the silicon nitride film (nitride film) 9b over the silicon oxide film 9a, and the silicon oxide film (oxide film) 9c over the silicon nitride film 9b. In other words, the ONO (oxide-nitride-oxide) film in which the silicon oxide film 9a, the silicon nitride film 9b, and the silicon oxide film 9c are stacked sequentially from the side more distant from the memory gate electrode MG forms the insulation film 9. The silicon nitride film 9b is a trapping insulation film formed in the insulation film 9, and functions as a charge storage film for storing charges (charge storage part). For this reason, the insulation film 9 can be regarded as an insulation film having the charge storage part (herein, the silicon nitride film 9b) in the inside thereof.

The semiconductor region MS is a semiconductor region functioning as one of the source region or the drain region. The semiconductor region MD is a semiconductor region functioning as the other of the source region or the drain region. Herein, the semiconductor region MS is a semiconductor region functioning as the source region. The semiconductor region MD is a semiconductor region functioning as the drain region. The semiconductor regions MS and MD each include a semiconductor region including n type impurities introduced therein (n type impurity diffusion layer), and each have a LDD (lightly doped drain) structure. Namely, the semiconductor region MS for source has an $n^-$ type semiconductor region 11a, and an $n^+$ type semiconductor region 12a having a higher impurity concentration than that of the $n^-$ type semiconductor region 11a. The semiconductor region MD for drain has an $n^-$ type semiconductor region 11b, and an $n^+$ type semiconductor region 12b having a higher impurity concentration than that of the $n^-$ type semiconductor region 11b. The $n^+$ type semiconductor region 12a is deeper in junction depth, and higher in impurity concentration than the $n^-$ type semiconductor region 11a. Whereas, the $n^+$ type semiconductor region 12b is deeper in junction depth, and higher in impurity concentration than the $n^-$ type semiconductor region 11b.

Over the sidewalls of the memory gate electrode MG and the control gate electrode CG (the sidewalls on the sides not adjacent to each other), sidewall insulation films (sidewalls or sidewall spacers) SW including an insulator such as silicon oxide (silicon oxide film or insulation film) are formed. Namely, over the sidewall (side surface) on the side of the memory gate electrode MG opposite to the side thereof adjacent to the control gate electrode CG via the insulation film 9, and over the sidewall (side surface) on the side of the control gate electrode CG opposite to the side thereof adjacent to the memory gate electrode MG via the insulation film 9, the sidewall insulation films SW are formed.

The $n^-$ type semiconductor region 11a of the source part is formed in self-alignment with the sidewall of the memory gate electrode MG. The $n^+$ type semiconductor region 12a is formed in self-alignment with the side surface of the sidewall insulation film SW over the sidewall of the memory gate electrode MG (the side surface on the side opposite to the side in contact with the memory gate electrode MG). Accordingly, the low-concentration n⁻ type semiconductor region 11a is formed under the sidewall insulation film SW over the sidewall of the memory gate electrode MG. The high-concentration n⁺ type semiconductor region 12a is formed outside the low-concentration n⁻ type semiconductor region 11a. Therefore, the low-concentration n⁻ type semiconductor region 11a is formed in such a manner as to be adjacent to the channel region of the memory transistor. The high-concentration n⁺ type semiconductor region 12a is formed in such a manner as to be in contact with the low-concentration n⁻ type semiconductor region 11a, and to be spaced apart from the channel region of the memory transistor by the thickness of the n⁻ type semiconductor region 11a.

The n⁻ type semiconductor region 11b of the drain part is formed in self-alignment with the sidewall of the control gate electrode CG. The n⁺ type semiconductor region 12b is formed in self-alignment with the side surface of the sidewall insulation film SW over the sidewall of the control gate electrode CG (the side surface on the side opposite to the side in contact with the control gate electrode CG). Accordingly, the low-concentration n⁻ type semiconductor region 11b is formed under the sidewall insulation film SW over the sidewall of the control gate electrode CG. The high-concentration n⁺ type semiconductor region 12b is formed outside the low-concentration n⁻ type semiconductor region 11b. Therefore, the low-concentration n⁻ type semiconductor region 11b is formed in such a manner as to be adjacent to the channel region of the control transistor. The high-concentration n⁺ type semiconductor region 12b is formed in such a manner as to be in contact with the low-concentration n⁻ type semiconductor region 11b, and to be spaced apart from the channel region of the control transistor by the thickness of the n⁻ type semiconductor region 11b.

Under the insulation film 9 of the memory gate electrode MG, the channel region of the memory transistor is formed. Under the insulation film 3 under the control gate electrode CG, the channel region of the control transistor is formed. In a channel formation region of the control transistor under the insulation film 3 under the control gate electrode CG, a semiconductor region (p type semiconductor region or n type semiconductor region) for adjustment of the threshold value of the control transistor is formed, if required. In a channel formation region of the memory transistor under the insulation film 9 under the memory gate electrode MG, a semiconductor region (p type semiconductor region or n type semiconductor region) for adjustment of the threshold value of the memory transistor is formed, if required.

The control gate electrode CG includes a conductor (conductor film), and preferably includes an n type silicon film 4n such as an n type polysilicon (impurities-doped polysilicon or doped polysilicon). Specifically, the control gate electrode CG includes a patterned n type silicon film 4n.

The control gate electrode CG has one of features as follows: the insulation film 5 and the insulation film 6 are stacked thereover, thereby to form the lamination pattern 7. The lamination pattern 7 is formed in the following manner: as described later, over the main surface of the semiconductor substrate 1, the n type silicon film 4n, the insulation film 5, and the insulation film 6 are formed sequentially from the bottom, resulting in a lamination film; and the lamination film is patterned. Therefore, the lamination pattern 7 includes the patterned n type silicon film 4n, insulation film 5, and insulation film 6. Then, as one of other features, at the sidewall (side surface) 7a on the side of the lamination pattern 7 adjacent to the memory gate electrode MG, the insulation film 5 is retreated (is recessed) from the control gate electrode CG and the insulation film 6.

Further, in the present embodiment, derived from the manufacturing process, also at the sidewall (side surface) 7b on the side of the lamination pattern 7 opposite to the side thereof adjacent to the memory gate electrode MG, the insulation film 5 is retreated from the control gate electrode CG and the insulation film 6. However, the important point is that at the sidewall 7a on the side of the lamination pattern 7 adjacent to the memory gate electrode MG, the insulation film 5 is retreated from the control gate electrode CG and the insulation film 6.

At the sidewalls 7a and 7b of the lamination pattern 7, the insulation film 5 is retreated from the control gate electrode CG and the insulation film 6. This is due to the following: as described later, a lamination film of the n type silicon film 4n, the insulation film 5, and the insulation film 6 formed over the main surface of the semiconductor substrate 1 is patterned, thereby to form the lamination pattern 7; then, at the sidewalls 7a and 7b of the lamination pattern 7, the insulation film 5 is side etched to be retreated from the control gate electrode CG (n type silicon film 4n) and the insulation film 6. For this reason, as the materials for the insulation film 5, it is necessary to select such materials as to be capable of enhancing the etching selectivity of the insulation film 5 relative to those of the n type silicon film 4n and the insulation film 6 (i.e., capable of enhancing the etching rate of the insulation film 5 relative to the etching rates of the n type silicon film 4n and the insulation film 6). From this viewpoint, the insulation film 5 and the insulation film 6 are required to include mutually different materials (insulation materials). In the case of the present embodiment 1, it is preferable that the insulation film 5 is a silicon oxide film, and that the insulation film 6 is a silicon nitride film. This is for the following reason. For etching of a silicon oxide film and a silicon film, and etching of a silicon oxide film and a silicon nitride film, it is possible to enhance the selectivity of the silicon oxide film. However, for etching of a silicon film and a silicon nitride film, it is difficult to ensure a high selectivity. For this reason, in the present embodiment, the silicon oxide film which can be enhanced in selectivity relative to the respective silicon film and silicon nitride film is formed as the insulation film 5 between the n type silicon film 4n and the insulation film 6. This results in that the insulation film 5 is retreated from the n type silicon film 4n and insulation film 6, which allows formation of the structure as in the present embodiment.

At the sidewalls 7a and 7b of the lamination pattern 7, the insulation film 5 is retreated from the control gate electrode CG and the insulation film 6. As a result, in the lamination pattern 7, the plane dimensions (plane area) of the insulation film 5 are (is) smaller than the plane dimensions (plane area) of the insulation film 6, and is smaller than the plane dimensions (plane area) of the control gate electrode CG. The insulation film 5 has a plane configuration to be two-dimensionally included in the insulation film 6, and to be also two-dimensionally included in the control gate electrode CG. On the other hand, in the lamination pattern 7, the insulation film 6 has almost the same plane configuration (plane dimensions) as the plane configuration (plane dimensions) of the control gate electrode. CG. Herein, for the control gate electrode CG, the insulation film 5, and the insulation film 6, plane dimensions and plane configuration correspond to the plane dimensions and plane configuration as seen in plan view parallel to the main surface of the semiconductor substrate 1, respectively.

In other words, the opposite sides of the insulation film 5 are retreated from the control gate electrode CG and the insulation film 6. Accordingly, the width of the insulation film 5 along the transverse direction of the cross section of the memory cell shown in FIG. 2 is shorter than those of the control gate electrode CG and the insulation film 6. Over the upper end of the control gate CG, and under the lower end of the insulation film 6, there are regions in which the insulation film 5 is not formed.

Further, in the present embodiment, as one of still other features, at the sidewall 7a on the side of the lamination pattern 7 adjacent to the memory gate electrode MG, the upper end corner portion (corner portion) C1 of the control gate electrode CG is rounded (is roundish, or has a round shape). In the present embodiment, derived from the manufacturing process, also at the sidewall 7b on the side of the lamination pattern 7 opposite to the side thereof adjacent to the memory gate electrode MG, the upper end corner portion (corner portion) C2 of the control gate electrode CG is rounded (is roundish, or has a round shape). However, the important point is that at the sidewall 7a on the side of the lamination pattern 7 adjacent to the memory gate electrode MG, the upper end corner portion C1 of the control gate electrode CG is rounded.

Herein, the upper end corner portion C1 of the control gate electrode CG corresponds to the corner portion between the top surface of the control gate electrode CG and the side surface on the side of the control gate electrode CG adjacent to the memory gate electrode MG (the side surface corresponding to the sidewall 7a). Whereas, the upper end corner portion C2 of the control gate electrode CG corresponds to the corner portion between the top surface of the control gate electrode CG and the side surface on the side of the control gate electrode CG opposite to the side thereof adjacent to the memory gate electrode MG (the side surface corresponding to the sidewall 7b).

Further, it is preferable that the thickness T2 of the insulation film 5 forming the lamination pattern 7 is larger than the thickness T1 of the insulation film 3 situated under the control gate electrode CG (i.e., T2>T1). Whereas, the insulation film 3 can be formed of, for example, a silicon oxide film or a silicon oxynitride film. However, it is more preferable that as the insulation film 3, a silicon oxynitride film is used. This is in order to minimize etching (side etching) of the insulation film 3 situated under the control gate electrode CG when at the sidewalls 7a and 7b of the lamination pattern 7, the insulation film 5 is side etched to form a structure in which the insulation film 5 is retreated from (the n type silicon film 4n forming) the control gate electrode CG, and the insulation film 6. As a result, it is possible to more improve the reliability of the insulation film 3 as the gate insulation film.

Further, for the insulation film 3, other than the silicon oxide film, the silicon oxynitride film, or the like, there may be used a metal oxide film having a higher dielectric constant than that of the silicon nitride film, such as a hafnium oxide film, an aluminum oxide film (alumina), or a tantalum oxide film.

Further, as described later, at the sidewall of the lamination pattern 7, the insulation film 5 is side etched to be retreated from the control gate electrode CG and the insulation film 6. Then, the insulation film 9 is formed. Accordingly, in a region in which the insulation film 5 is retreated at the sidewall 7a of the lamination pattern 7 (the sidewall 7a on the side adjacent to the memory gate electrode MG) (the region corresponding to a region 30a shown in FIG. 13 described later), a portion of the insulation film 9 penetrates. Specifically, the insulation film 9 includes a lamination film of the silicon oxide film 9a, the silicon nitride film 9b, and the silicon oxide film 9c. Accordingly, in a region in which the insulation film 5 is retreated at the sidewall 7a of the lamination pattern 7 (the sidewall 7a on the side adjacent to the memory gate electrode MG) (the region corresponding to the region 30a shown in FIG. 13 described later), a portion of the silicon nitride film 9b also penetrates.

The memory gate electrode MG includes a conductor (conductor film). However, it preferably includes an n type silicon film 10n such as an n type polysilicon (impurities-doped polysilicon or doped polysilicon). The memory gate electrode MG is formed in the following manner. As described later, the n type silicon film 10n formed in such a manner as to cover the lamination pattern 7 over the semiconductor substrate 1 is anisotropically etched. Thus, over the sidewall of the lamination pattern 7, the n type silicon film 10n is left via the insulation film 9. Accordingly, the memory gate electrode MG is formed in a sidewall spacer form over the sidewall of the lamination pattern 7 via the insulation film 9.

Over the top (top surface) of (the n type silicon film 10n forming) the memory gate electrode MG, and the top surfaces (surfaces of) the $n^+$ type semiconductor regions 12a and 12b, a metal silicide layer (metal silicide film) 21 is formed by a salicide process or the like. The metal silicide layer 21 includes, for example, a cobalt silicide layer or a nickel silicide layer. The metal silicide layer 21 can lower the diffusion resistance and the contact resistance. The combination of the n type silicon film 10n forming the memory gate electrode MG, and the metal silicide layer 21 over the top thereof can also be regarded as the memory gate electrode MG.

On the other hand, over the control gate electrode CG, the insulation films 5 and 6 are stacked. Accordingly, over the top of the control gate electrode CG, a metal silicide layer such as the metal silicide layer 21 is not formed. Namely, over the control gate electrode CG, the insulation film 5 is formed in contact with the control gate electrode CG. Over the insulation film 5, the insulation film 6 is formed in contact with the insulation film 5.

Over the semiconductor substrate 1, an insulation film 22, and an insulation film 23 over the insulation film 22 are formed in such a manner as to cover the lamination pattern 7, the memory gate electrode MG, and the sidewall insulation film SW. The insulation film 22 is thinner than the insulation film 23, and preferably includes a silicon nitride film. The insulation film 23 is thicker than the insulation film 22, and preferably includes a silicon oxide film. The insulation films 5 and 6 formed over the control gate CG are interposed between the top surface of the control gate electrode CG and the insulation film 22. As described later, in the insulation films 22 and 23, contact holes CNT are formed. In each contact hole CNT, a plug PG is embedded. Over the insulation film 23 including the plug PG embedded therein, a wire M1, and the like are formed, but are not shown in FIGS. 1 and 2. Incidentally, the insulation film 23 can function as an interlayer insulation film. The insulation film 22 can function as an etching stopper film for forming contact holes CNT described later in the insulation film 23.

FIG. 4 is a table showing one example of the conditions for applying voltages to respective sites of a selection memory cell at the times of "write", "erase", and "read" of the present embodiment. In the table of FIG. 4, there are shown the voltage Vd to be applied to the drain region (semiconductor region MD) of the memory cell (selection memory cell) as shown in FIGS. 2 and 3, the voltage Vcg to be applied to the control gate electrode CG, the voltage Vmg to be applied to the memory gate electrode MG, the voltage Vs to be applied to the source region (semiconductor region MS), and the base voltage Vb to be applied to the p type well PW1 at respective times of "write", "erase", and "read". Incidentally, the data shown in the table of FIG. 4 is one example of the conditions for application of voltages, is not exclusive, and if required, may be variously changed. Further, in the present embodiment, injection of electrons into the silicon nitride film 9b which is the charge storage part in the insulation film 9 of the memory transistor is defined as "write", and injection of holes (positive holes) is defined as "erase".

For the write method, hot electron write called so-called SSI (Source Side Injection) method can be used. For example, the voltages as shown in the row of "write" of FIG. 4 are applied to respective sites of the selection memory cell for performing write. Thus, electrons are injected into the silicon nitride film 9b in the insulation film 9 of the selection memory cell. Hot electrons occur in the channel region (between source and drain) under between two gate electrodes (the memory gate electrode MG and the control gate electrode CG). The hot electrons are injected into the silicon nitride film 9b which is the charge storage part in the insulation film 9 under the memory gate electrode MG. The injected hot electrons (electrons) are trapped at the trap level in the silicon nitride film 9b in the insulation film 9. As a result, the threshold voltage of the memory transistor is increased.

For the erase method, a BTBT (Band-To-Band Tunneling) phenomenon hot hole injection erase method can be used. Namely, holes (positive holes) generated by BTBT (Band-To-Band Tunneling) phenomenon are injected into the charge storage part (the silicon nitride film 9b in the insulation film 9), thereby to perform erase. For example, the voltages as shown in the row of "erase" of FIG. 4 are applied to respective sites of the selection memory cell for performing erase. Thus, holes (positive holes) are generated by the BTBT (Band-To-Band Tunneling) phenomenon to accelerate the electric field. Thus, holes are injected into the silicon nitride film 9b in the insulation film 9 of the selection memory cell. As a result, the threshold voltage of the memory transistor is reduced.

For read, for example, the voltages as shown in the row of "read" of FIG. 4 are applied to respective sites of the selection memory cell for performing read. The voltage Vmg to be applied to the memory gate electrode MG for read is set at a value between the threshold voltage of the memory transistor in the write state and the threshold voltage thereof in the erase state. This enables discrimination between the write state and the erase state.

Then, a description will be given to a method for manufacturing a semiconductor device of the present embodiment.

Figure 5:
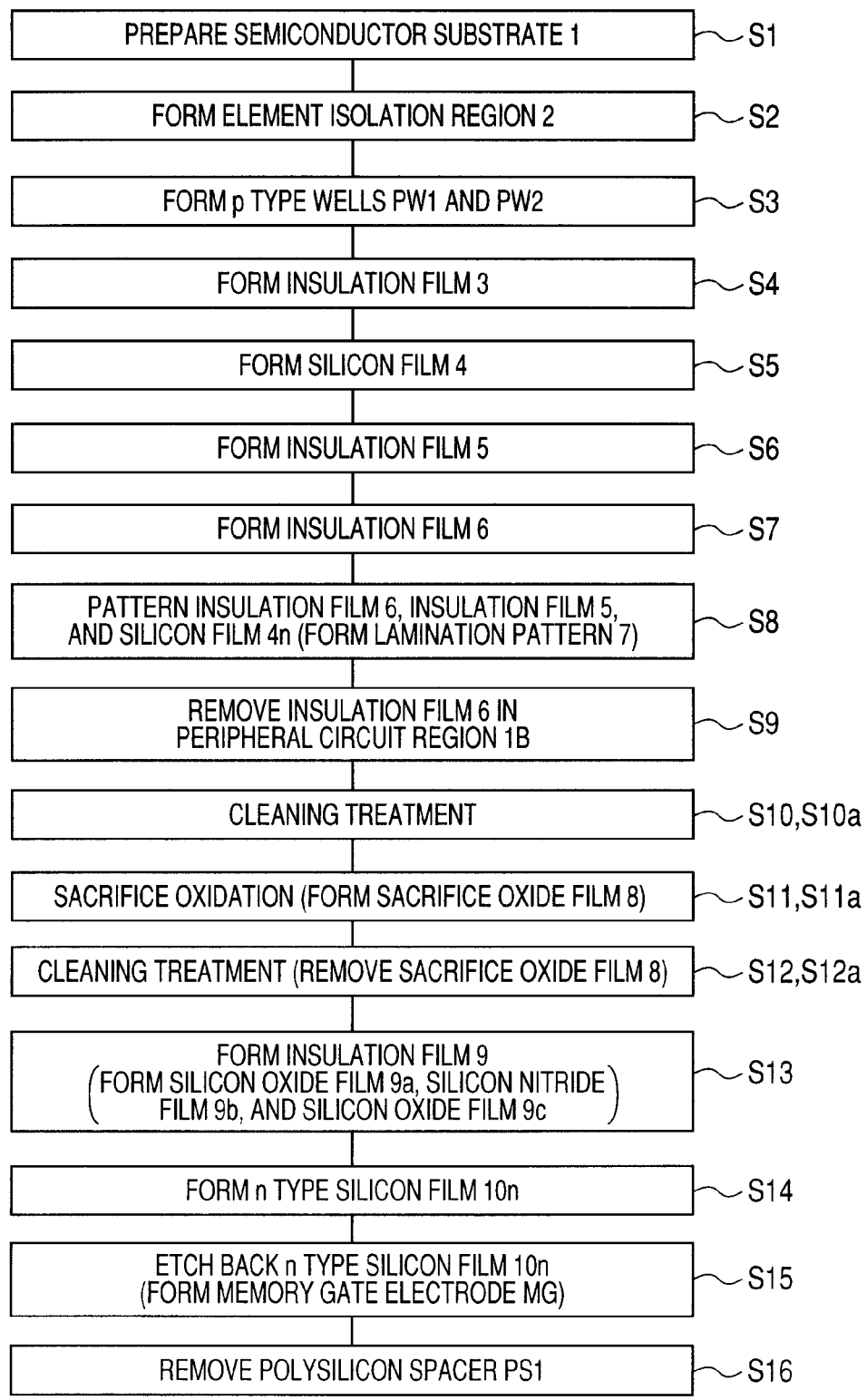
FIG. 5 is a process flowchart showing a part of manufacturing steps of a semiconductor device which is one embodiment of the present invention.

FIG. 5 is a process flowchart showing a part of manufacturing steps of the semiconductor device of the present embodiment. FIGS. 6 to 28 are each an essential part cross-sectional view of the semiconductor device of the present embodiment during a manufacturing step. In respective diagrams of FIGS. 6 to 11, FIG. 14, FIGS. 17 to 20, and FIGS. 22 to 28, there are shown essential part cross-sectional views of a memory cell region (a region in which the memory cell MC of the nonvolatile memory is formed) 1A and a peripheral circuit region (a region in which other circuits than the nonvolatile memory are formed) 1B. There are shown the manner in which the memory cell MC is formed in the memory cell region 1A, and the MISFET is formed in the peripheral circuit region 1B. It is also acceptable that the memory cell region 1A is not adjacent to the peripheral circuit region 1B. However, for facilitating understanding thereof, in FIGS. 6 to 11, FIG. 14, FIGS. 17 to 20, and FIGS. 22 to 28, the peripheral circuit region 1B is shown adjacent to the memory cell region 1A. Further, in FIGS. 6 to 11, FIG. 14, FIGS. 17 to 20, and FIGS. 22 to 28, the memory cell region 1A and the peripheral circuit region 1B are shown separate from each other. However, these are formed in the same semiconductor substrate 1. Further, in FIGS. 12, 13, 15, 16, and 21, there are shown the lamination pattern 7 formed in the memory cell region 1A, and the neighboring regions. Herein, examples of the peripheral circuits include processor such as CPU, control circuit, sense amplifier, column decoder, row decoder, and input/output circuit.

Further, in the present embodiment, a description will be given to the case where in the memory cell region 1A, n channel type MISFETs (the control transistor and the memory transistor) are formed. However, the following is also acceptable: the conductivity type is reversed to form p channel type MISFETs (the control transistors and the memory transistors) in the memory cell region 1A. Similarly, in the present embodiment, a description will be given to the case where in the peripheral circuit region 1B, n channel type MISFETs are formed. However, the following is also acceptable: the conductivity type is reversed to form p channel type MISFETs in the peripheral circuit region 1B. Alternatively, in the peripheral circuit region 1B, CMISFETs (Complementary MISFETs), or the like can be formed.

Figure 6:
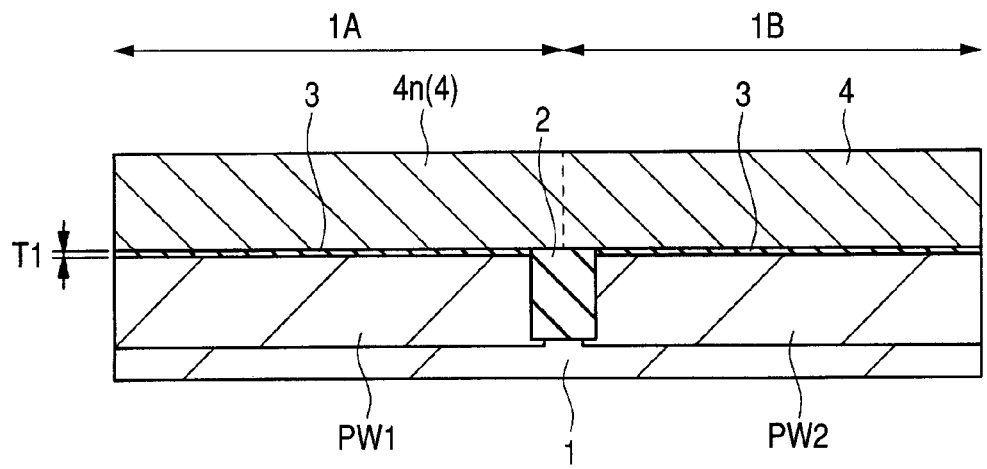
FIG. 6 is an essential part cross-sectional view during a manufacturing step of the semiconductor device of one embodiment of the present invention.

As shown in FIG. 6, first, a semiconductor substrate (semiconductor wafer) 1 including p type single-crystal silicon having a specific resistance of, for example, about 1 to 10 Ωcm, or the like is prepared (provided) (Step S1 of FIG. 5). Then, in the main surface of the semiconductor substrate 1, an element isolation region (element isolation insulation region) 2 defining (bordering) the active region is formed (Step S2 of FIG. 5). The element isolation region 2 includes an insulator such as silicon oxide, and can be formed by, for example, the STI (Shallow Trench Isolation) method or the LOCOS (Local Oxidization of Silicon) method. For example, in the main surface of the semiconductor substrate 1, grooves for element isolation are formed. Then, in the grooves for element isolation, an insulation film including, for example, silicon oxide is embedded. As a result, the element isolation region 2 can be formed.

Then, in the memory cell region 1A of the semiconductor substrate 1, a p type well PW1 is formed, and in the peripheral circuit region 1B, a p type well PW2 is formed (Step S3 of FIG. 5). The p type wells PW1 and PW2 can be formed by ion-implanting p type impurities such as boron (B) into the semiconductor substrate 1, or by other methods. The p type wells PW1 and PW2 are formed from the main surface to a predetermined depth of the semiconductor substrate 1.

Then, in order to adjust the threshold voltage of the control transistor to be formed later in the memory cell region 1A, if required, the surface part (surface layer part) of the p type well PW1 of the memory cell region 1A is subjected to channel dope ion implantation. Whereas, in order to adjust the threshold voltage of the MISFET formed later in the peripheral circuit region 1B, if required, the surface part (surface layer part) of the p type well PW2 of the peripheral circuit region 1B is subjected to channel dope ion implantation.

Then, by dilute hydrofluoric acid cleaning or the like, the surface of the semiconductor substrate 1 (p type wells PW1 and PW2) is cleaned. Then, over the main surface of the semiconductor substrate 1 (the surfaces of the p type wells PW1 and PW2), the insulation film 3 for the gate insulation film is formed (Step S4 of FIG. 5). The insulation film 3 can be formed of, for example, a thin silicon oxide film or silicon oxynitride film. However, it is more preferable that, as the insulation film 3, a silicon oxynitride film is used. Use of a silicon oxynitride film as the insulation film 3 can more precisely prevent the following: when the insulation film 5 described later is side etched (in the case of the present embodiment, corresponding to the cleaning step of Step S12 described later, in the case of Embodiment 2 described later, corresponding to the cleaning step of Step S10a), the insulation film 3 is etched (side etched). When a silicon oxynitride film is used as the insulation film 3, the silicon oxynitride film can be formed by nitriding the silicon oxide film formed by an thermal oxidation method, or by other methods. The film thickness (formed film thickness) T1 of the insulation film 3 can be set at, for example, about 2 to 3 nm.

Then, over the entire main surface of the semiconductor substrate 1, namely, over the insulation film 3, a silicon film (first conductor film) 4 is formed (deposited) as a conductor film for gate electrode (Step S5 of FIG. 5). The silicon film 4 includes a polysilicon film, and can be formed by using a CVD (Chemical Vapor Deposition) method, or the like. The film thickness (deposited thickness) of the silicon film 4 can be set at, for example, about 100 to 200 nm.

After formation of the silicon film 4, over the silicon film 4, a photoresist pattern is formed by using a photolithography method (although not shown herein, the photoresist pattern is formed in the entire peripheral circuit region 1B). By using the photoresist pattern as a mask, n type impurities are introduced into the (silicon film 4) of the memory cell region 1A by an ion implantation method or the like. As a result, in the memory cell region 1A, the n type silicon film 4n is formed. Namely, n type impurities are introduced into the silicon film 4 in the memory cell region 1A. As a result, the silicon film 4 in the memory cell region 1A becomes an n type silicon film 4n doped with n type impurities.

Figure 7:
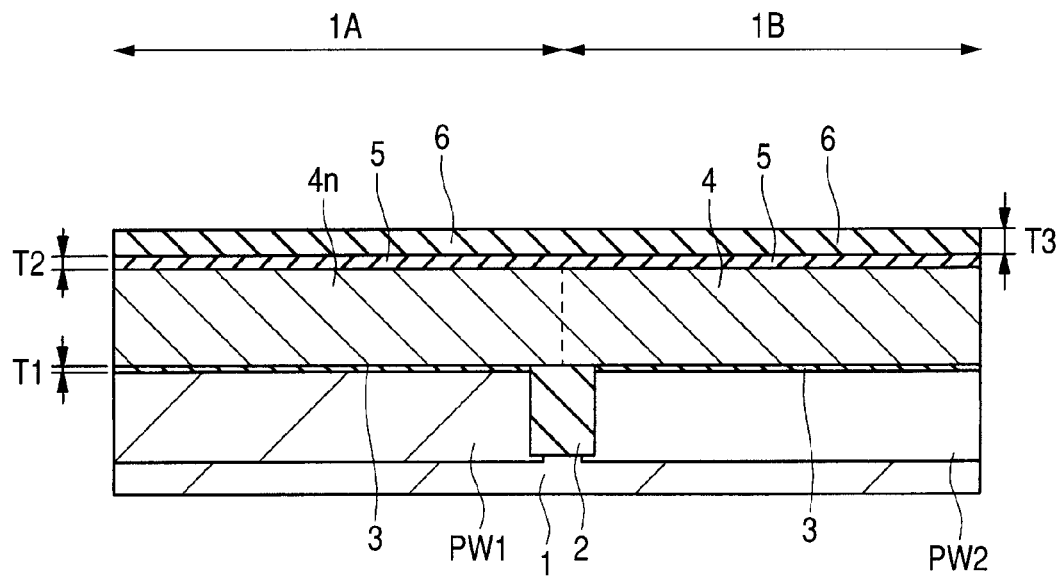
FIG. 7 is an essential part cross-sectional view of the semiconductor device during a manufacturing step following that of FIG. 6.

Then, as shown in FIG. 7, over the n type silicon film 4n in the memory cell region 1A, and over the silicon film 4 in the peripheral circuit region 1B, the insulation film (first insulation film) 5 is formed (Step S6 of FIG. 5). The insulation film 5 preferably includes a silicon oxide film, and can be formed by oxidizing the top surfaces (upper layer parts) of the n type silicon film 4n and the silicon film 4. The insulation film 5 can be formed by thermal oxidation. However, it is further preferable that the insulation film 5 is formed by ISSG (In Situ Steam Generation) oxidation. The film thickness (formed film thickness) T2 of the insulation film 5 can be set at, for example, about 5 to 10 nm.

Further, the thickness (formed film thickness) T2 of the insulation film 5 formed in Step S6 is preferably larger than the thickness (formed film thickness) T1 of the insulation film 3 formed in Step S4 (i.e., T2>T1). This can inhibit or prevent the insulation film 3 from being etched (side etched) when the insulation film 5 is side etched later (in the case of the present embodiment, corresponding to the cleaning step of Step S12 described later, in the case of Embodiment 2 described later, corresponding to the cleaning step of Step S10a).

Then, over the insulation film 5, the insulation film (second insulation film) 6 is formed (Step S7 of FIG. 5). This results in a state in which in the memory cell region 1A, over the main surface of the semiconductor substrate 1, namely, over the insulation film 3, a lamination film of the n type silicon film 4n, the insulation film 5, and the insulation film 6 is formed. The insulation film 6 is an insulation film including a different insulation material from that for the insulation film 5. The insulation film 6 preferably includes a silicon nitride film, and can be formed by a CVD method, or the like. The film thickness (formed film thickness) T3 of the insulation film 6 can be set at, for example, about 50 to 100 nm. Further, in the peripheral circuit region 1B, over the main surface of the semiconductor substrate 1, namely, over the insulation film 3, a lamination film of the silicon film 4, the insulation film 5, and the insulation film 6 is formed.

The insulation film 6 is provided in order to prevent the formation of a metal silicide layer by a salicide process over the control gate electrode CG to be formed later. The insulation film 5 is provided in order to round the upper end corner portion C1 of the control gate electrode CG to be formed later. The insulation film 5 has the insulation film 6 over the top thereof, and hence keeps the thickness (formed film thickness) T2 upon formation of the insulation film 5 at Step S6 even in a semiconductor device after manufacturing. On the other hand, the insulation film 6 may be etched in the direction of thickness in various steps after deposition. Therefore, the thickness of the insulation film 6 in the semiconductor device after manufacturing is decreased from the thickness (formed film thickness) T3 upon formation of the insulation film 6 at Step S7, resulting in a smaller value than the thickness T3.

The thickness (formed film thickness) T3 of the insulation film 6 formed at Step S7 is preferably larger than the thickness (formed film thickness) T2 of the insulation film 5 formed at Step S6 (i.e., T3>T2). This facilitates ensuring of the thickness of the insulation film 6 up to a metal silicide layer 21 formation step (salicide process) described later. This prevents a metal film 20 described later from being in contact with the control gate electrode CG, which facilitates prevention of the formation of the metal silicide layer 21 over the control gate electrode CG. Further, it is further preferable that, in a semiconductor device after manufacturing, the thickness of the insulation film 6 is larger than the thickness of the insulation film 5. As a result, even if there occur fluctuations in amount of loss when the film thickness of the insulation film 6 is decreased in various steps after deposition of the insulation film 6, it becomes possible to prevent the formation of the metal silicide layer 21 over the control gate electrode CG with reliability.

Then, the lamination film of the n type silicon film 4n, the insulation film 5, and the insulation film 6 in the memory cell region 1A is patterned by etching (Step S8 of FIG. 5). The patterning step of Step S8 can be carried out, for example, in the following manner.

Namely, over the insulation film 6, using a photolithography method, a photoresist pattern (although not shown herein, the photoresist pattern is formed in a control gate electrode CG forming region and the entire peripheral circuit region 1B) is formed. Using the photoresist pattern as an etching mask, the insulation film 6, the insulation film 5, and the n type silicon film 4n are etched (dry etched) to be patterned. Then, the photoresist pattern is removed.

As another form, over the insulation film 6, using a photolithography method, a photoresist pattern (although not shown herein, the photoresist pattern is formed in the control gate electrode CG forming region and the entire peripheral circuit region 1B) is formed. Using the photoresist pattern as an etching mask, the insulation film 6 is etched, and patterned. Then, the photoresist pattern is removed. Then, using the patterned insulation film 6 as an etching mask, portions of the underlying insulation film 5 and n type silicon film 4n exposed therefrom are etched, thereby to pattern the insulation film 5 and the n type silicon film 4n.

Figure 8:
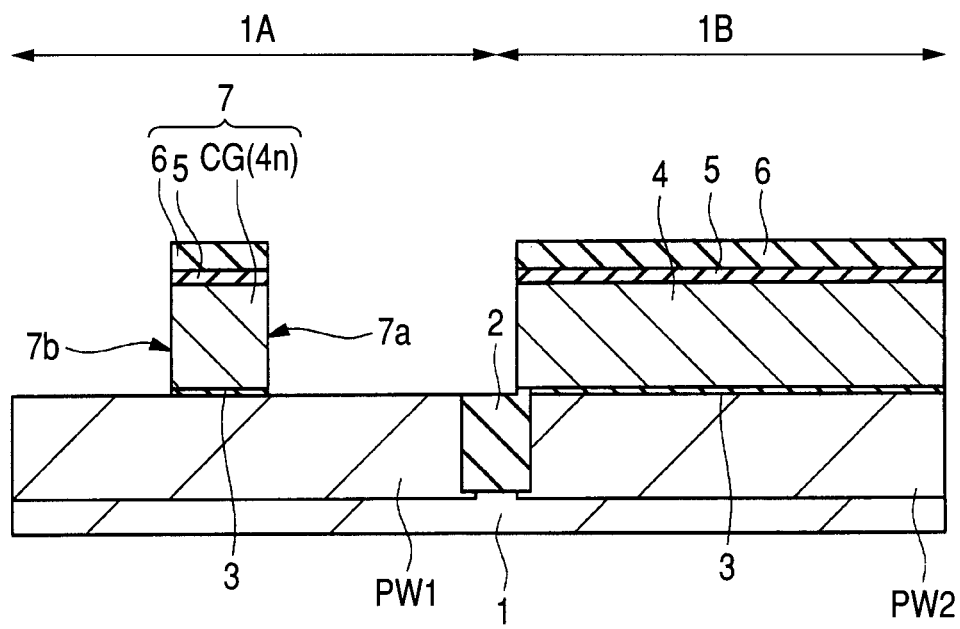
FIG. 8 is an essential part cross-sectional view of the semiconductor device during a manufacturing step following that of FIG. 7.

Thus, at Step S8, the lamination film of the n type silicon film 4n, the insulation film 5, and the insulation film 6 is patterned. As shown in FIG. 8, in the memory cell region 1A, the lamination pattern (patterned lamination film) 7 is formed. The lamination pattern 7 includes the lamination film of the n type silicon film 4n, the insulation film 5, and the insulation film 6 sequentially formed from the bottom. At this step, in the peripheral circuit region 1B, as described above, the photoresist pattern has been formed, and hence patterning is not performed.

The n type silicon film 4n (i.e., patterned n type silicon film 4n) forming the lamination pattern 7 formed in the memory cell region 1A becomes the control gate electrode CG of the control transistor. The remaining portion of the insulation film 3 under the control gate electrode CG becomes the gate insulation film of the control transistor. This results in the following state: the lamination pattern 7 has the n type silicon film 4n forming the control gate electrode CG, the insulation film 5 over the n type silicon film 4n, and the insulation film 6 over the insulation film 5, and is formed over the semiconductor substrate 1 (p type well PW1) via the insulation film 3 as the gate insulation film.

In the memory cell region 1A, portions of the insulation film 3 other than the portion thereof covered with the control gate electrode CG (lamination pattern 7) (i.e., portions of the insulation film 3 other than the portion thereof serving as the gate insulation film) may be removed by dry etching performed at the patterning step of Step S8, or performing wet etching after the dry etching. In the memory cell region 1A, portions of the insulation film 3 other than the portion thereof covered with the control gate electrode CG (i.e., portions of the insulation film 3 other than the portion thereof serving as the gate insulation film) are preferably removed at this stage. However, even when the portions remain at this stage, they are removed by the cleaning step of Step S12 described later.

The sidewall (side surface) of the lamination pattern 7 at this stage is almost flat, and is preferably almost perpendicular to the main surface of the semiconductor substrate 1. For this reason, in the memory cell region 1A, the plane configurations (plane dimensions) of the n type silicon film 4n, the insulation film 5, and the insulation film 6 forming the lamination pattern 7 are mutually almost the same. Accordingly, in the lamination pattern 7, over the control gate electrode CG, the insulation film 5 and the insulation film 6 having almost the same plane configuration (plane dimensions) as that (those) of the control gate electrode CG are stacked.

Figure 9:
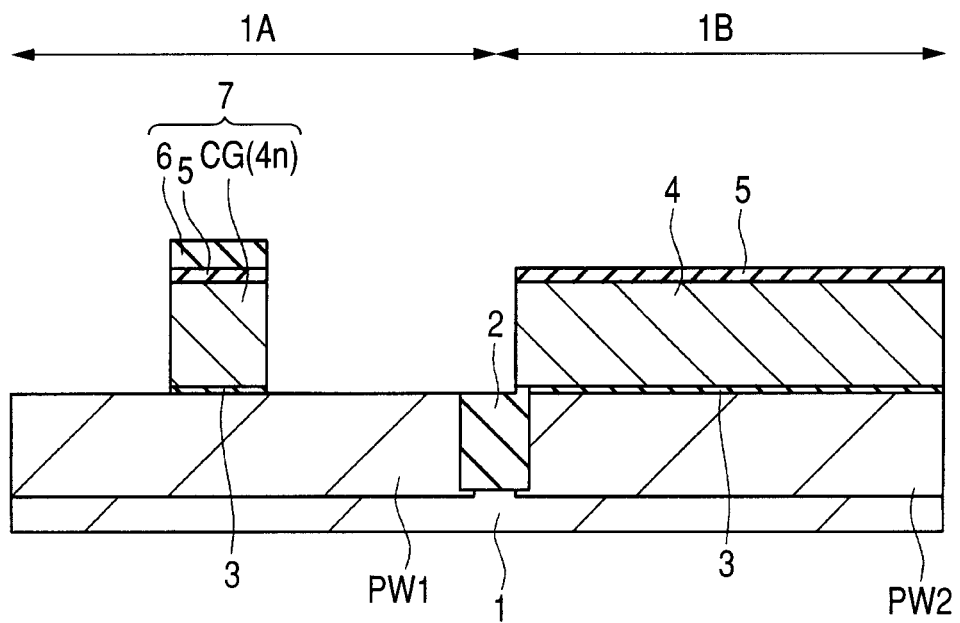
FIG. 9 is an essential part cross-sectional view of the semiconductor device during a manufacturing step following that of FIG. 8.

Then, using a photolithography method, such a photoresist pattern (not shown) as to cover the lamination pattern 7 in the memory cell region 1A, and as to expose the entire peripheral circuit region 1B is formed. Then, using the photoresist pattern as an etching mask, as shown in FIG. 9, the insulation film 6 formed in the peripheral circuit region 1B is etched, and removed (Step S9 of FIG. 5). At this step, in the peripheral circuit region 1B, the insulation film 5 functions as an etching stopper film. Further, in Step S9, the lamination pattern 7 in the memory cell region 1A is covered with the photoresist pattern. Accordingly, the insulation film 6 of the lamination pattern 7 in the memory cell region 1A is left without being etched. Then, the photoresist pattern is removed.

As a result, as shown in FIG. 9, the lamination pattern 7 in the memory cell region 1A is still in a lamination structure of the control gate electrode CG (n type silicon film 4n), the insulation film 5, and the insulation film 6. However, in the peripheral circuit region 1B, the insulation film 6 has ceased to remain.

Then, a cleaning treatment is carried out to purify the main surface of the semiconductor substrate 1 (Step S10 of FIG. 5).

In the present embodiment, the cleaning treatment of Step S10 is carried out without using hydrofluoric acid (HF). As the cleaning treatment of Step S10, one or both of cleaning with an APM (Ammonia-Hydrogen Peroxide Mixture) solution (i.e., a solution mixture of ammonia, hydrogen peroxide, and water), and cleaning with a HPM (Hydrochloric acid-Hydrogen Peroxide Mixture) solution (i.e., a solution mixture of hydrochloric acid, hydrogen peroxide, and water) are preferably performed. At the cleaning treatment of Step S10, a cleaning solution not containing hydrofluoric acid is used. For this reason, etching of the silicon oxide film is inhibited or prevented. The insulation film 5 preferably includes silicon oxide. Therefore, even when the cleaning treatment of Step S10 is performed, in the lamination pattern 7 in the memory cell region 1A, side etching of the insulation film 5 is not caused. Whereas, in the peripheral circuit region 1B, the insulation film 5 is left.

Then, sacrifice oxidation is performed (Step S11 of FIG. 5). The sacrifice oxidation of Step S11 can be performed by subjecting the semiconductor substrate 1 to an oxidation treatment, and can be preferably performed by thermal oxidation. However, the sacrifice oxidation is further preferably performed by ISSG oxidation.

The purpose of performing the sacrifice oxidation of Step S11 is as follows: in the step of patterning the lamination film of the n type silicon film 4n, the insulation film 5, and the insulation film 6 in the memory cell region 1A by etching (corresponding to the Step S8), the semiconductor substrate 1 is damaged by etching; for this reason, this portion is oxidized, thereby to eliminate the damage. Further, it is also possible to eliminate collectively the damage of the side surface of the control gate electrode CG exposed by etching. Further, although not shown, before a step of a cleaning treatment described later (corresponding to Step S12 described later), there is an ion implantation step in which a semiconductor region for adjustment of the threshold value of the memory transistor is formed. The sacrifice oxide film (silicon oxide film) 8 formed by sacrifice oxidation also plays a role of preventing the damage in the ion implantation step.

Figure 10:
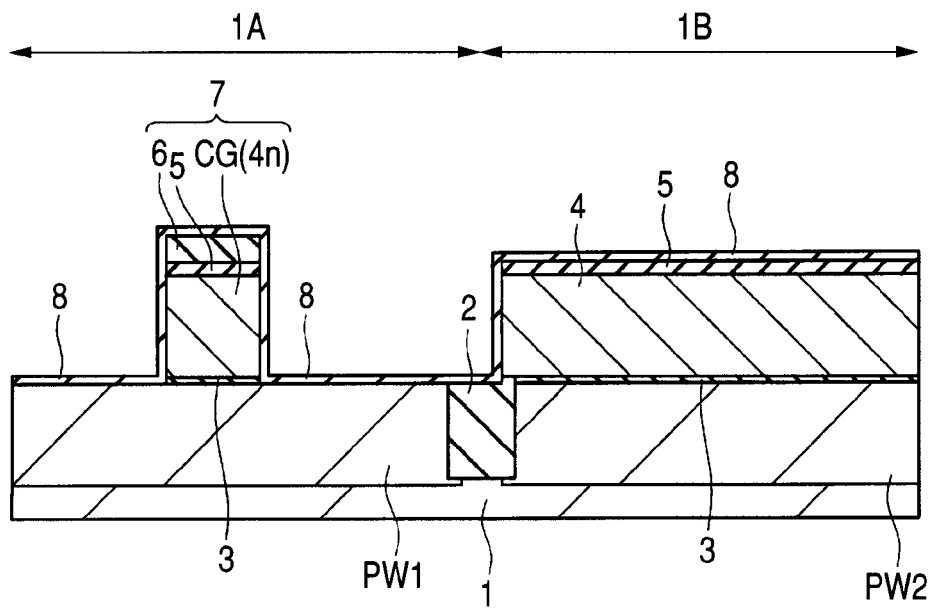
FIG. 10 is an essential part cross-sectional view of the semiconductor device during a manufacturing step following that of FIG. 9.

By the sacrifice oxidation of Step S11, as shown in FIG. 10, in the memory cell region 1A, portions of the main surface (surface) of the semiconductor substrate 1 (p type well PW1) not covered with the lamination pattern 7 (control gate electrode CG), and the side surfaces (sidewalls) of the n type silicon film 4n (control gate electrode CG) of the lamination pattern 7 are oxidized. As a result, a sacrifice oxide film (silicon oxide film) 8 is formed. Whereas, in the peripheral circuit region 1B, the surface of the insulation film 5 is oxidized. As a result, the sacrifice oxide film (silicon oxide film) 8 is formed. The film thickness of the sacrifice oxide film 8 can be set at, for example, about 3 to 6 nm. When the sacrifice oxidation of Step S11 is performed with ISSG oxidation, not only the Si region (herein, the semiconductor substrate 1 and the n type silicon film 4n in the memory cell region 1A) but also the SiN region (herein, the insulation film 6) can be oxidized. Therefore, the top surface and the side surfaces (sidewalls) of the insulation film 6 (silicon nitride film) of the lamination pattern 7 in the memory cell region 1A are also oxidized. As a result, the sacrifice oxide film 8 is formed.

By performing the sacrifice oxidation of Step S11, in the memory cell region 1A, the gate insulation film after gate processing (corresponding to the patterning step of the Step S8) (corresponding to the portion of the insulation film 3 left under the control gate electrode CG) can be recovered. This can improve the reliability of the gate insulation film.

Then, a cleaning treatment is performed to purify the main surface of the semiconductor substrate 1 (Step S12 of FIG. 5). The cleaning treatment of Step S12 is performed by using hydrofluoric acid (HF). Namely, by using dilute hydrofluoric acid (an aqueous solution of hydrofluoric acid), the cleaning treatment of Step S12 is performed.

Figure 11:
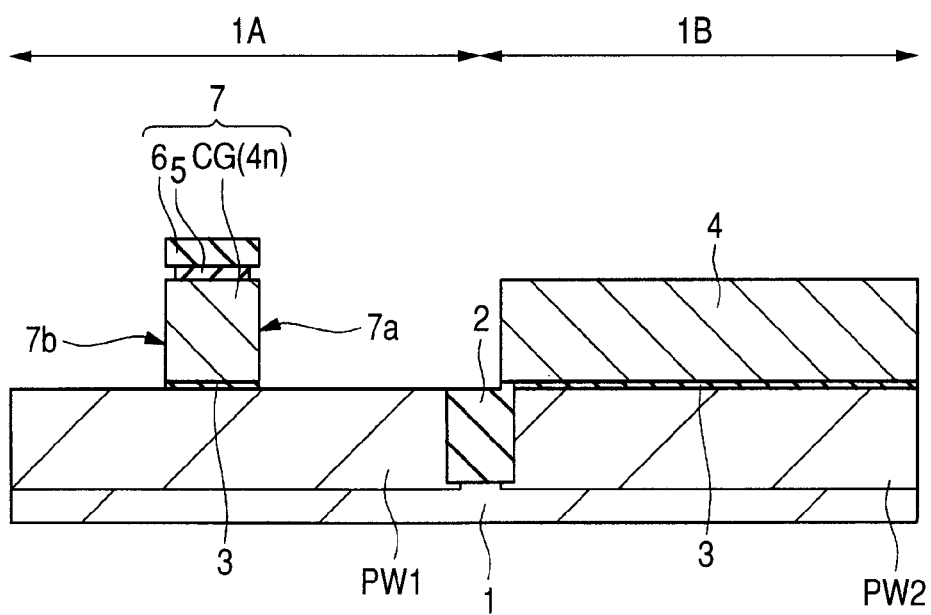
FIG. 11 is an essential part cross-sectional view of the semiconductor device during a manufacturing step following that of FIG. 10.
Figure 12:
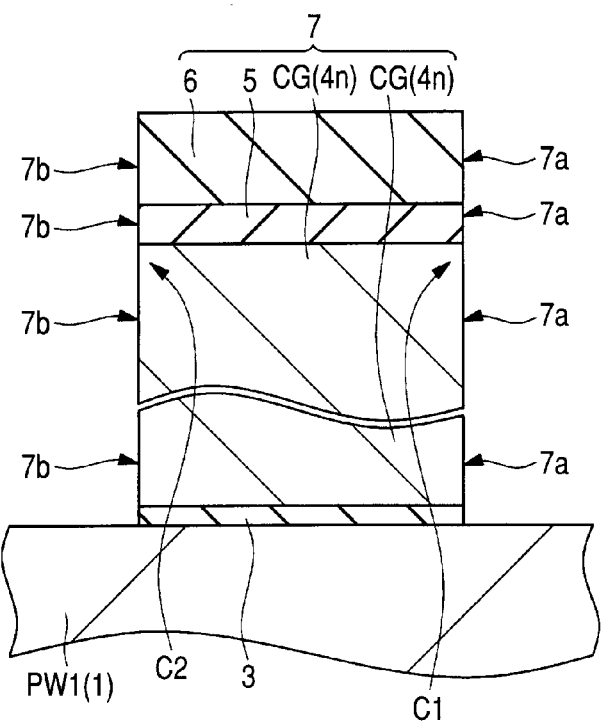
FIG. 12 is an essential part cross-sectional view of the same semiconductor device during a manufacturing step as that of FIG. 9.
Figure 13:
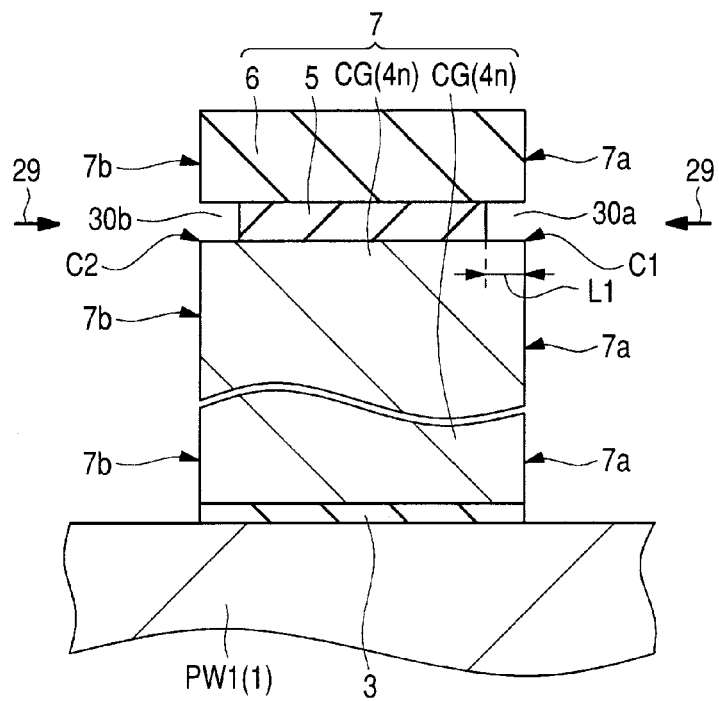
FIG. 13 is an essential part cross-sectional view of the same semiconductor device during a manufacturing step as that of FIG. 11.

FIG. 11 is an essential part cross-sectional view at the stage of having performed the cleaning treatment of Step S12, and shows the same regions (cross-sectional regions) as those in FIGS. 6 to 10. Further, FIG. 12 is an essential part cross-sectional view at the stage after performing the cleaning treatment of Step S10, and before performing the sacrifice oxidation step of Step S11. FIG. 13 is an essential part cross-sectional view at the stage of having performed the cleaning treatment of Step S12 (the stage before performing the step of forming the insulation film 9 of Step S13 described later).

FIGS. 12 and 13 each show an enlarged view of the lamination pattern 7 and the neighboring regions.

In the cleaning treatment of Step S12, a cleaning solution containing hydrofluoric acid (preferably, dilute hydrofluoric acid) is preferably used. By using hydrofluoric acid, the silicon oxide film (oxide film) may be selectively etched. For this reason, by the cleaning treatment of Step S12, as shown in FIG. 11, in the memory cell region 1A and the peripheral circuit region 1B, the sacrifice oxide film 8 is etched and removed. On the other hand, in the peripheral circuit region 1B, further, the insulation film 5 (silicon oxide film) is etched and removed. Further, as shown in FIGS. 11 and 13, in the memory cell region 1A, the insulation film 5 (silicon oxide film) is side etched. Therefore, the cleaning treatment of Step S12 can also be regarded as an etching step.

By the cleaning treatment of Step S12, the sacrifice oxide film 8 is removed. As a result, as shown in FIGS. 11 and 13, in the memory cell region 1A, the portion of the main surface (silicon surface) of the semiconductor substrate 1 (p type well PW1) not covered with the control gate electrode CG, and the side surfaces (silicon surfaces of) the control gate electrode CG are exposed. In the peripheral circuit region 1B, the top surface (silicon surface) of the silicon film 4 is exposed.

On the other hand, in the cleaning treatment of Step S12, a cleaning solution containing hydrofluoric acid (preferably dilute hydrofluoric acid) is used. Accordingly, the silicon film and the silicon nitride film are more resistant to etching than the silicon oxide film. For this reason, in the cleaning treatment of Step S12, the semiconductor substrate 1, the silicon film 4, the n type silicon film 4n, and the insulation film 6 (silicon nitride film) are hardly etched. Namely, in the cleaning treatment of Step S12, a cleaning solution whereby the sacrifice oxide film 8 and the insulation film 5 are more likely to be etched as compared with the semiconductor substrate 1, the silicon film 4, the n type silicon film 4n, and the insulation film 6 is used. From this viewpoint, a cleaning solution containing hydrofluoric acid is preferably used.

In the lamination pattern 7 in the memory cell region 1A, the insulation film 5 (silicon oxide film) is vertically sandwiched between the insulation film 6 (silicon nitride film) and the control gate electrode CG (n type silicon film 4n). For this reason, in the cleaning step of Step S12, for the insulation film 5 of the lamination pattern 7, etching does not progress from the top surface side covered with the insulation film 6, and etching also does not progress from the bottom surface side in contact with the control gate electrode CG. However, in the cleaning treatment of Step S12, the sidewalls (side surfaces) 7a and 7b of the lamination pattern 7 are exposed to a cleaning solution containing hydrofluoric acid. Accordingly, as apparent from the comparison between FIG. 12 and FIG. 13, for the insulation film 5 (silicon oxide film), etching progresses from the side of the sidewalls (side surfaces) 7a and 7b of the lamination pattern 7, namely, from the outer circumferential side of the plane configuration of the insulation film 5 toward the inner side (the side of the center of the plane configuration of the insulation film 5). In other words, in the lamination pattern 7, the insulation film 5 exposed at the sidewalls 7a and 7b of the lamination pattern 7 is etched (side etched) in the transverse direction, i.e., in the direction in parallel with the planar direction of the insulation film 5 (corresponding to the direction generally in parallel with the main surface of the semiconductor substrate 1). Incidentally, the direction of progress of etching of the insulation film 5 in the cleaning treatment of Step S12 is schematically indicated with an arrow (etching direction) 29 in FIG. 13. Incidentally, the sidewall 7a and the sidewall 7b of the lamination pattern 7 are sidewalls situated on the mutually opposing sides. On the sidewall 7a side, the memory gate electrode MG is formed later.

However, before etching of the whole of the insulation film 5 of the lamination pattern 7, the cleaning treatment of Step S12 is terminated (stopped). Namely, in the lamination pattern 7 in the memory cell region 1A, a portion (outer circumferential region of the plane configuration) of the insulation film 5 is etched and removed. However, other portions of the insulation film 5 are not etched, and remain. This can be implemented by controlling the hydrofluoric acid concentration of the cleaning solution and the cleaning treatment time in the cleaning treatment of Step S12. Further, in the present embodiment, in the cleaning treatment of Step S12, it is necessary not only to remove the sacrifice oxide film 8, but also to side etch the insulation film 5. For this reason, as compared with the case where only the sacrifice oxide film 8 is removed (the case where side etching of the insulation film 5 is not performed), the cleaning treatment time (wet treatment time) is made longer.

Thus, the cleaning treatment of Step S12 is performed. As a result, although the lamination pattern 7 in the memory cell region 1A has a lamination structure of the control gate electrode CG (n type silicon film 4n), the insulation film 5, and the insulation film 6, the insulation film 5 is selectively side etched. On the other hand, the peripheral circuit region 1B includes only the silicon film 4, and does not have the insulation film 5 and the insulation film 6. The cleaning treatment of Step S12 is performed. As a result, the lamination pattern 7 in the memory cell region 1A is in a structure in which (the side surfaces of) the insulation film 5 (are) is retreated (i.e., recessed inward) from (the side surfaces of) the control gate electrode CG and (the side surfaces of) the insulation film 6 at sidewalls (side surfaces) thereof. Therefore, the cleaning step of Step S12 can also be regarded as a step of side etching the insulation film 5 at the sidewalls of the lamination pattern 7, and allowing the insulation film 5 to be retreated from (the n type silicon film 4n forming) the control gate electrode CG and the insulation film 6.

Figure 14:
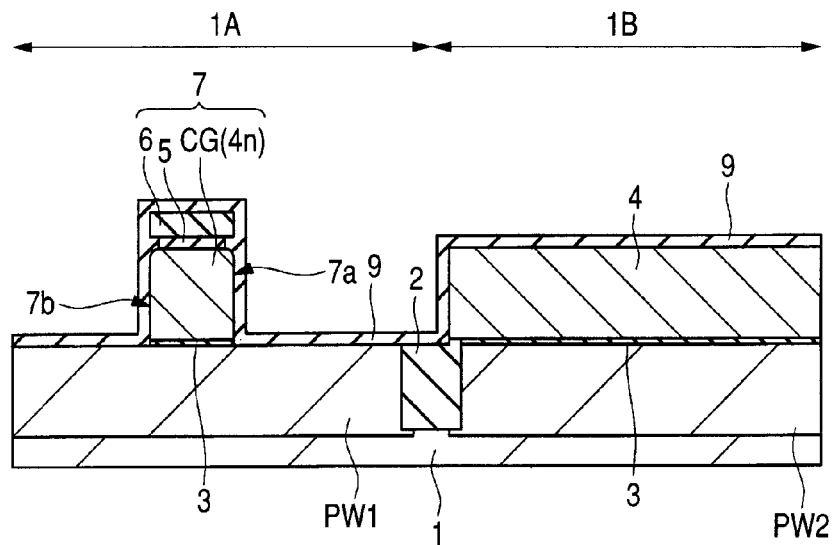
FIG. 14 is an essential part cross-sectional view of the semiconductor device during a manufacturing step following that of FIG. 11.

Then, as shown in FIG. 14, over the main surface (surface) of the semiconductor substrate 1 (p type wells PW1 and PW2) and the sidewalls of the lamination pattern 7, the insulation film 9 for the gate insulation film of the memory transistor is formed (Step S13 of FIG. 5).

Figure 15:
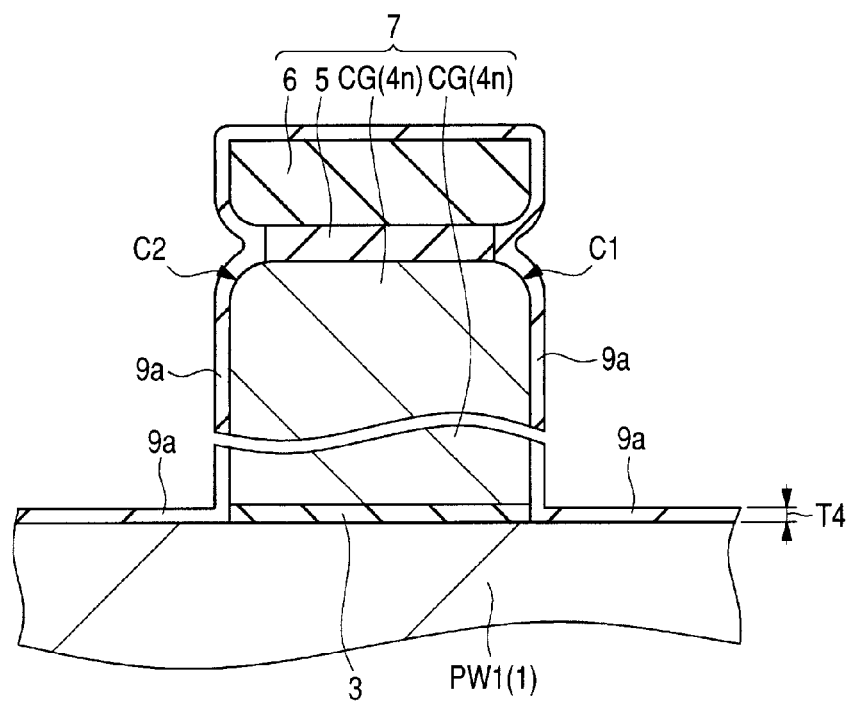
FIG. 15 is an essential part cross-sectional view of the semiconductor device during a manufacturing step following that of FIG. 13.
Figure 16:
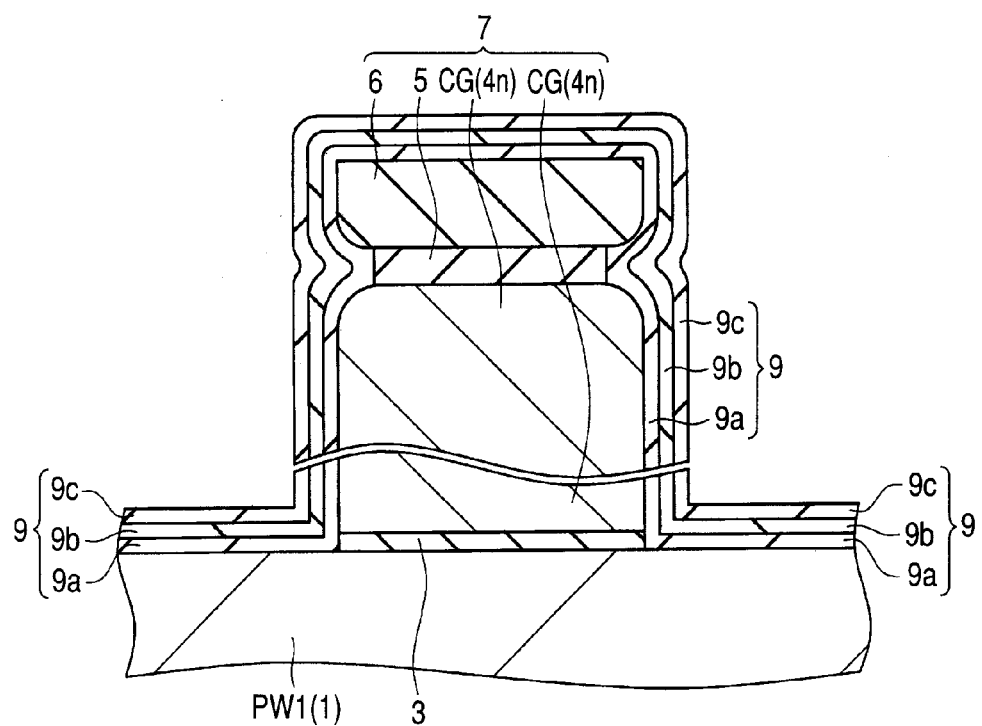
FIG. 16 is an essential part cross-sectional view of the semiconductor device during a manufacturing step following that of FIG. 15.

FIG. 14 is an essential part cross-sectional view at the stage of having performed the formation steps of the insulation film 9 of Step S13, and shows the same regions (cross-sectional regions) as those in FIGS. 6 to 11. Further, FIG. 15 is an essential part cross-sectional view at the stage of having performed the steps up to the silicon oxide film 9a formation step (the stage before forming the silicon nitride film 9b) out of the formation steps of the insulation film 9 of Step S13. FIG. 16 is an essential part cross-sectional view of a stage of having completed the formation steps of insulation film 9 of Step S13 (the stage of having performed the steps up to the formation step of the silicon oxide film 9c). FIGS. 15 and 16 each show the same regions as those in FIG. 13 (i.e., an enlarged view of the lamination pattern 7 and the neighboring regions). Incidentally, in FIG. 14, for facilitating understanding of the drawing, the lamination film of the silicon oxide film 9a, the silicon nitride film 9b, and the silicon oxide film 9c is simply shown as the insulation film 9. In contrast, in FIG. 16, the insulation film 9 is shown as the lamination film of the silicon oxide film 9a, the silicon nitride film 9b, and the silicon oxide film 9c. In actuality, the insulation film 9 is the lamination film of the silicon oxide film 9a, the silicon nitride film 9b, and the silicon oxide film 9c.

The insulation film 9 is, as described above, an insulation film having a charge storage part in the inside thereof. As shown in FIG. 16, the insulation film 9 includes, as an insulation film, a lamination film (ONO film) of the silicon oxide film 9a, the silicon nitride film 9b, and the silicon oxide film 9c, sequentially formed from the bottom thereof. Namely, the insulation film 9 includes a lamination film having the silicon oxide film (oxide film) 9a, the silicon nitride film (nitride film) 9b over the silicon oxide film 9a, and the silicon oxide film (oxide film) 9c over the silicon nitride film 9b. In Step S13, as shown in FIGS. 14 and 16, the insulation film 9 is formed over the surface of the p type well PW1 (however, only the portion thereof not covered with the control gate electrode CG), over the sidewalls (side surfaces) and the top surface of the lamination pattern 7, and over the top surface of the silicon film 4 in the peripheral circuit region 1B.

In the present embodiment, as the insulation film having a trap level, the silicon nitride film 9b is formed. However, the insulation film is not limited to the silicon nitride film. There may be used a high-k film having a higher dielectric constant than that of a silicon nitride film, such as an aluminum oxide film (alumina), a hafnium oxide film, or a tantalum oxide film. Alternatively, the insulation film may be formed of silicon nanodots.

Out of the insulation films 9, the silicon oxide film can be formed by, for example, an oxidation treatment (thermal oxidation treatment) or CVD (Chemical Vapor Deposition), or a combination thereof. The silicon nitride film can be formed by, for example, a CVD method.

However, in the present embodiment, the silicon oxide film 9a formation step is carried out by subjecting the semiconductor substrate 1 to an oxidation treatment, and preferably can be carried out by performing thermal oxidation. However, it is further preferable that the step is carried out by ISSG oxidation.

For example, first, over the surface of the semiconductor substrate 1 (p type well PW1), over the surfaces (side surfaces and top surface) of the lamination pattern 7, and over the surfaces (side surfaces and top surface) of the silicon film 4, the silicon oxide film 9a is formed by a thermal oxidation method (more preferably, ISSG oxidation) (FIG. 15 corresponds to this stage). Then, over the silicon oxide film 9a, the silicon nitride film 9b is deposited by a CVD method. Further, over the silicon nitride film 9b, the silicon oxide film 9c is formed by a CVD method or thermal oxidation, or both thereof. As a result, the insulation film 9 can be formed.

The thickness of the silicon oxide film 9a can be set at, for example, about 3 to 6 nm. The thickness of the silicon nitride film 9b can be set at, for example, about 5 to 10 nm. The thickness of the silicon oxide film 9c can be set at, for example, about 4 to 7 nm. The final oxide film (the uppermost-layer silicon oxide film 9c of the insulation film 9) can be formed as a high dielectric strength film by, for example, oxidizing the upper-layer portion of the nitride film (the intermediate-layer silicon nitride film 9b of the insulation film 9).

The insulation film 9 functions as the gate insulation film of the memory gate electrode MG formed later, and has a charge storage function. Therefore, the insulation film 9 has a lamination structure of at least three layers, wherein the potential barrier height of the inner layer (silicon nitride film 9b) is lower than the potential barrier height of the outer layers (silicon oxide films 9a and 9c). This can be implemented by forming the insulation film 9 as the lamination film having the silicon oxide film 9a, the silicon nitride film 9b over the silicon oxide film 9a, and the silicon oxide film 9c over the silicon nitride film 9b as in the present embodiment.

Further, in the present embodiment, when the silicon oxide film 9a is formed in Step S13, at the sidewalls 7a and 7b of the lamination pattern 7, the surfaces (exposed surfaces of) the n type silicon film 4n (forming the control gate electrode CG) are oxidized. As a result, the upper end corner portions C1 and C2 of (the n type silicon film 4n forming) the control gate electrode CG are rounded. The reason for this is as follows.

The lamination pattern 7 is formed by patterning the lamination film of the n type silicon film 4n, the insulation film 5, and the insulation film 6 in the Step S8. Therefore, at the stage of having performed the Step S8, also indicated from FIG. 12, the upper end corner portions C1 and C2 of the control gate electrode CG are not rounded, and are almost right-angled and sharp corner portions.

Therefore, as distinct from the present embodiment, at the sidewalls of the lamination pattern 7, the insulation film 5 is not side etched. This results in a state in which the insulation film 5 is not retreated from the control gate electrode CG and the insulation film 6 (i.e., a state in which respective side surfaces of the control gate electrode CG, the insulation film 5, and the insulation film 6 are on the same plane). When the formation step of the silicon oxide film 9a (the oxidation treatment of the semiconductor substrate 1) is carried out, only the surface layer portion of each side surface of the control gate electrode CG is oxidized. In this case, the upper end corner portions C1 and C2 of the control gate electrode CG are still almost right-angled and sharp corner portions, and are not rounded.

However, in the present embodiment, in the cleaning treatment of the Step S12, at the sidewalls 7a and 7b of the lamination pattern 7 in the memory cell region 1A, the insulation film 5 is side etched. This results in the formation of a structure in which (the side surfaces of) the insulation film 5 (are) is retreated from (the side surfaces of) of the control gate electrode CG and (the side surfaces of) the insulation film 6. In this state, the formation step of the silicon oxide film 9a forming the insulation film 9 (the oxidation treatment of the semiconductor substrate 1) is performed. Namely, the insulation film 5 is side etched, so that the insulation film 5 is retreated from the control gate electrode CG and the insulation film 6. As a result, not only the side surfaces of the control gate electrode CG are exposed, but also the regions in the vicinity of the upper end corner portions C1 and C2 of the top surface of the control gate electrode CG are exposed. In this state, the formation step of the silicon oxide film 9a (the oxidation treatment of the semiconductor substrate 1) is performed. Accordingly, not only the surface layer portion of each side surface of the control gate electrode CG, but also the regions in the vicinity of the upper end corner portions C1 and C2 of the top surface of the control gate electrode CG are also oxidized. In this case, for the upper end corner portions C1 and C2 of the control gate electrode CG, oxidation progressed from the side surface side and the top surface side. As a result, the upper end corner portions C1 and C2 did not become almost right-angled and sharp corner portions, but became rounded.

Thus, in the present embodiment, in the patterning step of the Step S8, the lamination pattern 7 is formed. Then, at the sidewalls of the lamination pattern 7, the insulation film 5 is side etched. Accordingly, the insulation film 5 is retreated from the control gate electrode CG and the insulation film 6. As a result, when the exposed surfaces of the control gate electrode CG are oxidized later (herein, the silicon oxide film 9a formation step), the upper end corner portions C1 and C2 of the control gate electrode CG can be rounded.

Further, at the sidewalls of the lamination pattern 7, the insulation film 5 is side etched, and is retreated from the control gate electrode CG and the insulation film 6. Then, at Step S13, the insulation film 9 is formed. Accordingly, in regions in which the insulation film 5 is retreated at the sidewalls 7a and 7b of the lamination pattern 7 (the regions corresponding to the regions 30a and 30b shown in FIG. 13), portions of the insulation film 9 penetrate. Specifically, the insulation film 9 includes a lamination film of the silicon oxide film 9a, the silicon nitride film 9b, and the silicon oxide film 9c. Accordingly, in regions in which the insulation film 5 is retreated at the sidewalls 7a and 7b of the lamination pattern 7 (the regions corresponding to the regions 30a and 30b shown in FIG. 13), portions of the silicon nitride film 9b also penetrate.

Further, it is preferable that the length L1 (the length L1 is shown in FIG. 13) is equal to, or larger than the thickness T4 (the thickness T4 is shown in FIG. 15), where L1 denotes the length by which the insulation film 5 is retreated from the control gate electrode CG and the insulation film 6 at the sidewalls 7a and 7b of the lamination pattern 7 due to side etching of the insulation film 5 in the cleaning step of the Step S12, and T4 denotes the thickness of the silicon oxide film 9a forming the insulation film 9 formed in Step S13 (i.e., L1≥T4). The reason for this is as follows.

In the present embodiment, at the sidewalls 7a and 7b of the lamination pattern 7, the insulation film 5 is side etched, and is retreated from the control gate electrode CG and the insulation film 6. Then, when the silicon oxide film 9a is formed, the exposed surfaces (surfaces of) the control gate electrode CG are oxidized. As a result, the upper end corner portions C1 and C2 of the control gate electrode CG are rounded. However, when the length L1 by which the insulation film 5 is retreated from the control gate electrode CG and the insulation film 6 at the sidewalls 7a and 7b of the lamination pattern 7 is too small, the upper end corner portions C1 and C2 of the control gate electrode CG may not be sufficiently rounded. In contrast, the length L1 by which the insulation film 5 is retreated from the control gate electrode CG and the insulation film 6 at the sidewalls 7a and 7b of the lamination pattern 7 is set to be equal to, or larger than the thickness (formed thickness) T4 of the silicon oxide film 9a (i.e., L1≥T4). As a result, upon oxidation of the exposed surfaces of the control gate electrode CG (herein, the silicon oxide film 9a formation step), it is possible to form sufficiently rounded upper end corner portions C1 and C2 on the control gate electrode CG. On the other hand, in the manufactured semiconductor device, each exposed surface of the control gate electrode CG is retreated by ½ the film thickness T4 of the oxidized film. Therefore, it is assumed that the relationship between L1 and T4 becomes: L1−T4/2≥T4.

Further, it is further preferable that the length L1 by which the insulation film 5 is retreated from the control gate electrode CG and the insulation film 6 at the sidewalls 7a and 7b of the lamination pattern 7 is 4 nm or more (i.e., L1≥4 nm). As a result, it is possible to form sufficiently rounded upper end corner portions C1 and C2 on the control gate electrode CG with further precision.

Further, in the present embodiment, in the silicon oxide film 9a formation step, the exposed surfaces of the control gate electrode CG are oxidized. As a result, the upper end corner portions C1 and C2 of the control gate electrode CG are rounded. For this reason, in order to allow progress of oxidation of the exposed surfaces of the control gate electrode CG, the silicon oxide film 9a formation step is preferably performed not by a CVD method, but by the oxidation treatment of the semiconductor substrate 1, and more preferably can be performed by thermal oxidation. However, it is further preferable that the step is performed by ISSG oxidation.

Further, by the step of forming the silicon oxide film 9a, the lower end corner portions of the insulation film 6 also each become in the rounded shape.

Figure 17:
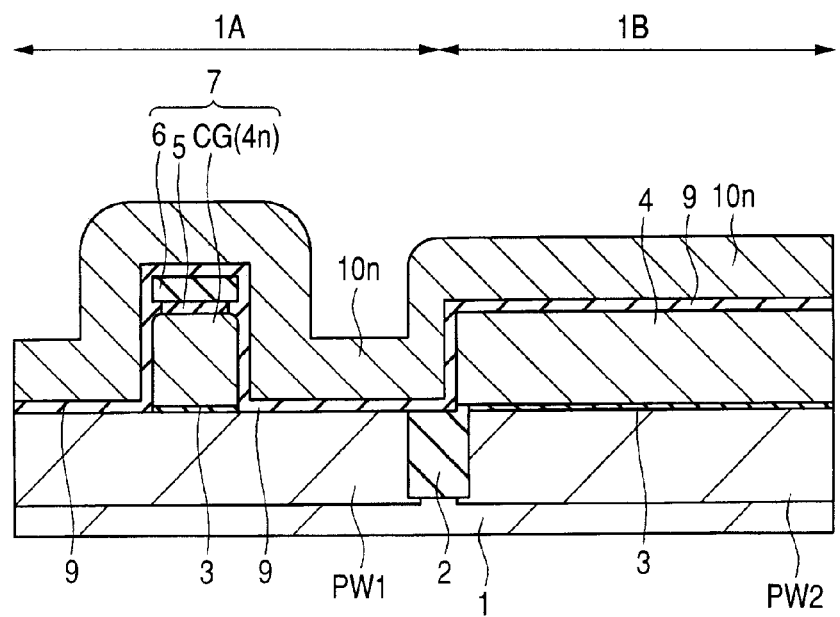
FIG. 17 is an essential part cross-sectional view of the semiconductor device during a manufacturing step following that of FIG. 14.

Then, as shown in FIG. 17, over the entire main surface of the semiconductor substrate 1, namely, over the insulation film 9, in the memory cell region 1A, in such a manner as to cover the lamination pattern 7, an n type silicon film 10n is formed (deposited) as a conductor film for memory gate electrode MG formation (Step S14 of FIG. 5). Incidentally, also in FIG. 17, and subsequent FIGS. 18 to 20, and FIGS. 22 to 28, as with FIG. 14, for facilitating understanding of the drawings, the lamination film of the silicon oxide film 9a, the silicon nitride film 9b, and the silicon oxide film 9c is shown simply as the insulation film 9.

The n type silicon film 10n includes an n type polysilicon film (n type impurities-doped polysilicon film or doped polysilicon film), and can be formed by using a CVD method or the like. The film thickness (deposited film thickness) of the n type silicon film 10n can be set at, for example, about 50 to 100 nm.

Figure 18:
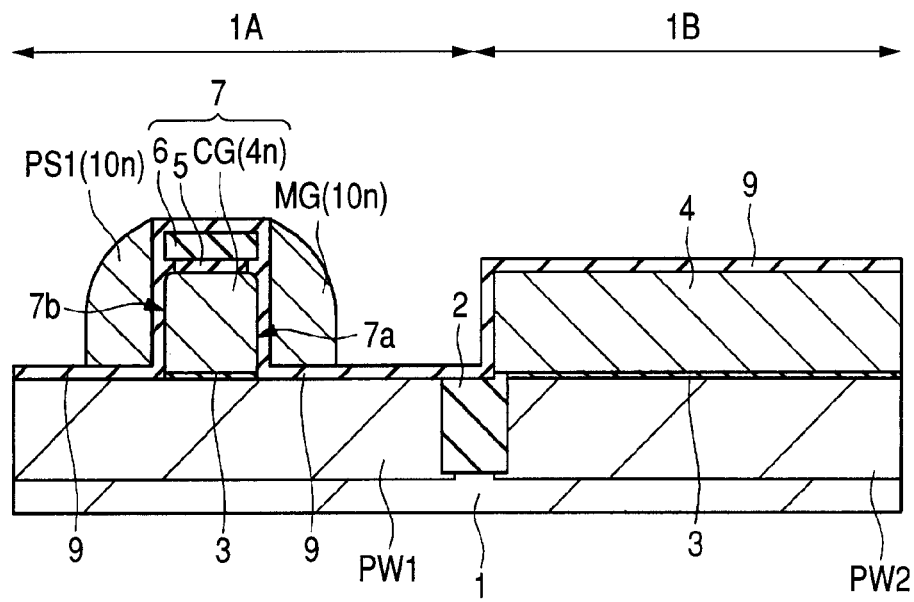
FIG. 18 is an essential part cross-sectional view of the semiconductor device during a manufacturing step following that of FIG. 17.

Then, as shown in FIG. 18, by the anisotropic etching technology, the n type silicon film 10n is etched back (etched, dry etched, or anisotropically etched) by the deposited film thickness of the silicon film (Step S15 of FIG. 5). By the etching back step of Step S15, over both the sidewalls 7a and 7b of the lamination pattern 7 (via the insulation film 9), the n type silicon film 10n is left in a sidewall (sidewall spacer) form, and portions of the n type silicon film 10n in other regions are removed. This results in the formation of the memory gate electrode MG and the polysilicon spacer PS1 including the remaining portions of the n type silicon film 10n.

At this step, out of both the sidewalls 7a and 7b of the lamination pattern 7, the portion of the n type silicon film 10n left over one sidewall 7a via insulation film 9 becomes the memory gate electrode MG; and the portion of the n type silicon film 10n left over the other sidewall 7b via the insulation film 9 becomes the polysilicon spacer PS1. The memory gate electrode MG and the polysilicon spacer PS1 are formed over the sidewalls on the mutually opposing sides of the lamination pattern 7, respectively, and have an almost symmetric structure with the lamination pattern 7 sandwiched therebetween. Further, although not shown, in the forming region of a contact hole to be coupled with the memory gate electrode MG later, the etching back step of Step S15 is performed with this region previously covered with a photoresist pattern. As a result, the n type silicon film 10n is left without being etched.

Incidentally, the portion of the insulation film 9 under the memory gate electrode MG becomes the gate insulation film of the memory transistor. Thus, over the insulation film 9, the memory gate electrode MG adjacent to the control gate electrode CG via the insulation film 9 is formed. The deposited film thickness of the n type silicon film 10n determines the memory gate length (gate length of the memory gate electrode MG). Therefore, by adjusting the deposited film thickness of the n type silicon film 10n deposited in Step S14, it is possible to adjust the memory gate length.

The memory gate electrode MG is formed by Steps S14 and S15. Therefore, the n type silicon film 10n formation step of Step S14 and the n type silicon film 10n etching back step of Step S15 can also be regarded as a step of forming the memory gate electrode MG adjacent to the lamination pattern 7 via the insulation film 9 over the insulation film 9.

Figure 19:
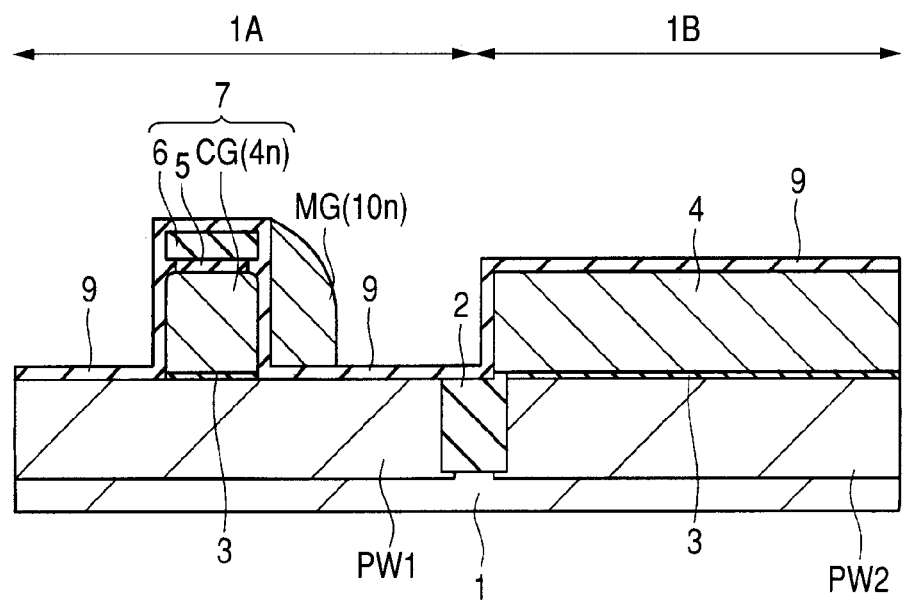
FIG. 19 is an essential part cross-sectional view of the semiconductor device during a manufacturing step following that of FIG. 18.

Then, by using the photolithography technology, such a photoresist pattern (not shown) that the memory gate electrode MG is covered, and that the polysilicon spacer PS1 is exposed is formed over the semiconductor substrate 1. By dry etching using the photoresist pattern as an etching mask, the polysilicon spacer PS1 is removed (Step S16 of FIG. 5). Then, the photoresist pattern is removed. By the etching step of Step S16, as shown in FIG. 19, the polysilicon spacer PS1 is removed. However, the memory gate electrode MG has been covered with the photoresist pattern, and hence has been left without being etched.

Figure 20:
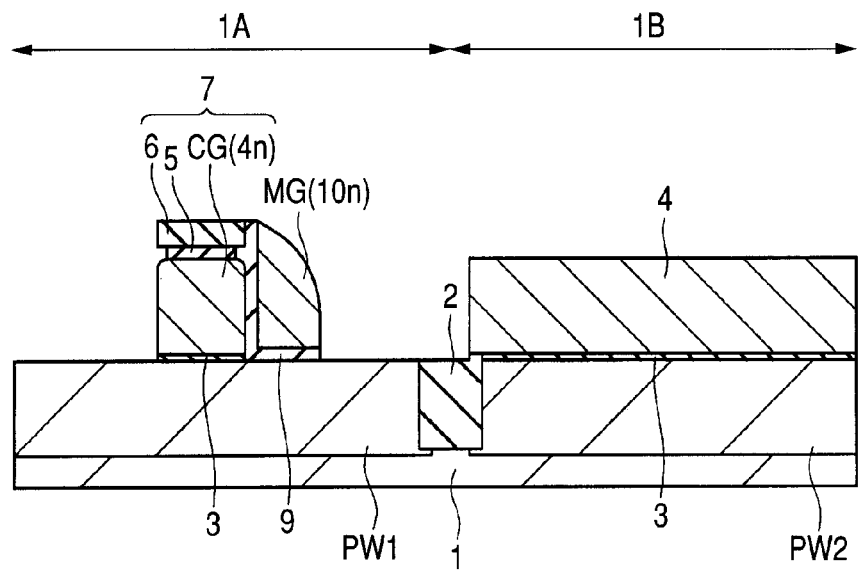
FIG. 20 is an essential part cross-sectional view of the semiconductor device during a manufacturing step following that of FIG. 19.
Figure 21:
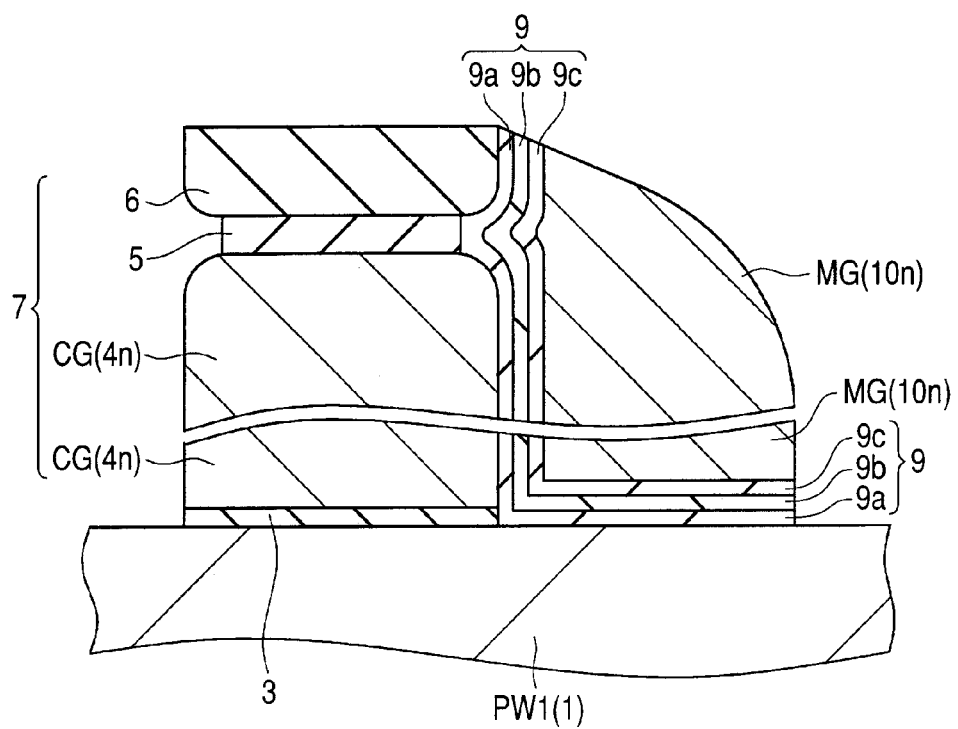
FIG. 21 is an essential part cross-sectional view of the same semiconductor device during a manufacturing step as that of FIG. 20.

Then, as shown in FIGS. 20 and 21, the portions of the insulation film 9 not covered with the memory gate electrode MG, and exposed are removed by etching (e.g., wet etching). At this step, the portion of the insulation film 9 situated under the memory gate electrode MG, and the portion of the insulation film 9 situated between the memory gate electrode MG and the lamination pattern 7 are not removed, and are left. Incidentally, FIGS. 20 and 21 are each an essential part cross-sectional view at the stage of having removed the portions of the insulation film 9 not covered with the memory gate electrode MG, and exposed. FIG. 20 shows the same regions (cross-sectional regions) as in FIGS. 6 to 11, FIG. 14, and FIGS. 17 to 19. FIG. 21 shows the same regions as in FIGS. 12, 13, 15, and 16 (i.e., an enlarged view of the lamination pattern 7 and the neighboring regions).

Figure 22:
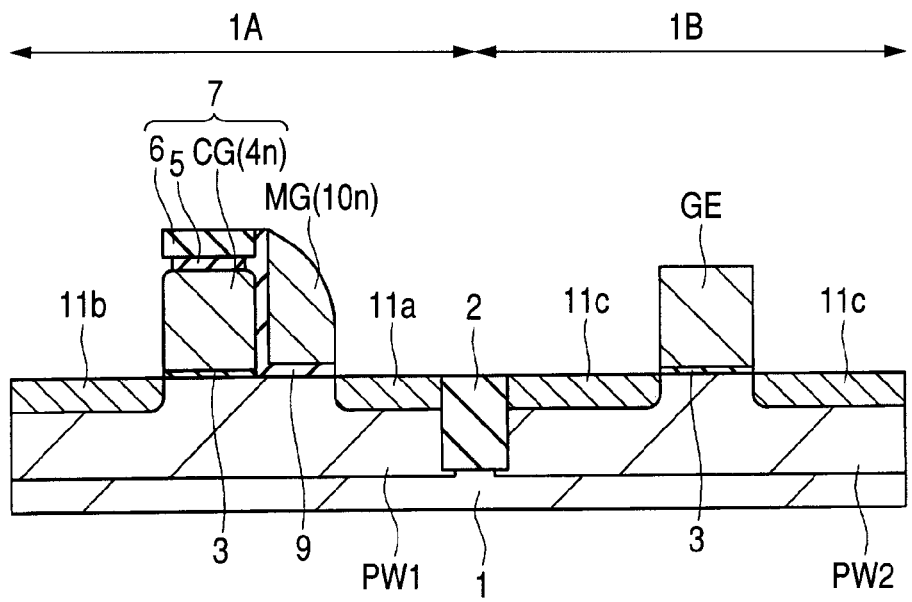
FIG. 22 is an essential part cross-sectional view of the semiconductor device during a manufacturing step following that of FIG. 20.

Then, over the silicon film 4 formed in the peripheral circuit region 1B, by using the photolithography method, a photoresist pattern (although not shown herein, the photoresist pattern is formed in the entire memory cell region 1A and the p channel type MISFET forming region of the peripheral circuit region 1B) is formed. By using the photoresist pattern as a mask, into the silicon film 4 in the peripheral circuit region 1B, n type impurities are introduced by an ion implantation method or the like. As a result, in the peripheral circuit region 1B, the n type silicon film (corresponding to the n type impurities-doped silicon film 4 in the peripheral circuit region 1B) is formed. Then, over the n type silicon film, using the photolithography method, a photoresist pattern (although not shown herein, the photoresist pattern is formed in the entire memory cell region 1A, and the gate electrode GE forming region of the peripheral circuit region 1B) is formed. By using the photoresist pattern as an etching mask, the n type silicon film is etched (dry etched), and patterned. At this step, the memory cell region 1A is covered with the photoresist pattern, and is not etched. Then, the photoresist pattern is removed. As a result, as shown in FIG. 22, the gate electrode GE including the patterned n type silicon film (i.e., the patterned portions of the n type impurities-doped silicon film 4 in the peripheral circuit region 1B) is formed.

Then, using the ion implantation method, or the like, n type impurities such as arsenic (As) or phosphorus (P) are introduced (doped) into the semiconductor substrate 1 (p type wells PW1 and PW2) using the lamination pattern 7, the memory gate electrode MG, and the gate electrode GE as ion implantation inhibiting masks. As a result, as shown in FIG. 22, n⁻ type semiconductor regions (impurity diffusion layers) 11a, 11b, and 11c are formed.

At this step, the n⁻ type semiconductor region 11a is formed in self-alignment with the sidewall of the memory gate electrode MG (the sidewall on the side thereof opposite to the side adjacent to the control gate electrode CG via the insulation film 9) in the memory cell region 1A. The n⁻ type semiconductor region 11b is formed in self-alignment with the sidewall of the control gate electrode CG (the sidewall on the side thereof opposite to the side adjacent to the memory gate electrode MG via the insulation film 9) in the memory cell region 1A. Further, the n⁻ type semiconductor regions 11c are formed in self-alignment with opposite sidewalls of the gate electrode GE in the peripheral circuit region 1B. The n⁻ type semiconductor region 11a and the n⁻ type semiconductor region 11b can each function as a part of source/drain region of the memory cell formed in the memory cell region 1A. The n⁻ type semiconductor regions 11c can each function as a part of source/drain region of the MISFET formed in the peripheral circuit region 1B.

Figure 23:
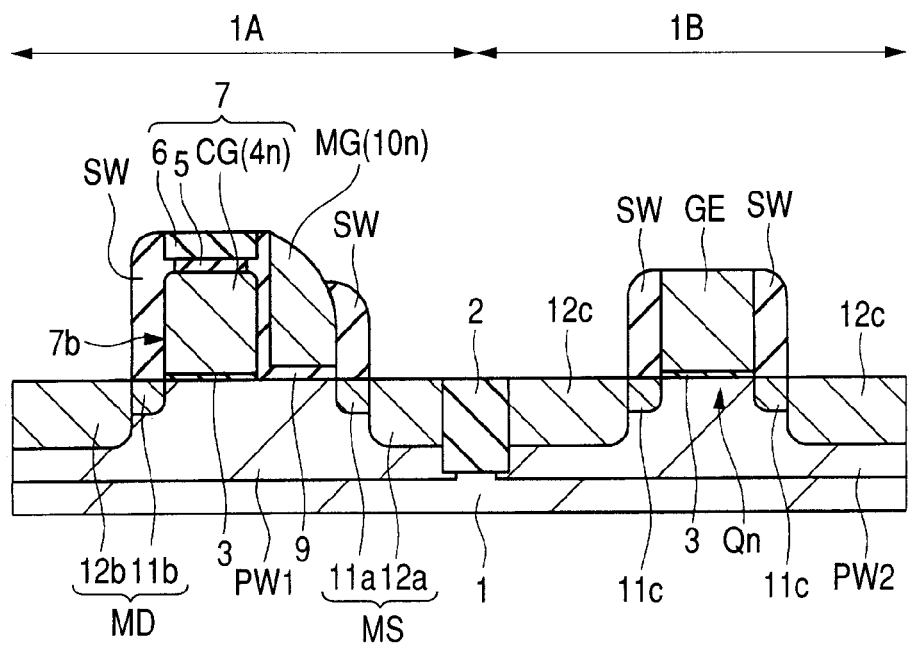
FIG. 23 is an essential part cross-sectional view of the semiconductor device during a manufacturing step following that of FIG. 22.

Then, as shown in FIG. 23, over the sidewall 7b of the control gate electrode CG (the sidewall 7b on the side thereof opposite to the side adjacent to the memory gate electrode MG via the insulation film 9), over the sidewall of the memory gate electrode MG (the sidewall on the side thereof opposite to the side adjacent to the control gate electrode CG via the insulation film 9), and over the sidewalls (opposite sidewalls) of the gate electrode GE, the sidewall insulation films (sidewalls or sidewall spacers) SW including an insulator such as silicon oxide are formed. For example, over the entire main surface of the semiconductor substrate 1, an insulation film such as a silicon oxide film is deposited. The insulation film can be anisotropically etched (etched back), thereby to be selectively left only over the sidewalls of the control gate electrode CG, the memory gate electrode MG, and the gate electrode GE, resulting in the formation of the sidewall insulation films SW.

Then, using the ion implantation method or the like, n type impurities such as arsenic (As) or phosphorus (P) are introduced (doped) into the semiconductor substrate 1 (p type wells PW1 and PW2) using the lamination pattern 7, the memory gate electrode MG, and the gate electrode GE, and the sidewall insulation films SW over the sidewalls thereof as ion implantation inhibiting masks. As a result, n⁺ type semiconductor regions (impurity diffusion layers) 12a, 12b, and 12c with a high impurity concentration are formed. At this step, the n⁺ type semiconductor region 12a is formed in self-alignment with the sidewall insulation film SW over the sidewall of the memory gate electrode MG in the memory cell region 1A. The n⁺ type semiconductor region 12b is formed in self-alignment with the sidewall insulation film SW over the sidewall of the control gate electrode CG in the memory cell region 1A. The n⁺ type semiconductor region 12c is formed in self-alignment with the sidewall insulation films SW over the opposite sidewalls of the gate electrode GE in the peripheral circuit region 1B. As a result, a LDD (lightly doped drain) structure is formed.

Thus, the n⁻ type semiconductor region 11a, and the n⁺ type semiconductor region 12a having a higher impurity concentration than that of the region 11a form the n type semiconductor region MS functioning as the source region of the memory transistor. The n⁻ type semiconductor region 11b, and the n⁺ type semiconductor region 12b having a higher impurity concentration than that of the region 11b form the n type semiconductor region MD functioning as the drain region of the control transistor. Further, the type semiconductor regions 11c, and the n⁺ type semiconductor regions 12c having a higher impurity concentration than that of the regions 11c form the n type semiconductor regions functioning as source/drain regions of the MISFET Qn in the peripheral circuit region 1B.

Figure 24:
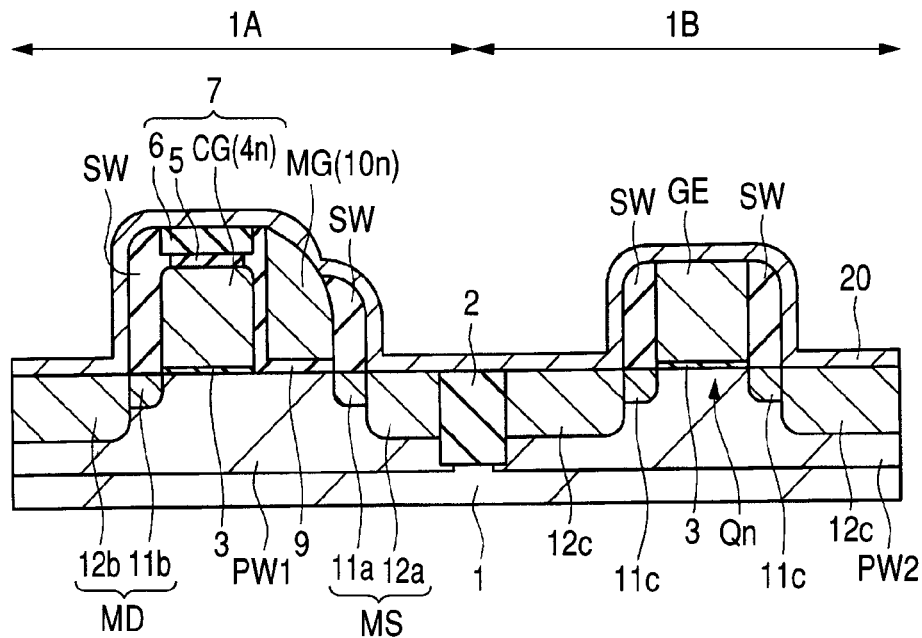
FIG. 24 is an essential part cross-sectional view of the semiconductor device during a manufacturing step following that of FIG. 23.

Then, if required, etching (wet etching using, for example, dilute hydrofluoric acid) is performed. Thus, the top surfaces (surfaces of) the n⁺ type semiconductor regions 12a, 12b, and 12c, the top surface of the memory gate electrode MG (the portion thereof not covered with the sidewall insulation film SW), and the top surface of the gate electrode GE are purified (exposed). Etching at this step can be light etching of such a degree as to remove the natural oxide film. Then, as shown in FIG. 24, over the entire main surface of the semiconductor substrate 1 including over the top surfaces (surfaces of) the n⁺ type semiconductor regions 12a, 12b, and 12c, over the top surface of the memory gate electrode MG (the portion thereof not covered with the sidewall insulation film SW), and over the top surface of the gate electrode GE, a metal film 20 is formed (deposited) in such a manner as to cover the lamination pattern 7 (control gate electrode CG), the memory gate electrode MG, the gate electrode GE, and the sidewall insulation films SW. The metal film 20 includes, for example, a cobalt (Co) film or a nickel (Ni) film, and can be formed by using a sputtering method or the like.

Figure 25:
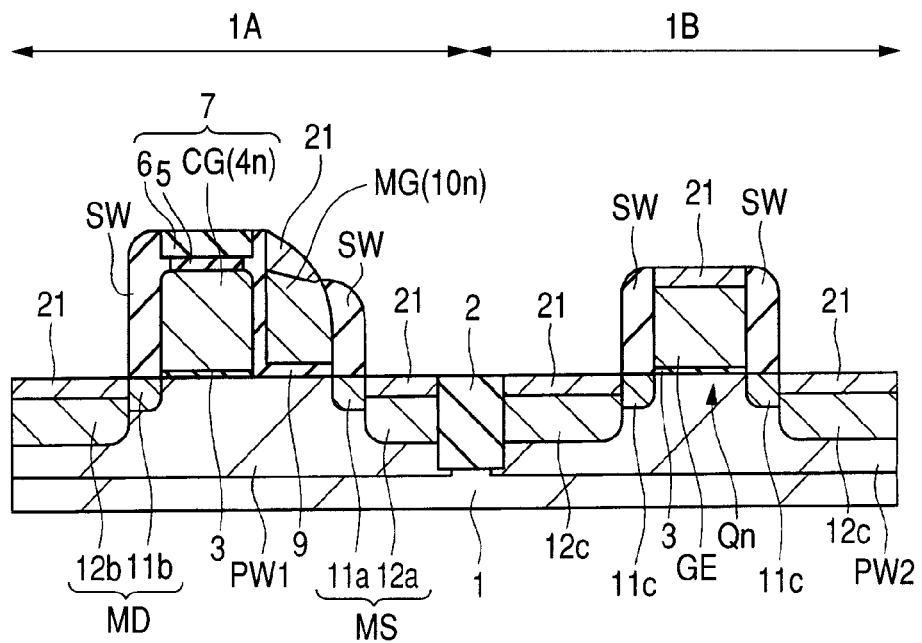
FIG. 25 is an essential part cross-sectional view of the semiconductor device during a manufacturing step following that of FIG. 24.

Then, the semiconductor substrate 1 is subjected to a heat treatment. Accordingly, the top layer portions (surface layer portions) of the $n^+$ type semiconductor regions 12a, 12b, and 12c, the memory gate electrode MG, and the gate electrode GE are allowed to react with the metal film 20. As a result, as shown in FIG. 25, at the tops (the top surfaces, surfaces, or top layer parts) of the $n^+$ type semiconductor regions 12a, 12b, and 12c, the memory gate electrode MG, and the gate electrode GE, metal silicide layers (metal silicide films) 21 are formed, respectively. The metal silicide layer 21 can be, for example, a cobalt silicide layer (when the metal film 20 is a cobalt film) or a nickel silicide layer (when the metal film 20 is a nickel film). Then, the unreacted portions of the metal film 20 are removed. FIG. 25 shows a cross-sectional view at this stage. Thus, by performing a so-called salicide process, the tops of the $n^+$ type semiconductor regions 12a, 12b, and 12c, the memory gate electrode MG, and the gate electrode GE, the metal silicide layers 21 are formed. As a result, it is possible to lower the resistances of the source, the drain, and the memory gate electrode MG.

In the salicide process, with the top surface of (the n type silicon film 10n forming) the memory gate electrode MG in contact with the metal film 20, the heat treatment is performed. Accordingly, the top layer part of (the n type silicon film 10n forming) the memory gate electrode MG reacts with the metal film 20. As a result, at the top (top surface) of (the n type silicon film 10n forming) the memory gate electrode MG, the metal silicide layer 21 is formed. However, over the control gate electrode CG, the insulation films 5 and 6 are formed. Thus, the top surface of (the n type silicon film 4n forming) the control gate electrode CG is not in contact with the metal film 20, and the insulation films 5 and 6 interpose therebetween. Accordingly, (the n type silicon film 4n forming) the control gate electrode CG does not react with the metal film 20. For this reason, over the control gate electrode CG, the metal silicide layer 21 is not formed.

Figure 26:
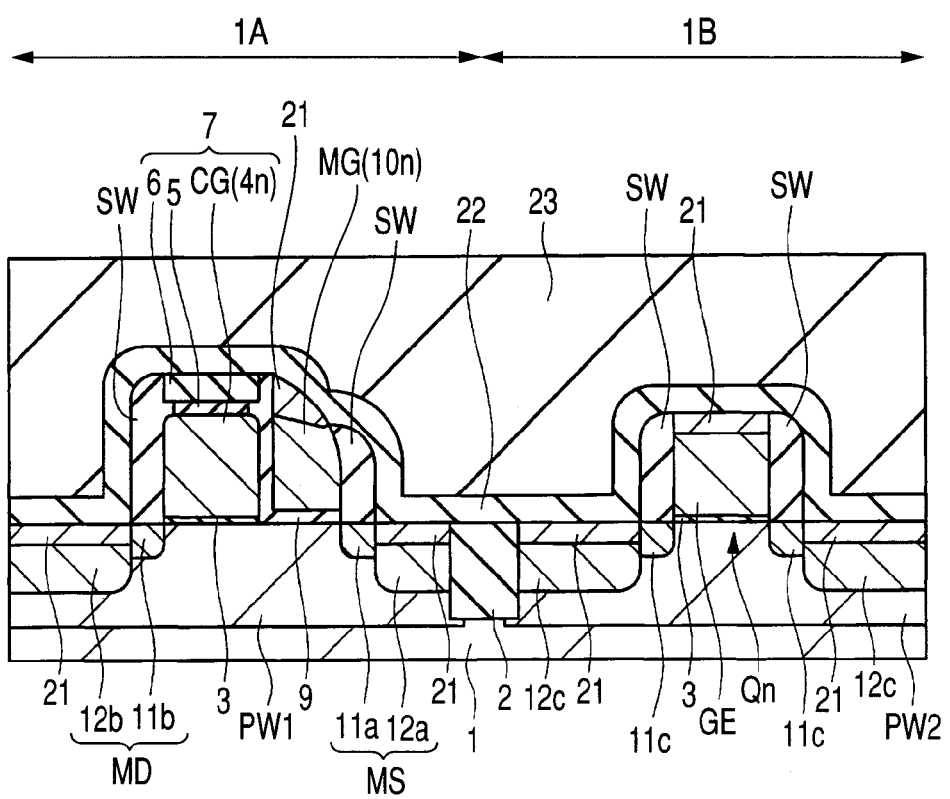
FIG. 26 is an essential part cross-sectional view of the semiconductor device during a manufacturing step following that of FIG. 25.

Then, as shown in FIG. 26, over the entire main surface of the semiconductor substrate 1, an insulation film 22 is formed (deposited) in such a manner as to cover the lamination pattern 7, the memory gate electrode MG, the gate electrode GE, and the sidewall insulation films SW. Over the insulation film 22, an insulation film 23 is formed (deposited). Then, if required, using a CMP (Chemical Mechanical Polishing) method, or the like, the top surface of the insulation film 23 is planarized.

The insulation film 22 preferably includes a silicon nitride film. The insulation film 23 over the insulation film 22 preferably includes a silicon oxide film or the like. These can be respectively formed using a CVD method or the like. The film thickness of the insulation film 22 is smaller than the film thickness of the insulation film 23. The thick insulation film 23 functions as an interlayer insulation film. The thin insulation film (silicon nitride film) 22 functions as an etching stopper film for forming contact holes in the insulation film 23.

Figure 27:
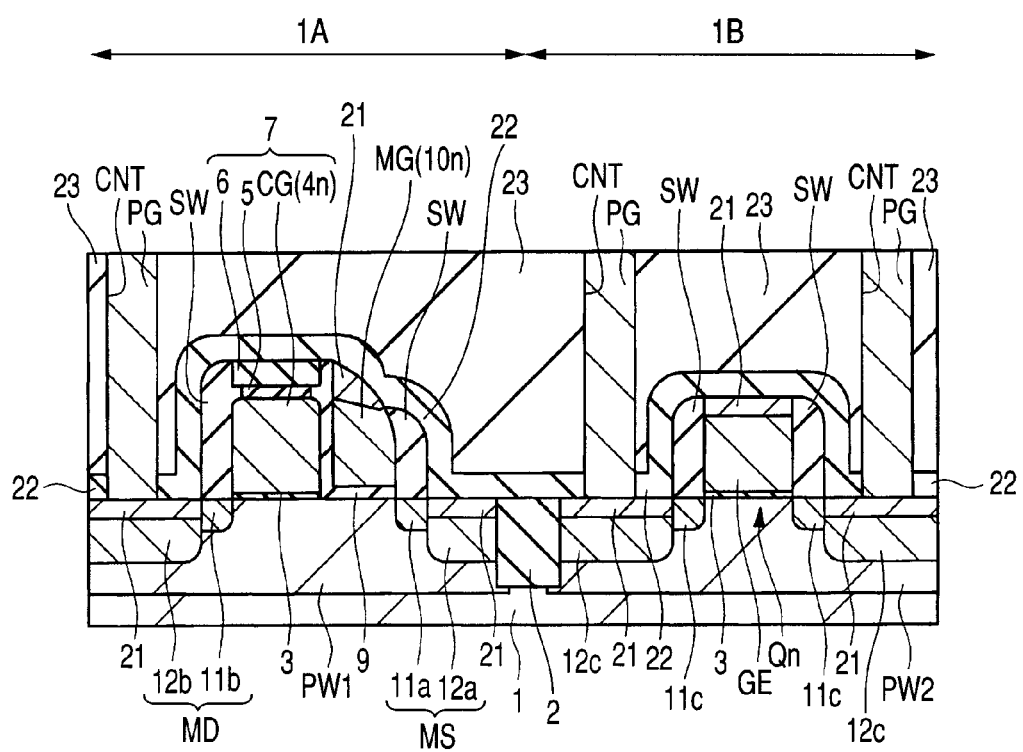
FIG. 27 is an essential part cross-sectional view of the semiconductor device during a manufacturing step following that of FIG. 26.

Then, as shown in FIG. 27, using a photolithography method, using a photoresist pattern (not shown) formed over the insulation film 23 as an etching mask, the insulation film 23 and the insulation film 22 are dry etched. As a result, in the insulation films 22 and 23, contact holes (openings or through holes) CNT are formed. For forming the contact holes CNT, first, the insulation film 23 is dry etched. The insulation film 22 is allowed to function as an etching stopper film. Then, portions of the insulation film 22 at the bottoms of the contact holes CNT are removed by dry etching. Thus, the contact holes CNT penetrating through the insulation films 22 and 23 are formed. Thus, the insulation film 22 is allowed to function as an etching stopper for etching the insulation film (interlayer insulation film) 23. This can avoid damaging of the underlying layer due to excessive boring thereof, and deterioration of the processing dimension precision when the contact holes CNT are formed by etching.

The contact holes CNT are formed in the tops of the $n^+$ type semiconductor regions 12a, 12b, and 12c, the control gate electrode CG, the memory gate electrode MG, the gate electrode GE, and the like. At the bottoms of the contact holes CNT, there are exposed portions of the main surface of the semiconductor substrate 1 such as portions of (the metal silicide layers 21 over the surfaces of) the $n^+$ type semiconductor regions 12a, 12b, and 12c, a portion of the control gate electrode CG, a portion of (the metal silicide layer 21 over the surface of) the memory gate electrode MG or (the metal silicide layer 21 over the surface of) the gate electrode GE, and the like. Incidentally, in the cross-sectional view of FIG. 27, there is shown a cross section in which portions of (the metal silicide layers 21 over the surfaces of) the $n^+$ type semiconductor regions 12b and 12c are exposed at the bottoms of the contact holes CNT.

Then, in each contact hole CNT, a conductive plug (conductor part for coupling) PG including tungsten (W) or the like is formed. In order to form the plug PG, the following procedure is performed. For example, over the insulation film 23 including the inside (over the bottom and the sidewall) of the contact hole CNT, a barrier conductor film (e.g., a titanium film, a titanium nitride film, or a lamination film thereof) is formed. Then, over the barrier conductor film, a main conductor film including a tungsten film or the like is formed in such a manner as to fill the contact hole CNT. The unnecessary portions of the main conductor film and the barrier conductor film over the insulation film 23 are removed by a CMP method, an etching back method, or the like. As a result, the plug PG can be formed. Incidentally, for simplification of the drawing, in FIG. 27, the barrier conductor film and the main conductor film (tungsten film) forming the plug PG are shown in an integral form.

Figure 28:
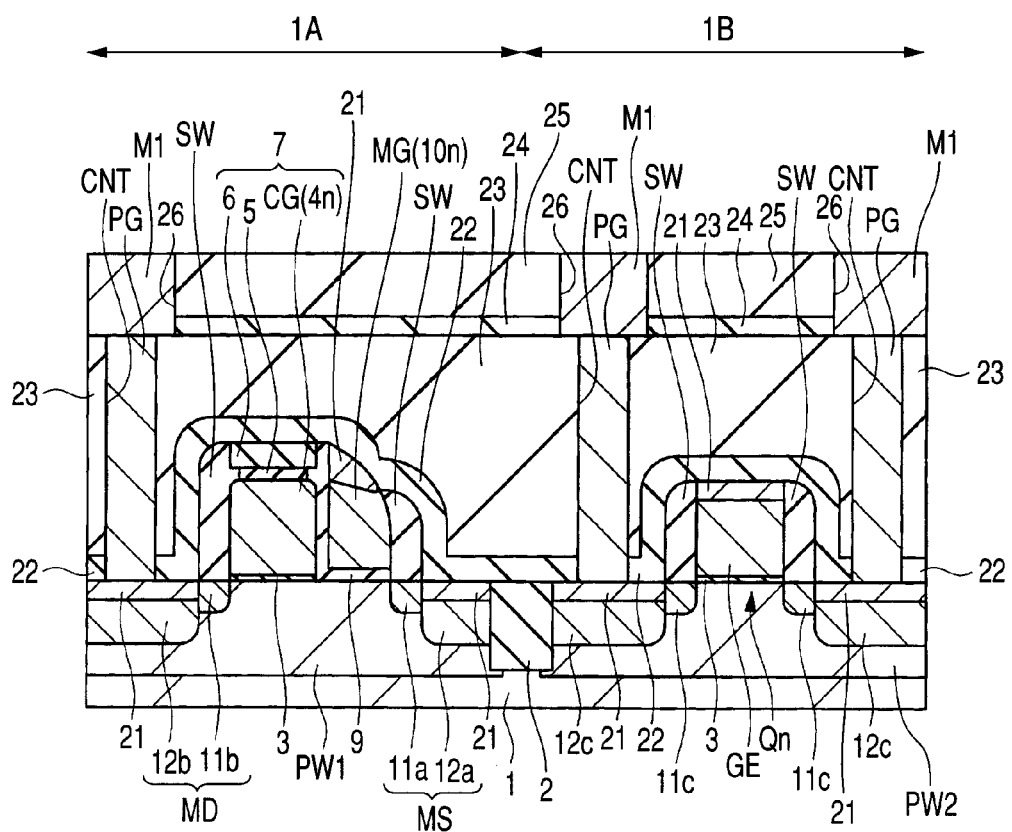
FIG. 28 is an essential part cross-sectional view of the semiconductor device during a manufacturing step following that of FIG. 27.

Then, as shown in FIG. 28, over the insulation film 23 including the plug PG embedded therein, a stopper insulation film (insulation film for etching stopper) 24 and an insulation film for wire formation (interlayer insulation film) 25 are successively formed. The stopper insulation film 24 is a film serving as an etching stopper for processing grooves in the insulation film 25. A material having an etching selectivity with respect to the insulation film 25 is used. For example, the stopper insulation film 24 can be a silicon nitride film, and the insulation film 25 can be a silicon oxide film.

Then, with a single damascene method, a first-layer wire M1 is formed. First, by dry etching using a photoresist pattern (not shown) as a mask, in predetermined regions of the insulation film 25 and the stopper insulation film 24, wire grooves 26 are formed. Then, over the main surface of the semiconductor substrate 1 (i.e., over the insulation film 25 including over the bottoms and the sidewalls of the wire grooves 26), a barrier conductor film (e.g., a titanium nitride film, a tantalum film, or a tantalum nitride film) is formed. Subsequently, by a CVD method, a sputtering method, or the like, over the barrier conductor film, a seed layer of copper is formed. Further, using an electrolytic plating method or the like, a copper plating film is formed over the seed layer. Thus, the copper plating film fills the inside of each wire groove 26. Then, portions of the copper plating film, the seed layer, and the barrier metal film in regions except for the insides of the wire grooves 26 are removed by a CMP method. As a result, the first-layer wire M1 including copper as a main conductive material is formed. Incidentally, for simplification of the drawing, in FIG. 28, the copper plating film, the seed layer, and the barrier conductor film forming the wire M1 are shown in an integral form.

The wires M1 are electrically coupled via the plugs PG to the source region (semiconductor region MS) of the memory transistor, the drain region (semiconductor region MD) of the control transistor, the source/drain regions (n+ type semiconductor regions 12c) of the MISFET Qn in the peripheral circuit region 1B, the control gate electrode CG, the memory gate electrode MG, the gate electrode GE, or the like. Then, by a dual damascene method or the like, second- and more-layer wires are formed. However, herein, they are not shown, and a description thereon will be omitted. Further, the wires M1 and upper-layer wires are not limited to damascene wires, and can also be formed by patterning the conductor film for wiring. For example, the wires may be tungsten wires or aluminum wires.

Then, the effects of the present embodiment will be described in more details.

Figure 29:
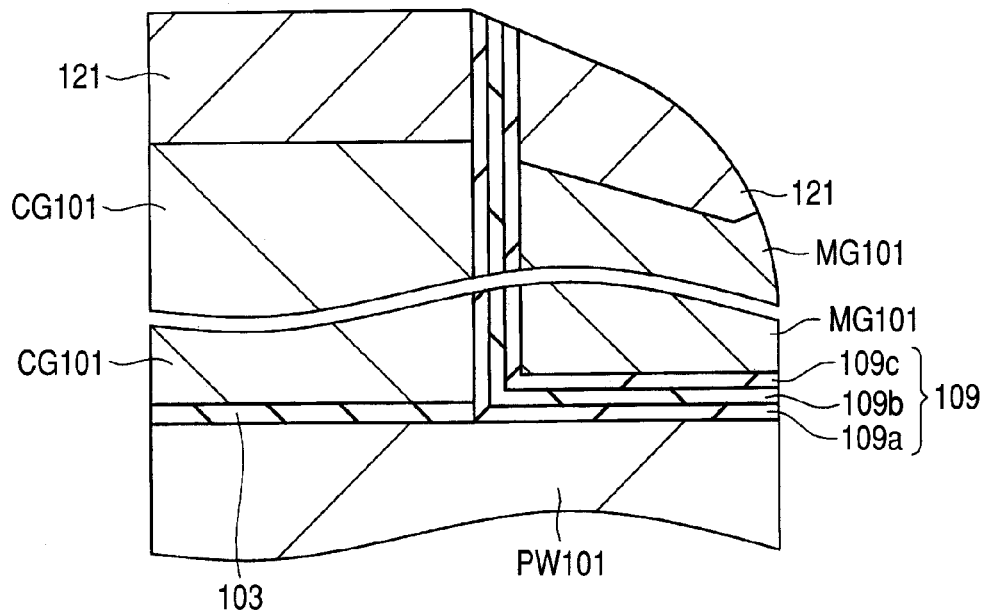
FIG. 29 is an essential part cross-sectional view of a semiconductor device of First Comparative Example.
Figure 30:
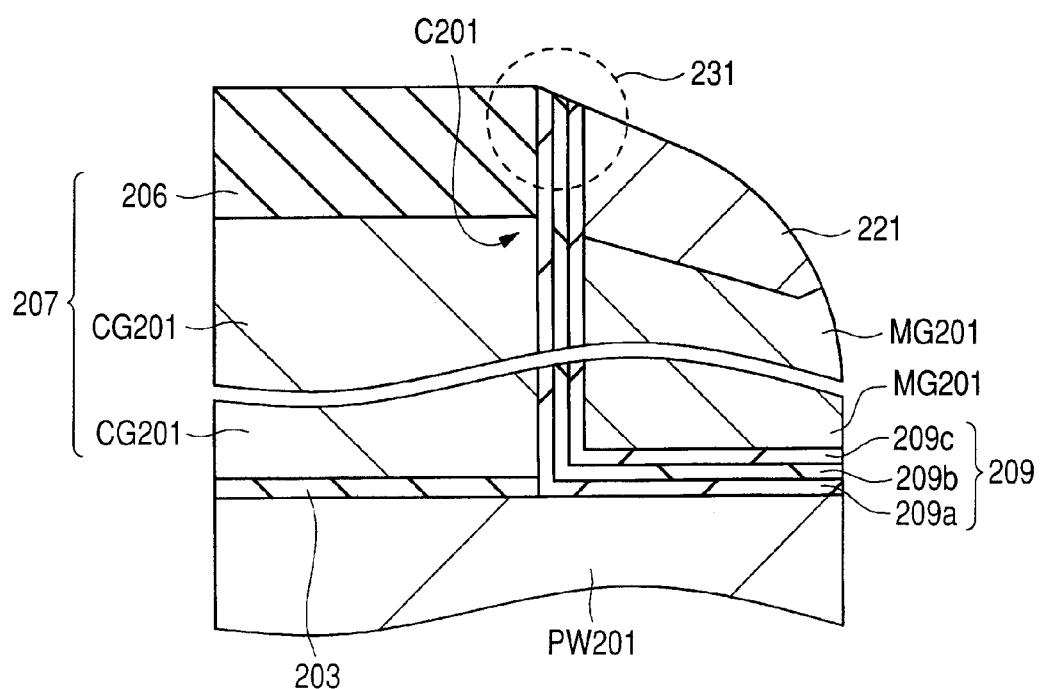
FIG. 30 is an essential part cross-sectional view of a semiconductor device of Second Comparative Example.

FIG. 29 is an essential part cross-sectional view of a semiconductor device of First Comparative Example. FIG. 30 is an essential part cross-sectional view of a semiconductor device of Second Comparative Example. They respectively correspond to FIG. 2 of the present embodiment.

The semiconductor device of First Comparative Example shown in FIG. 29 is a semiconductor device having a memory cell of a nonvolatile memory. Over the top of a p type well 101 of the semiconductor substrate, a control gate electrode CG101 and a memory gate electrode MG101 forming the nonvolatile memory cell are formed in such a manner as to be adjacent to each other. Then, between the control gate electrode CG101 and the p type well PW101, an insulation film 103 as the gate insulation film is formed. Whereas, between the memory gate electrode MG101 and the p type well PW101, and between the control gate electrode CG101 and the memory gate electrode MG101, an insulation film 109 including a lamination film of a silicon oxide film 109a, a silicon nitride film 109b, and a silicon oxide film 109c is formed. The control gate electrode CG101 and the memory gate electrode MG101 each include a silicon film. Over the top of the control gate electrode CG101 and the top of the memory gate electrode MG101, a metal salicide layer 121 is formed by a salicide process.

The semiconductor device of such a structure of First Comparative Example has the following problems.

Namely, in the semiconductor device of First Comparative Example shown in FIG. 29, the metal silicide layer 121 over the control gate electrode CG101 and the metal silicide layer 121 over the memory gate electrode MG101 are insulated and isolated from each other by the insulation film 109 which is an ONO film. However, the film thickness of the insulation film 109 is small. As a result, the end of the metal silicide layer 121 over the control gate electrode CG101 is close to the end of the metal silicide layer 121 over the memory gate electrode MG101. This may cause a short-circuit failure between the control gate electrode CG101 and the memory gate electrode MG101. The short circuit between the control gate electrode CG101 and the memory gate electrode MG101 depends upon the formation state of the metal silicide layers 121 over the control gate electrode CG101 and the memory gate electrode MG101. Thus, the short circuit is caused by the proximity between the metal silicide layer 121 over the control gate electrode CG101 and the metal silicide layer 121 over the memory gate electrode MG101 with the thin insulation film 109 interposed therebetween. The semiconductor devices which have undergone such a short-circuit failure are required to be selected and excluded by the inspection of manufacturing of the semiconductor devices, resulting in a reduction of the manufacturing yield of semiconductor devices, and an increase in cost (unit cost) of the semiconductor devices.

The semiconductor device of Second Comparative Example shown in FIG. 30 is a semiconductor device having a memory cell of a nonvolatile memory. Over the top of a p type well 201 of the semiconductor substrate, a lamination pattern 207 including a control gate electrode CG201 and an insulation film 206 thereover, and a memory gate electrode MG201 are formed in such a manner as to be adjacent to each other. Then, between the control gate electrode CG201 and the p type well PW201, an insulation film 203 as the gate insulation film is formed. Whereas, between the memory gate electrode MG201 and the p type well PW201, and between the lamination pattern 207 and the memory gate electrode MG201, an insulation film 209 including a lamination film of a silicon oxide film 209a, a silicon nitride film 209b, and a silicon oxide film 209c is formed. The control gate electrode CG201 and the memory gate electrode MG201 each include a silicon film. Over the top of the memory gate electrode MG201, a metal silicide layer 221 is formed by a salicide process. On the other hand, over the control gate electrode CG201, there is the insulation film 206, and hence the metal silicide layer 221 is not formed.

The insulation film 206 is formed of, for example, a silicon nitride film. This is for the following reason. The steps after the formation of the lamination pattern 207 include steps using hydrofluoric acid. Therefore, when the insulation film 206 is formed of a silicon oxide film, the insulation film 206 may become too small. In Second Comparative Example shown in FIG. 30, as distinct from the structure of FIGS. 1 and 2, the semiconductor device does not have a structure in which such an insulation film (e.g., a silicon oxide film) as to be retreated by a dilute hydrofluoric acid treatment is interposed between the control gate electrode CG201 and the insulation film 206. Therefore, the side surface of the lamination pattern 207 is in a recess-free and almost linear shape. Namely, the upper end corner portion of the control gate electrode CG201 is more angular than that of the structure (control gate electrode CG) of FIGS. 1 and 2.

Further, in the semiconductor device of Second Comparative Example shown in FIG. 30, over the control gate electrode CG201, there is the insulation film 206. Therefore, the metal silicide layer 221 is formed over the top of the memory gate electrode MG201, but is not formed over the top of the control gate electrode CG201. This prevents the metal silicide layer 221 over the memory gate electrode MG201 from being close to the control gate electrode CG201 with the thin insulation film 209 interposed therebetween. For this reason, it is possible to prevent the occurrence of the short-circuit failure between the control gate electrode CG201 and the memory gate electrode MG201.

However, the semiconductor device of Second Comparative Example has the following problems.

Namely, the control gate electrode CG201 and the memory gate electrode MG201 are adjacent to each other via the thin insulation film 209 interposed therebetween. This raises a fear of the leakage current between the control gate electrode CG201 and the memory gate electrode MG201. Particularly, at the sidewall on the side of the lamination pattern 207 adjacent to the memory gate electrode MG201, the upper end corner portion C201 of the control gate electrode CG201 is almost right-angled, and sharp. Accordingly, the electric field concentrates to the upper end corner portion C201. As a result, a leakage current becomes more likely to occur between the upper end corner portion C201 of the control gate electrode CG201 and the memory gate electrode MG201 (or the metal silicide layer 221 over the memory gate electrode MG201).

Further, in the ion implantation step for forming the source/drain regions, impurities to be ion-implanted are also introduced into the top of the insulation film 209 situated between the lamination pattern 207 and the memory gate electrode MG201 (e.g., a portion of the insulation film 209 in a region 231 surrounded by a dotted line of FIG. 30). The impurities-doped portion of the insulation film 209 (the portion of the insulation film 209 in the region 231) is a region in which the leakage current is more likely to occur than in other portions of the insulation film 209. Thus, a leakage current becomes more likely to occur via the region (the portion of the insulation film 209 in the region 231) between the upper end corner portion C201 of the control gate electrode CG201 and the memory gate electrode MG201 (or the metal silicide layer 221 over the memory gate electrode MG201).

The leakage current between the control gate electrode CG201 and the memory gate electrode MG201 reduces the performances of the semiconductor device having a nonvolatile memory. For this reason, the leakage current as described above is desirably minimized.

In contrast, in the present embodiment, as also shown in FIGS. 1 and 2, at the sidewall 7a on the side of the lamination pattern 7 adjacent to the memory gate electrode MG, the upper end corner portion C1 of the control gate electrode CG is not sharp, but is rounded (is roundish, or has a round shape).

The control gate electrode CG is adjacent to the memory gate electrode MG via the thin insulation film 9. When a potential difference occurs between the control gate electrode CG and the memory gate electrode MG, the electric field may concentrate to the upper end corner portion C1 of the control gate electrode CG. However, in the present embodiment, the upper end corner portion C1 of the control gate electrode CG is rounded. As a result, the electric field concentration at the upper end corner portion C1 of the control gate electrode CG can be relieved (inhibited or reduced). For this reason, the leakage current can be inhibited or prevented from occurring between the upper end corner portion C1 of the control gate electrode CG and the memory gate electrode MG (or the metal silicide layer 21 over the top of the memory gate electrode MG).

Further, in the ion implantation step for forming the n⁻ type semiconductor regions 11a and 11b, or in the ion implantation step for forming the n⁺ type semiconductor regions 12a and 12b, impurities to be ion-implanted are also introduced into the top of the insulation film 9 situated between the lamination pattern 7 and the memory gate electrode MG (e.g., a portion of the insulation film 9 in a region 31 surrounded by a dotted line of FIG. 2). The impurities-doped portion of the insulation film 9 (the portion of the insulation film 9 in the region 31) is a region in which the leakage current is more likely to occur than in other portions of the insulation film 9. However, in the present embodiment, the upper end corner portion C1 of the control gate electrode CG is rounded. Accordingly, as compared with the case where the upper end corner portion C1 is not rounded but is right-angled, the upper end corner portion C1 of the control gate electrode CG can be separated (made distant) from the impurities-doped portion of the insulation film 9 (the portion of the insulation film 9 in the region 31). Namely, the length between the upper end corner portion C1 of the control gate electrode CG and the impurities-doped portion of the insulation film 9 (the portion of the insulation film 9 in the region 31) can be set large. This can inhibit or prevent the leakage current from occurring via the impurities-doped portion of the insulation film 9 (the portion of the insulation film 9 in the region 31) between the upper end corner portion C1 of the control gate electrode CG and the memory gate electrode MG (or the metal silicide layer 21 over the memory gate electrode MG).

Thus, in the present embodiment, at the sidewall 7a on the side of the lamination pattern 7 adjacent to the memory gate electrode MG, the upper end corner portion C1 of the control gate electrode CG is not sharp, but is rounded. This can inhibit or prevent the leakage current between the control gate electrode CG and the memory gate electrode MG. As a result, it is possible to improve the performances of the semiconductor device having a nonvolatile memory.

Further, in the present embodiment, over the control gate electrode CG, the insulation film 5 and the insulation film 6 are stacked to form the lamination pattern 7. Accordingly, the metal silicide layer 21 is formed over the top of the memory gate electrode MG, but is not formed over the top of the control gate electrode CG. This prevents the metal silicide layer 21 over the memory gate electrode MG from being close to the control gate electrode CG with the thin insulation film 9 interposed therebetween. For this reason, it is possible to prevent the occurrence of the short-circuit failure between the control gate electrode CG and the memory gate electrode MG. Therefore, it is possible to improve the manufacturing yield of the semiconductor devices. Further, it is possible to reduce the cost (unit cost) of the semiconductor devices. Still further, it is possible to improve the reliability of the semiconductor device.

Figure 31:
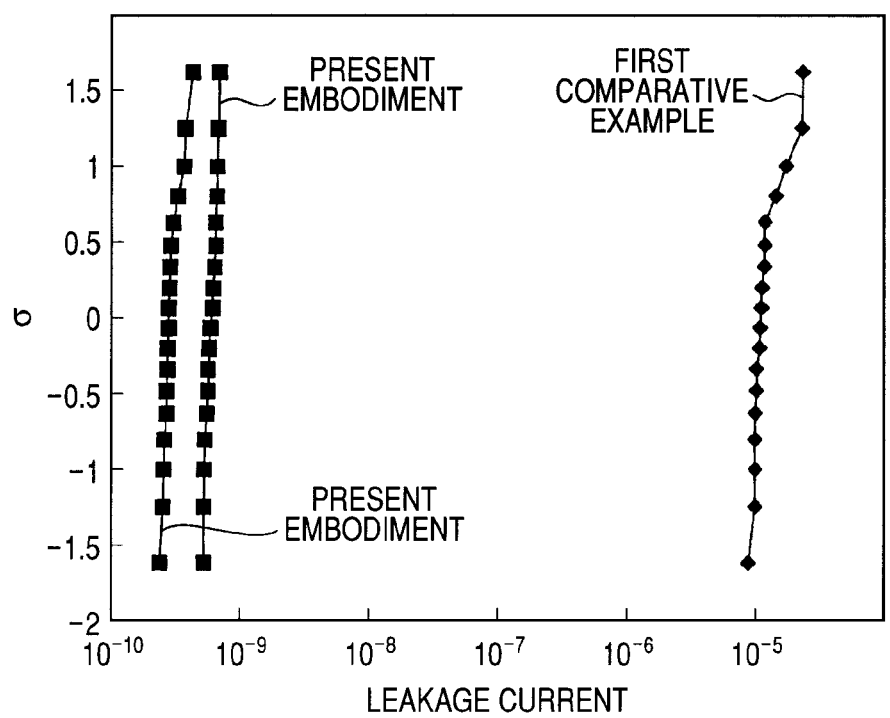
FIG. 31 is a graph showing the leakage current between the memory gate electrode and the control gate electrode of a nonvolatile memory.

FIG. 31 is a graph showing the leakage current between the memory gate electrode and the control gate electrode of the nonvolatile memory. The abscissa of the graph of FIG. 31 corresponds to the leakage current value upon applying a predetermined voltage across the memory gate electrode and the control gate electrode; and the ordinate of the graph of FIG. 31 corresponds to the cumulative frequency (cumulative frequency indicated with standard deviation a). Further, in FIG. 31, the case indicated with "First Comparative Example" is the case of the structure of First Comparative Example shown in FIG. 29. In FIG. 31, the case indicated with "Present Embodiment" is the case of the structure of the present embodiment shown in FIGS. 1 and 2.

As shown in the graph of FIG. 31, as compared with the structure of First Comparative Example shown in FIG. 29, the structure of the present embodiment shown in FIGS. 1 and 2 can more largely reduce the leakage current between the control gate electrode CG and the memory gate electrode MG. Further, although not shown in the graph of FIG. 31, the following has been confirmed: in the case of the structure of Second Comparative Example shown in FIG. 30, the value of the leakage current is a value between that in "First Comparative Example" and that in "Present Embodiment" in FIG. 31.

Further, in the present embodiment, over the control gate electrode CG, the insulation films 5 and 6 are stacked to form the lamination pattern 7. At the sidewall 7a on the side of the lamination pattern 7 adjacent to the memory gate electrode MG, the insulation film 5 is retreated from the control gate electrode CG and the insulation film 6. As a result, the upper end corner portion C1 of the control gate electrode CG can be rounded.

Namely, as distinct from the present embodiment, unless the insulation film 5 is retreated from the control gate electrode CG and the insulation film 6 at the sidewall of the lamination pattern 7, even when the exposed surface of (the n type silicon film 4n forming) the control gate electrode CG is oxidized, it is difficult to round the upper end corner portion C1 of the control gate electrode CG. In contrast, as in the present embodiment, there is formed a state (the structure of FIG. 13) in which at the sidewall of the lamination pattern 7, the insulation film 5 is retreated from the control gate electrode CG and the insulation film 6. As a result, by subsequently oxidizing the exposed surface of (the n type silicon film 4n forming) the control gate electrode CG (in the case of the present embodiment, oxidizing the exposed surface in the silicon oxide film 9a formation step), it is possible to round the upper end corner portion C1 of the control gate electrode CG as in FIG. 15.

Accordingly, the following state results: in the memory cell MC in the semiconductor device after manufacturing, at the sidewall 7a on the side of the lamination pattern 7 adjacent to the memory gate electrode MG, the insulation film 5 is retreated from the control gate electrode CG and the insulation film 6, and the upper end corner portion C1 of the control gate electrode CG is rounded.

Further, in the patterning step of the Step S8, the lamination pattern 7 is formed. Then, at the sidewall of the lamination pattern 7, the insulation film 5 is side etched, and is retreated from the n type silicon film 4n (control gate electrode CG) and the insulation film 6. Thus, it is possible to form the state (the structure of FIG. 13) in which the insulation film 5 is retreated from the control gate electrode CG and the insulation film 6 with ease and precision.

Then, it is preferable that the insulation film 5 is a silicon oxide film, and that the insulation film 6 is a silicon nitride film. As a result, it becomes possible to selectively side etch the insulation film 5 with precision. Further, in the patterning step of the Step S8, the lamination pattern 7 is formed. Then, at the sidewall of the lamination pattern 7, the insulation film 5 is side etched, and retreated from (the n type silicon film 4n forming) the control gate electrode CG and the insulation film 6. This procedure is more preferably carried out by a wet treatment using hydrofluoric acid (in the case of the present embodiment, corresponding to the cleaning treatment of the Step S12). As a result, it is possible to side etch the insulation film 5 including silicon oxide with more precision while preventing etching of the insulation film 6 and the control gate electrode CG.

Further, in the present embodiment, in order to reduce the leakage current between the control gate electrode CG and the memory gate electrode MG, the upper end corner portion C1 of the control gate electrode CG is rounded. However, when the lower end corner portion C3 of the control gate electrode CG is too rounded, the function of the control gate electrode CG may be adversely affected thereby. Herein, the lower end corner portion C3 of the control gate electrode CG corresponds to the corner portion between the bottom surface of the control gate electrode CG (the surface thereof in contact with the insulation film 3), and the side surface on the side of the control gate electrode CG adjacent to the memory gate electrode MG (the side surface thereof corresponding to the sidewall 7a). Accordingly, it is preferable that, at the sidewall 7a on the side of the lamination pattern 7 adjacent to the memory gate electrode MG, the degree of roundness of the upper end corner portion C1 of the control gate electrode CG is larger than the degree of roundness of the lower end corner portion C3 of the control gate electrode CG. Then, it is further preferable that, at the sidewall 7a on the side of the lamination pattern 7 adjacent to the memory gate electrode MG, the lower end corner portion C3 of the control gate electrode CG is not rounded, namely, is roughly right-angled. With this configuration, the degree of roundness of the upper end corner portion C1 of the control gate electrode CG is enhanced. As a result, it is possible to reduce the leakage current between the control gate electrode CG and the memory gate electrode MG. In addition, the degree of roundness of the lower end corner portion C3 of the control gate electrode CG is lowered. As a result, it is possible to acquire the function of the control gate electrode CG with more precision. Herein, the respective degrees of roundness of the upper end corner portion C1 and the lower end corner portion C3 of the control gate electrode CG correspond to their respective corner Rs (radiuses of the rounded portion) of the upper end corner portion C1 and the lower end corner portion C3 of the control gate electrode CG, respectively.

Further, at the sidewall of the lamination pattern 7, the insulation film 5 is side etched, and is retreated from (the n type silicon film 4n forming) the control gate electrode CG and the insulation film 6. At this step, the insulation film 3 situated under the control gate electrode CG is preferably etched (side etched) as little as possible because it is used as the gate insulation film later. From this viewpoint, the thickness (formed film thickness) T2 of the insulation film 5 formed in the Step S6 is preferably larger than the thickness (formed film thickness) T1 of the insulation film 3 formed in the Step S4 (i.e., T2>T1). This can inhibit or prevent the insulation film 3 situated under the control gate electrode CG from being etched (side etched) when the insulation film 5 is side etched, and is retreated from (the n type silicon film 4n forming) the control gate electrode CG and the insulation film 6. As a result, it is possible to more improve the reliability of the insulation film 3 functioning as the gate insulation film.

Further, as the insulation film 3 formed in the Step S4, either of a silicon oxide film or a silicon oxynitride film can be used. However, a silicon oxynitride film is more preferably used as the insulation film 3. In the case where both of the insulation film 5 and the insulation film 3 are silicon oxide films, when the insulation film 5 is side etched, and is retreated from the control gate electrode CG and the insulation film 6, the insulation film 3 under the control gate electrode CG tends to be etched (side etched). However, when the insulation film 3 is a silicon oxynitride film, the insulation film 3 under the control gate electrode CG can be more precisely prevented from being etched (side etched) upon side etching of the insulation film 5. Further, when a silicon oxide film formed by a CVD method is used as the insulation film 5, the insulation film 5 can be more precisely etched while preventing etching (side etching) of the insulation film 3 under the control gate electrode CG.

Further, in the present embodiment, when the sacrifice oxide film 8 is removed in the cleaning step of Step S12, at the sidewalls 7a and 7b of the lamination pattern 7, the insulation film 5 is side etched. For this reason, it is not necessary to separately add a side etching step of the insulation film 5. This can inhibit the increase in number of manufacturing steps of the semiconductor device.

Further, in the following Embodiment 2, when a natural oxide film, and the like are removed in the cleaning step of Step S10a, at the sidewalls 7a and 7b of the lamination pattern 7, the insulation film 5 is side etched. For this reason, it is not necessary to separately add a side etching step of the insulation film 5. This can inhibit the increase in number of manufacturing steps of the semiconductor device.

Embodiment 2

In Embodiment 2, a description will be given to another manufacturing process for manufacturing the semiconductor device described in the Embodiment 1.

FIGS. 32 to 40 are each an essential part cross-sectional view of the semiconductor device of the present embodiment during a manufacturing step. Out of these, FIGS. 32, 35, 37 and 39 show the same regions (cross-sectional regions) as those in FIGS. 6 to 11, 14, 17 to 20, and 22 to 28 of the Embodiment 1. FIGS. 33, 34, 36, 38, and 40 show the same regions (cross-sectional regions) as those in FIGS. 12, 13, 15, 16, and 21 of the Embodiment 1.

In the Embodiments 1 and 2, in the Step S8, the lamination pattern 7 is formed. Then, there is performed a step in which, at the sidewalls of the lamination pattern 7, the insulation film 5 is side etched, and the insulation film 5 is retreated from (the n type silicon film 4n forming) the control gate electrode CG and the insulation film 6. This step corresponds to the cleaning step of Step S12 in the Embodiment 1, and corresponds to the cleaning step of Step S10 in the present embodiment. Below, manufacturing steps of the semiconductor device of the present embodiment will be described by reference to the accompanying drawings.

The manufacturing steps of the present embodiment are the same in the steps up to immediately before performing the cleaning step of the Step S10 as the manufacturing steps of Embodiment 1. Therefore, herein, a description thereon will be omitted, and the steps will be described from the cleaning step of Step S10.

Figure 32:
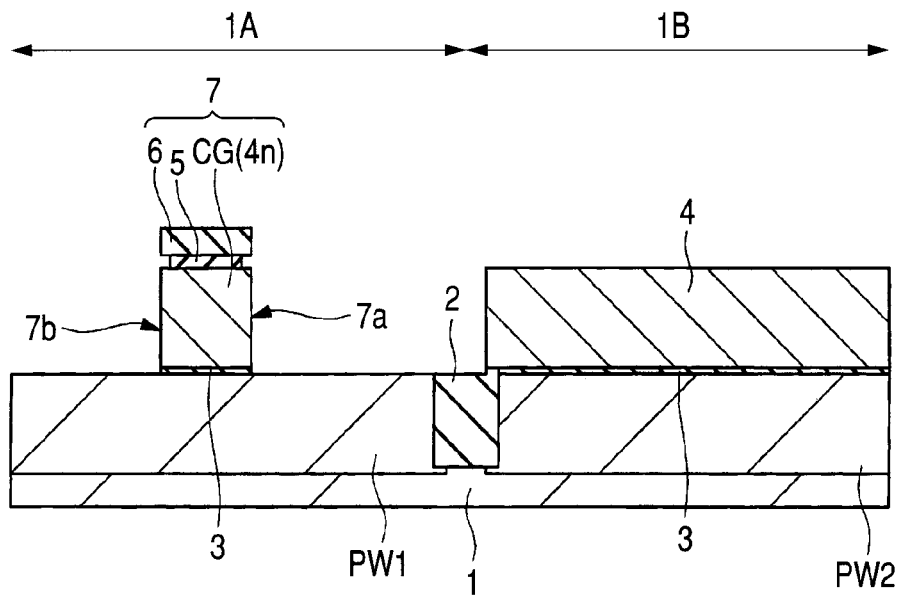
FIG. 32 is an essential part cross-sectional view of a semiconductor device which is one embodiment of the present invention during a manufacturing step.
Figure 33:
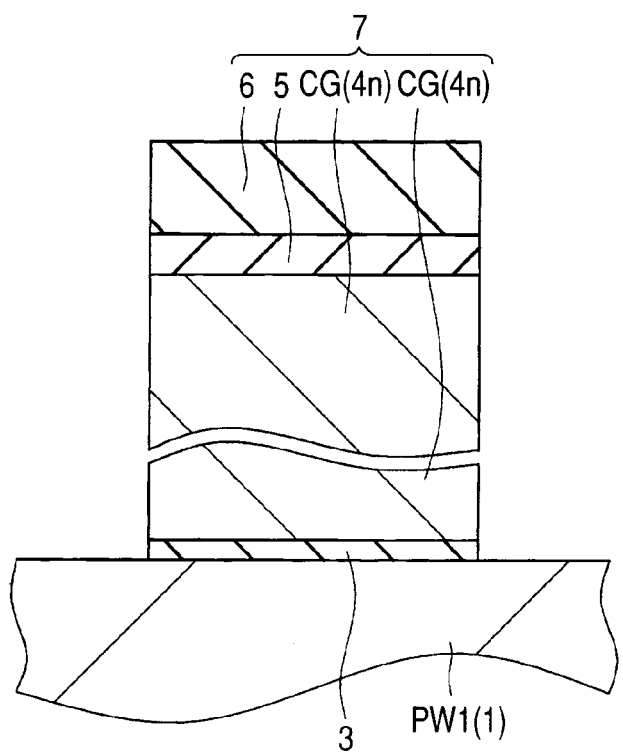
FIG. 33 is an essential part cross-sectional view of the semiconductor device immediately before undergoing a cleaning treatment of Step S10 during a manufacturing step.

The same steps as Steps S1 to S9 of Embodiment 1 are performed to obtain the structure of FIG. 9. Then, also in the present embodiment, the cleaning treatment of Step S10 (cleaning step) is performed. FIG. 32 shows an essential part cross-sectional view at the stage of having performed the cleaning treatment of Step S10 in the present embodiment. Further, FIGS. 33 and 34 each show an enlarged view of the lamination pattern 7 and the neighboring regions, wherein FIG. 33 shows the stage immediately before performing the cleaning treatment of Step S10, and FIG. 34 shows the stage of having performed the cleaning treatment of Step S10 (the stage before performing the sacrifice oxidation of Step S11).

Embodiment 1 and the present embodiment are different in the cleaning solution for use in the cleaning treatment of Step S10. Namely, in Embodiment 1, for the cleaning treatment of Step S10, a cleaning solution not containing hydrofluoric acid was used. In contrast, in the present embodiment, for the cleaning treatment of Step S10, hydrofluoric acid (HF) is used. Thus, using a cleaning solution containing hydrofluoric acid (HF), the cleaning treatment of Step S10 is performed. Specifically, in the present embodiment, using dilute hydrofluoric acid (an aqueous solution of hydrofluoric acid), the cleaning treatment of Step S10 is performed. Below, the cleaning treatment of Step S10 (cleaning step) performed in the present embodiment is referred to as the cleaning treatment of Step S10a (cleaning step).

In the present embodiment, in the cleaning treatment of Step S10a, by using a cleaning solution containing hydrofluoric acid (preferably dilute hydrofluoric acid), the silicon oxide film can be selectively etched. Accordingly, by the cleaning treatment of Step S10a, as shown in FIGS. 32 and 34, in the lamination pattern 7 in the memory cell region 1A, the insulation film 5 (silicon oxide film) is side etched. Further, when over the surface of the p type well PW1, and the like, a natural oxide film is formed, the natural oxide film can also be removed by the cleaning treatment of Step S10a. Therefore, the cleaning step of Step S10a of the present embodiment can also be regarded as an etching step.

Figure 34:
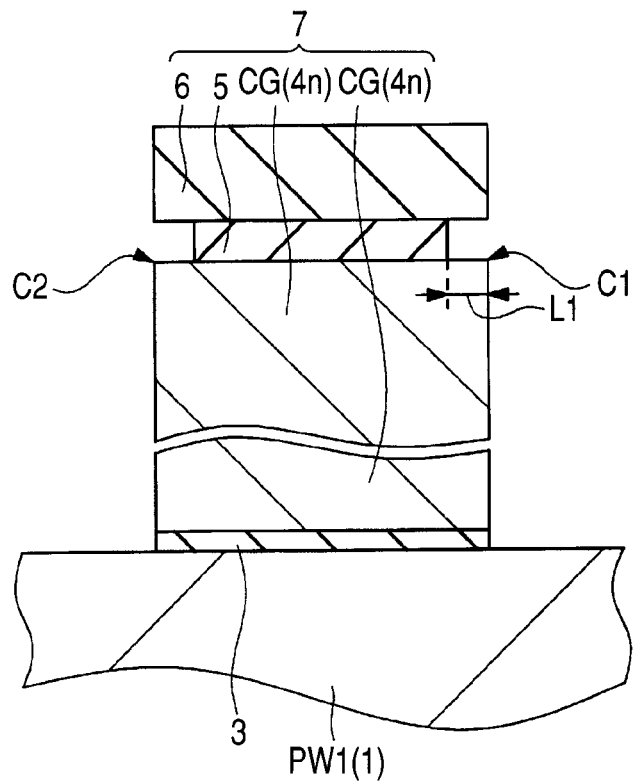
FIG. 34 is an essential part cross-sectional view of the same semiconductor device during a manufacturing step as that of FIG. 32.

By the cleaning treatment of Step S10a, as shown in FIGS. 32 and 34, in the memory cell region 1A, portions of the main surface (silicon surface) of the semiconductor substrate 1 (p type well PW1) not covered with the control gate electrode CG, and the side surfaces (silicon surfaces of) the control gate electrode CG are exposed. In the peripheral circuit region 1B, the top surface (silicon surface) of the silicon film 4 is exposed.

On the other hand, in the cleaning step of Step S10a, a cleaning solution containing hydrofluoric acid (preferably dilute hydrofluoric acid) is used. Therefore, the silicon film and the silicon nitride film are less likely to be etched than the silicon oxide film. Accordingly, in the cleaning treatment of Step S10a, the semiconductor substrate 1, the silicon film 4, the n type silicon film 4n, and the insulation film 6 (silicon nitride film) are hardly etched. Namely, in the cleaning treatment of Step S10a, a cleaning solution whereby the insulation film 5 is more likely to be etched as compared with the semiconductor substrate 1, the silicon film 4, the n type silicon film 4n, and the insulation film 6 is used. From this viewpoint, a cleaning solution containing hydrofluoric acid is preferably used.

In the lamination pattern 7 in the memory cell region 1A, the insulation film 5 (silicon oxide film) is vertically sandwiched between the insulation film 6 (silicon nitride film) and the control gate electrode CG (n type silicon film 4n). For this reason, in the cleaning step of Step S10a, for the insulation film 5 of the lamination pattern 7, etching does not progress from the top surface side covered with the insulation film 6, and etching also does not progress from the bottom surface side in contact with the control gate electrode CG. However, in the cleaning treatment of Step 10a, the sidewalls (side surfaces of) the lamination pattern 7 are exposed to a cleaning solution containing hydrofluoric acid. Accordingly, as apparent from the comparison between FIG. 33 and FIG. 34, in the lamination pattern 7, the insulation film 5 exposed at the sidewalls (side surfaces) of the lamination pattern 7 is etched (side etched) in the transverse direction, i.e., in the direction in parallel with the planar direction of the insulation film 5 (corresponding to the direction generally in parallel with the main surface of the semiconductor substrate 1).

However, before etching of the whole of the insulation film 5 of the lamination pattern 7, the cleaning treatment of Step S10a is terminated (stopped). Namely, in the lamination pattern 7 in the memory cell region 1A, a portion (outer circumferential region of the plane configuration) of the insulation film 5 is etched and removed. However, other portions of the insulation film 5 are not etched, and remain. This can be implemented by controlling the hydrofluoric acid concentration of the cleaning solution and the cleaning treatment time in the cleaning treatment of Step S10a. Further, in the present embodiment, in the cleaning treatment of Step S10a, it is necessary not only to remove the natural oxide film, but also to side etch the insulation film 5. For this reason, as compared with the case where only the natural oxide film is removed (the case where side etching of the insulation film 5 is not performed), the cleaning treatment time (wet treatment time) is made longer.

Thus, the cleaning treatment of Step S10a is performed. As a result, although the lamination pattern 7 in the memory cell region 1A has a lamination structure of the control gate electrode CG (n type silicon film 4n), the insulation film 5, and the insulation film 6, the insulation film 5 is selectively side etched. On the other hand, in the peripheral circuit region 1B, the insulation film 5 is etched, so that only the silicon film 4 remains. The cleaning treatment of Step S12 is performed. As a result, the lamination pattern 7 in the memory cell region 1A is in a structure in which (the side surfaces of) the insulation film 5 (are) is retreated (i.e., recessed inward) from (the side surfaces of) the control gate electrode CG and (the side surfaces of) the insulation film at sidewalls (side surfaces). Therefore, the cleaning step of Step S10a can also be regarded as a step of side etching the insulation film 5 at the sidewalls of the lamination pattern 7, and allowing the insulation film 5 to be retreated from (the n type silicon film 4n forming) the control gate electrode CG and the insulation film 6.

Figure 35:
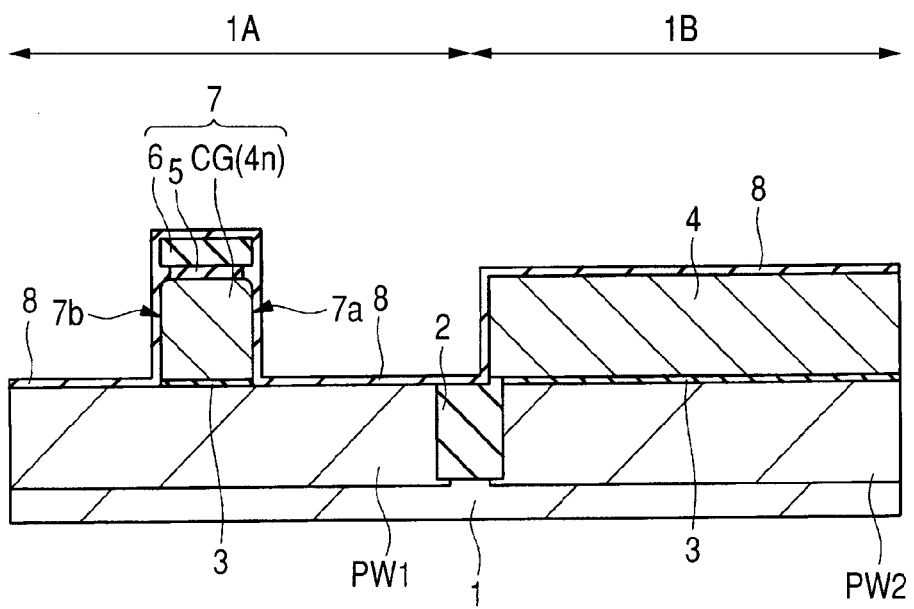
FIG. 35 is an essential part cross-sectional view of the semiconductor device during a manufacturing step following that of FIG. 32.

Then, also in the present embodiment, by performing the same sacrifice oxidation of Step S11 as that in Embodiment 1, the sacrifice oxide film 8 is formed. FIG. 35 shows an essential part cross-sectional view at the stage of having performed the sacrifice oxidation of Step S11 in the present embodiment. Further, FIG. 36 shows an enlarged view of the lamination pattern 7 and the neighboring regions at the same stage as that in FIG. 35 (the stage of having performed sacrifice oxidation of Step S11).

The sacrifice oxidation of Step S11 to be performed in the present embodiment is basically the same as the sacrifice oxidation of Step S11 to be performed in Embodiment 1. However, the present embodiment is different from Embodiment 1 in the following point: the sacrifice oxidation of Step S11 is performed with the top surface of the silicon film 4 used for forming (patterning) the gate electrode GE later exposed in the peripheral circuit region 1B; and accordingly, as shown in FIG. 35, the sacrifice oxide film 8 is also formed over the top surface of the silicon film 4 in the peripheral circuit region 1B. Further, the present embodiment is also different from Embodiment 1 in the following point: the sacrifice oxidation of Step S11 is performed with the insulation film 5 side etched in the lamination pattern 7 in the memory cell region 1A. Below, the sacrifice oxidation of Step S11 (sacrifice oxidation step) to be performed in the present embodiment is referred to as sacrifice oxidation of step S11a (sacrifice oxidation step).

Figure 36:
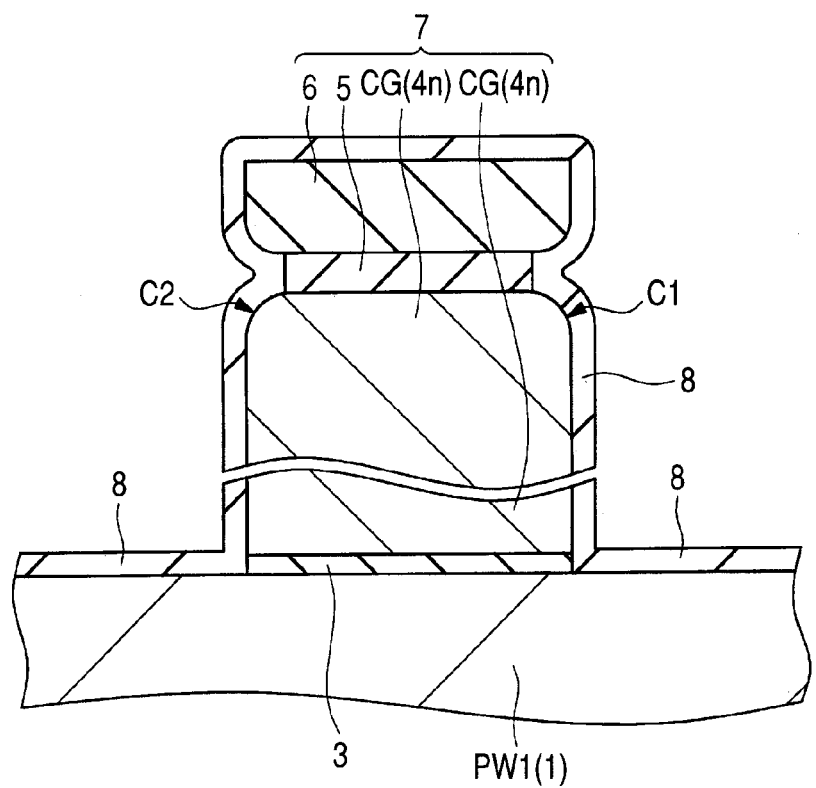
FIG. 36 is an essential part cross-sectional view of the same semiconductor device during a manufacturing step as that of FIG. 35.

By sacrifice oxidation of Step S11a, as shown in FIGS. 35 and 36, in the memory cell region 1A, portions of the main surface (surface) of the semiconductor substrate 1 (p type well PW1) not covered with the lamination pattern 7 (control gate electrode GE), and the side surfaces (sidewalls) of (the n type silicon film 4n forming) the control gate electrode CG of the lamination pattern 7 are oxidized to form the sacrifice oxide film (silicon oxide film) 8. Whereas, in the peripheral circuit region 1B, the top surface of the silicon film 4 is oxidized to form the sacrifice oxide film (silicon oxide film) 8. The film thickness of the sacrifice oxide film 8 can be set at, for example, about 3 to 6 nm. When the sacrifice oxidation of Step S11a is performed by ISSG oxidation, not only the Si region (herein, the semiconductor substrate 1, the n type silicon film 4n, and the silicon film 4) but also the SiN region (herein the insulation film 6) can be oxidized. Accordingly, the top surface and the side surfaces (sidewalls) of the insulation film 6 (silicon nitride film) of the lamination pattern 7 are also oxidized to form the sacrifice oxide film 8.

In the present embodiment, when the sacrifice oxide film 8 is formed in the sacrifice oxidation step of Step S11a, at the sidewalls of the lamination pattern 7, the surfaces (exposed surfaces of) the n type silicon film 4n forming the gate electrode CG (are) is oxidized. As a result, the upper end corner portions C1 and C2 of (the n type silicon film 4n forming) the control gate electrode CG are rounded. The reason for this is the same as the reason why the upper end corner portions C1 and C2 of (the n type silicon film 4n forming) the control gate electrode CG are rounded when the silicon oxide film 9a is formed in Embodiment 1.

Namely, in Embodiment 1, in the cleaning step of Step S12, at the sidewalls of the lamination pattern 7, the insulation film 5 is side etched. This results in the formation of the structure in which (side surfaces of) the insulation film 5 are retreated from (the side surfaces of) the control gate electrode CG and (the side surfaces of) the insulation film 6. In this state, the formation step of the silicon oxide film 9a (the oxidation treatment of the semiconductor substrate 1) is performed. As a result, the upper end corner portions C1 and C2 of the control gate electrode CG are rounded. In contrast, in the present embodiment, in the cleaning step of Step S10a, at the sidewalls of the lamination pattern 7, the insulation film 5 is side etched. This results in the formation of the structure in which (the side surfaces of) the insulation film 5 (are) is retreated from (the side surfaces of) the control gate electrode CG and (the side surfaces of) the insulation film 6. In this state, the sacrifice oxidation of Step S11a (the oxidation treatment of the semiconductor substrate 1) is performed. As a result, the upper end corner portions C1 and C2 of the control gate electrode CG are rounded.

In other words, the insulation film 5 is side etched, so that the insulation film 5 is retreated from the control gate electrode CG and the insulation film 6. As a result, not only the side surfaces of the control gate electrode CG are exposed, but also the regions in the vicinity of the upper end corner portions C1 and C2 of the top surface of the control gate electrode CG are exposed. In this state, the oxidation treatment of the semiconductor substrate 1 (in Embodiment 1, the formation step of the silicon oxide film 9a, in the present embodiment, the sacrifice oxidation step of step S11a) is performed. Accordingly, in Embodiment 1, at the stage of having formed the silicon oxide film 9a, and in the present embodiment, at the stage of having formed the sacrifice oxide film 8 in the step S11a, the upper end corner portions C1 and C2 of the control gate electrode CG are changed from the almost right-angled and sharp corner portions into the rounded portions.

Further, as with the cleaning step of Step S12 of Embodiment 1, also with the cleaning step of Step S10a of the present embodiment, it is preferable that L1 is equal to, or larger than T4 (i.e., L1≥T4), where L1 denotes the length by which the insulation film 5 is retreated from the control gate electrode CG and the insulation film 6 at the sidewalls of the lamination pattern 7 due to side etching of the insulation film 5, and T4 denotes the thickness of the silicon oxide film 9a forming the insulation film 9 formed in Step S13. Herein, the length L1 is shown in FIG. 34, and the thickness T4 is shown in FIG. 15. Further, it is further preferable that L1 is 4 nm or more (i.e., L1≥4 nm), where L1 denotes the length by which the insulation film 5 is retreated from the control gate electrode CG and the insulation film 6 at the sidewalls of the lamination pattern 7. As a result, it is possible to further precisely form the sufficiently rounded upper end corner portions C1 and C2 on the control gate electrode CG.

Further, in the present embodiment, in the sacrifice oxidation step of Step S11a, the exposed surfaces of the control gate electrode CG are oxidized. Thus, the upper end corner portions C1 and C2 of the control gate electrode CG are rounded. For this reason, in order to allow progress of oxidation of the exposed surfaces of the control gate electrode CG, the sacrifice oxidation of Step S11a is performed by the oxidation treatment of the semiconductor substrate 1, and preferably can be performed by thermal oxidation. However, it is further preferable that the step is performed by ISSG oxidation. Further, by the step of forming the silicon oxide film 9a, the lower end corner portions of the insulation film 6 also each become in the rounded shape.

Figure 37:
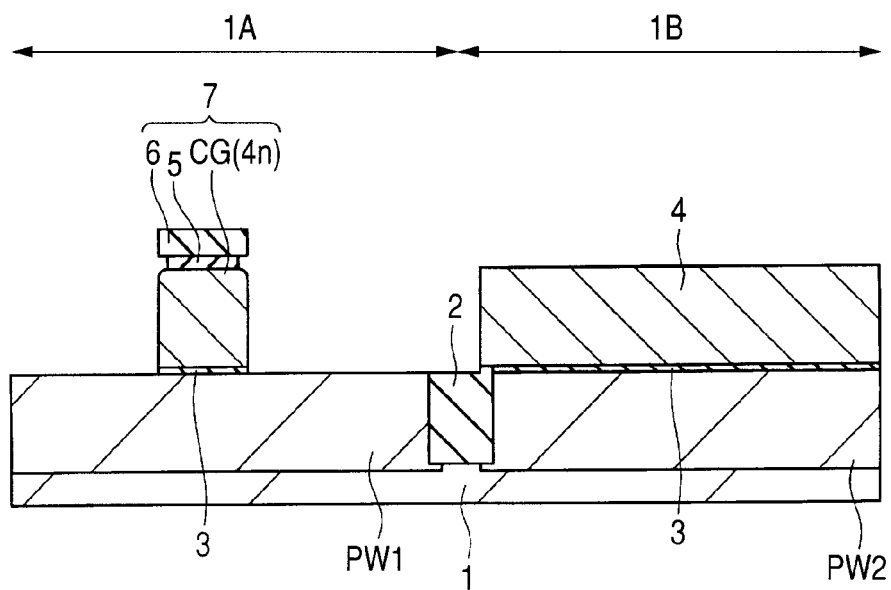
FIG. 37 is an essential part cross-sectional view of the semiconductor device during a manufacturing step following that of FIG. 35.

Then, also in the present embodiment, the same cleaning treatment of Step S12 (cleaning step) as that in Embodiment 1 is performed. FIG. 37 shows an essential part cross-sectional view at the stage of having performed the cleaning treatment of Step S12 in the present embodiment. Further, FIG. 38 shows an enlarged view of the lamination pattern 7 and the neighboring regions at the same stage as that of FIG. 37 (the stage of having performed the cleaning treatment of Step S12).

The cleaning treatment of Step S12 to be performed in the present embodiment is basically the same as the cleaning treatment of Step S12 performed in Embodiment 1. For this reason, also in the present embodiment, as with Embodiment 1, using a cleaning solution containing hydrofluoric acid, specifically dilute hydrofluoric acid (an aqueous solution of hydrofluoric acid), the cleaning treatment of Step S12 is performed. Below, the cleaning treatment of Step S12 (cleaning step) to be performed in the present embodiment is referred to as the cleaning treatment of Step S12a (cleaning step).

Figure 38:
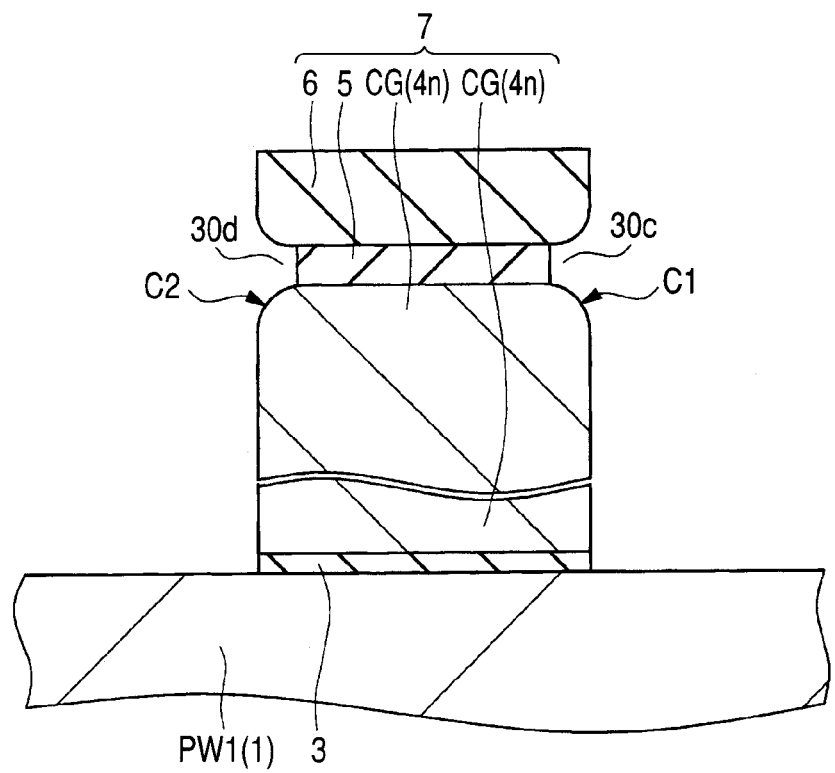
FIG. 38 is an essential part cross-sectional view of the same semiconductor device during a manufacturing step as that of FIG. 37.

By the cleaning treatment of Step S12a, as shown in FIGS. 37 and 38, the sacrifice oxide film 8 is etched and removed. Further, by the cleaning treatment of Step S12a, it is possible not only to remove the sacrifice oxide film 8, but also to further side etch the insulation film 5 at the lamination pattern 7 in the memory cell region 1A. Therefore, the cleaning step of Step S12a can also be regarded as the etching step.

By the cleaning treatment of Step S12a, the sacrifice oxide film 8 is removed. As a result, in the memory cell region 1A, portions of the main surface (silicon surface) of the semiconductor substrate 1 (p type well PW1) not covered with the lamination pattern 7 (control gate electrode CG), and the side surfaces (silicon surfaces of) the control gate electrode CG are exposed. On the other hand, in the peripheral circuit region 1B, the top surface (silicon surface) of the silicon film 4 is exposed.

In the cleaning treatment of Step S12a, a cleaning solution containing hydrofluoric acid (preferably dilute hydrofluoric acid) is used. For this reason, the silicon film and the silicon nitride film are less likely to be etched than the silicon oxide film, and the semiconductor substrate 1, the n type silicon film 4n, the silicon film 4, and the insulation film 6 are hardly etched. These points are the same as with the cleaning treatment of Step S12 of Embodiment 1.

Then, also in the present embodiment, the same formation step of the insulation film 9 of Step S13 as that in Embodiment 1 is performed.

Figure 39:
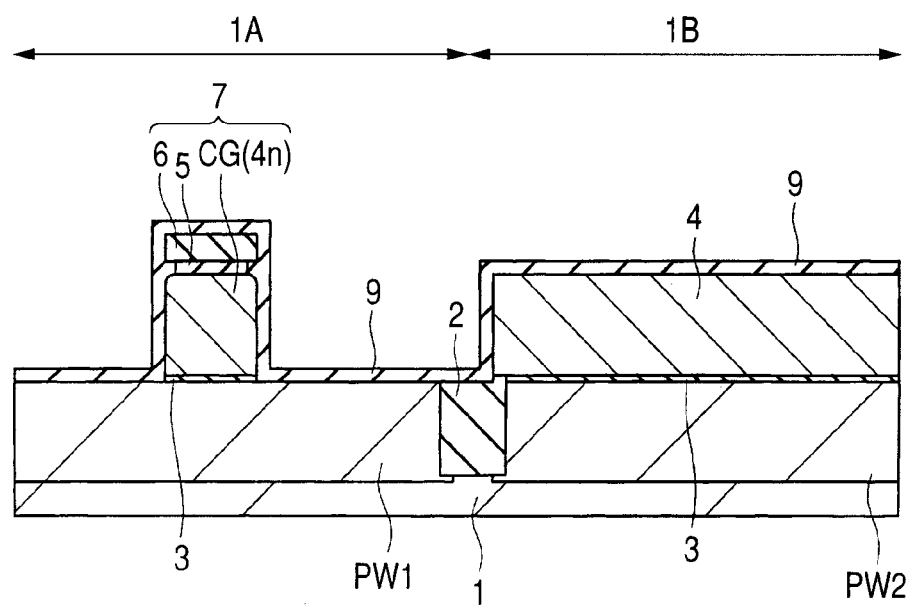
FIG. 39 is an essential part cross-sectional view of the semiconductor device during a manufacturing step following that of FIG. 37.
Figure 40:
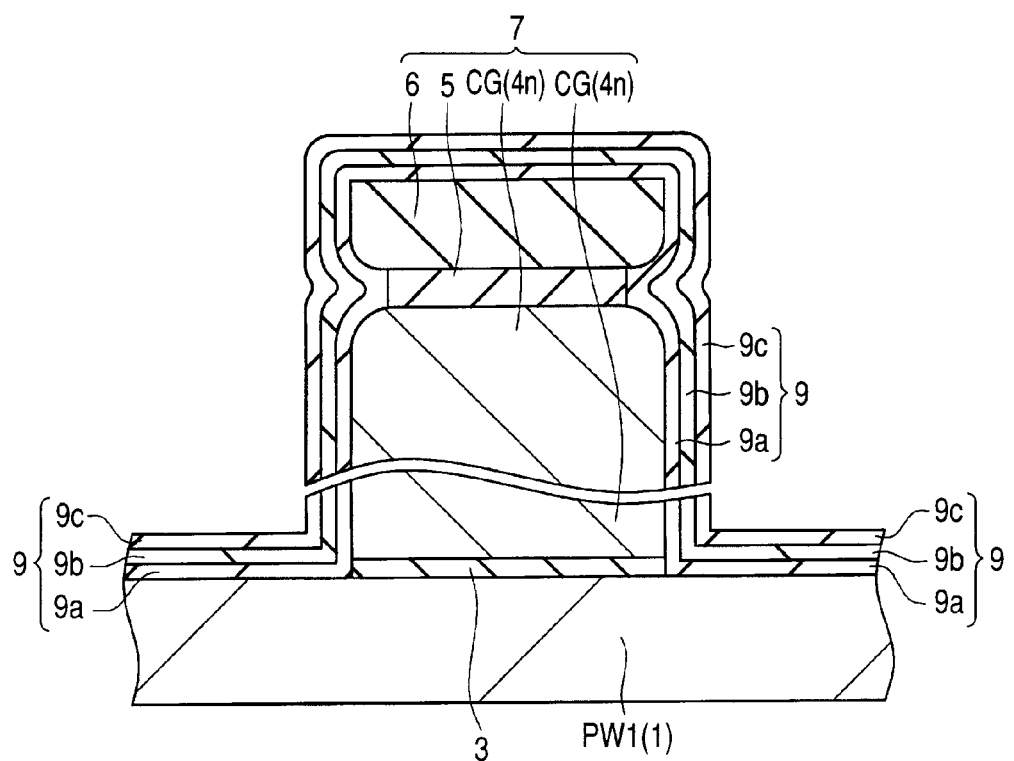
FIG. 40 is an essential part cross-sectional view of the same semiconductor device during a manufacturing step as that of FIG. 39.

FIG. 39 shows an essential part cross-sectional view at the stage of having formed the insulation film 9 of Step S13 in the present embodiment. Further, FIG. 40 shows an enlarged view of the lamination pattern 7 and the neighboring regions at the same stage as that of FIG. 39 (the stage of having performed the formation step of the insulation film 9 of Step S13). Incidentally, in FIG. 39, for facilitating understanding of the drawing, the lamination film of the silicon oxide film 9a, the silicon nitride film 9b, and the silicon oxide film 9c is simply shown as the insulation film 9. In contrast, in FIG. 40, the insulation film 9 is shown as the lamination film of the silicon oxide film 9a, the silicon nitride film 9b, and the silicon oxide film 9c. In actuality, the insulation film 9 is the lamination film of the silicon oxide film 9a, the silicon nitride film 9b, and the silicon oxide film 9c.

Also in the present embodiment, the configuration and the formation method of the insulation film 9 are basically the same as those in Embodiment 1. Namely, also in the present embodiment, as with Embodiment 1, the insulation film 9 includes the lamination film (ONO film) of the silicon oxide film 9a, the silicon nitride film 9b, and the silicon oxide film 9c sequentially formed from the bottom. As with Embodiment 1, the insulation film 9 is, as shown in FIGS. 39 and 40, formed over the surface of the p type well PW1 (however, the portions not covered with the control gate electrode CG), over the sidewalls (side surfaces) and the top surface of the lamination pattern 7, and over the top surface of the silicon film 4 in the peripheral circuit region 1B.

In Embodiment 1 described above, in the silicon oxide film 9a formation step, by oxidizing the exposed surfaces (surfaces) of the control gate electrode CG, the upper end corner portions C1 and C2 of the control gate electrode CG were rounded. In contrast, in the present embodiment, by oxidizing the exposed surfaces (surfaces) of the control gate electrode CG in the sacrifice oxidation step of Step S11a, the upper end corner portions C1 and C2 of the control gate electrode CG are rounded. Accordingly, in Embodiment 1, the silicon oxide film 9a formation step is performed by subjecting the semiconductor substrate 1 to an oxidation treatment, and is preferably performed by thermal oxidation (further preferably ISSG oxidation). However, in the present embodiment, not only with these methods, but also with, for example, a CVD method, the silicon oxide film 9a can be formed. However, in the present embodiment, when the silicon oxide film 9a formation step is performed by subjecting the semiconductor substrate 1 to an oxidation treatment (preferably thermal oxidation, and further preferably ISSG oxidation), the exposed surfaces (surfaces) of the control gate electrode CG can be oxidized even in the silicon oxide film 9a formation step. For this reason, it is possible to further enhance the degree of roundness of the upper end corner portions C1 and C2 of the control gate electrode CG after formation of the silicon oxide film 9a as compared with before the formation of the silicon oxide film 9a.

Further, at the sidewalls of the lamination pattern 7, the insulation film 5 is side etched, and is retreated from the control gate electrode CG and the insulation film 6. Then, in Step S13, the insulation film 9 is formed. Accordingly, in regions in which the insulation film 5 is retreated at the sidewalls 7a and 7b of the lamination pattern 7 (the regions corresponding to regions 30c and 30d shown in FIG. 38), portions of the insulation film 9 penetrate. The insulation film 9 specifically includes a lamination film of the silicon oxide film 9a, the silicon nitride film 9b, and the silicon oxide film 9c. Accordingly, in regions in which the insulation film 5 is retreated at the sidewalls of the lamination pattern 7 (the regions corresponding to the regions 30c and 30d shown in FIG. 38), portions of the silicon nitride film 9b also penetrate.

The subsequent steps are the same as those in Embodiment 1. Namely, also in the present embodiment, as with Embodiment 1, the n type silicon film 10n for forming the memory gate electrode MG is formed in Step S14, and further, the steps subsequent to Step S14 are performed. However, herein, they are not shown, and a description thereon will not be repeated. Further, the structure of the manufactured semiconductor device was described in Embodiment 1, and hence a description thereon is omitted.

In the present embodiment, almost the same effects as those in Embodiment 1 can be obtained. In addition, the following effects can also be obtained.

In Embodiment 1, by oxidizing the exposed surfaces (surfaces) of the control gate electrode CG in the silicon oxide film 9a formation step, the upper end corner portions C1 and C2 of the control gate electrode CG were rounded. However, the film thickness of the silicon oxide film 9a is required to be determined in view of the function as the gate insulation film of the memory transistor. In contrast, in the present embodiment, by oxidizing the exposed surfaces (surfaces) of the control gate electrode CG in the sacrifice oxidation step of Step S11a, the upper end corner portions C1 and C2 of the control gate electrode CG are rounded. However, the sacrifice oxide film 8 is removed at the subsequent cleaning step of Step S12a. Therefore, the film thickness of the sacrifice oxide film 8 can also be set large. The degree of roundness of the upper end corner portions C1 and C2 of the control gate electrode CG is affected by the oxidation rate when the exposed surface (surface) of the control gate electrode CG is oxidized (in Embodiment 1, the silicon oxide film 9a formation step, and in the present embodiment, the sacrifice oxidation step of Step S11a). The larger the oxidation rate is, the larger the degree of roundness of the upper end corner portions C1 and C2 of the control gate electrode CG tends to be. In the present embodiment, the degree of freedom for the oxidation rate of the sacrifice oxidation step of Step S11a (corresponding to the film thickness of the sacrifice oxide film 8) is high. The oxidation rate can be set at the optimum value for rounding the upper end corner portions C1 and C2 of the control gate electrode CG. This facilitates control of the degree of roundness of the upper end corner portions C1 and C2 of the control gate electrode CG.

On the other hand, after the cleaning treatment using hydrofluoric acid (in Embodiment 1, the cleaning treatment of Step S12, and in the present embodiment, the cleaning treatment of Step S10a or S12a), a water washing treatment is necessary in order to sufficiently remove the hydrofluoric acid. In the present embodiment, after the cleaning treatment of Step S10a, and after the cleaning treatment of Step S12a, the semiconductor substrate 1 is required to be washed with water (rinsed with water), respectively. In contrast, in Embodiment 1, after the cleaning treatment of Step S12, the treatment of washing (rinsing) the semiconductor substrate 1 with water is performed. However, in the cleaning treatment of Step S10, hydrofluoric acid is not used. Therefore, the hydrofluoric acid treatment and water washing steps of Step S10 can be cut. Accordingly, the number of manufacturing steps of the semiconductor device can be reduced.

Up to this point, the invention made by the present inventors was specifically described by way of embodiments thereof. However, the present invention is not limited to the embodiments. It is naturally understood that various changes may be made within the scope not departing from the gist thereof.

The present invention is effectively applicable to a semiconductor device and a manufacturing technology thereof.

What is claimed is:

1. A semiconductor device, comprising:
a semiconductor substrate;
a lamination pattern formed over the semiconductor substrate, and having a first gate electrode, a first insulation film over the first gate electrode, and a second insulation film over the first insulation film;
a second gate electrode formed over the semiconductor substrate, and adjacent to the lamination pattern;
a first gate insulation film formed between the first gate electrode and the semiconductor substrate; and
a third insulation film formed between the second gate electrode and the semiconductor substrate, and between the lamination pattern and the second gate electrode, the third insulation film having a charge storage part in the inside thereof,
wherein at the sidewall on the side of the lamination pattern adjacent to the second gate electrode, the first insulation film is retreated from the first gate electrode, and
wherein an upper end corner portion of the first gate electrode is rounded.

2. The semiconductor device according to claim 1, wherein the first gate electrode comprises a first silicon film.

3. The semiconductor device according to claim 1, wherein the first insulation film comprises a silicon oxide film, and
wherein the second insulation film comprises a silicon nitride film.

4. The semiconductor device according to claim 1, wherein into a region in which the first insulation film is retreated at the sidewall on the side of the lamination pattern adjacent to the second gate electrode, a portion of the third insulation film penetrates.

5. The semiconductor device according to claim 1, wherein the thickness of the first insulation film is larger than the thickness of the first gate insulation film, and
wherein at the sidewall on the side of the lamination pattern adjacent to the second gate electrode, the degree of roundness of the upper end corner portion of the first gate electrode is larger than the degree of roundness of a lower end corner portion of the first gate electrode.

6. The semiconductor device according to claim 1, wherein the first gate insulation film comprises a silicon oxynitride film.

7. The semiconductor device according to claim 1, wherein the third insulation film comprises a lamination film having a first silicon oxide film, a first silicon nitride film over the first silicon oxide film, and a second silicon oxide film over the first silicon nitride film; and
wherein the first silicon nitride film functions as the charge storage part.

8. The semiconductor device according to claim 7, wherein into a region in which the first insulation film is retreated at the sidewall on the side of the lamination pattern adjacent to the second gate electrode, a portion of the first silicon nitride film penetrates.

9. The semiconductor device according to claim 7, wherein the length by which the first insulation film is retreated from the first gate electrode at the sidewall on the side of the lamination pattern adjacent to the second gate electrode is equal to, or larger than the thickness of the first silicon oxide film.

10. The semiconductor device according to claim 1, wherein the second gate electrode has a second silicon film, and a metal silicide layer formed over the second silicon film.

11. A semiconductor device, comprising:
a semiconductor substrate;
a lamination pattern formed over the semiconductor substrate, and having a first gate electrode and a first insulation film over the first gate electrode;
a second gate electrode formed over the semiconductor substrate, and adjacent to the lamination pattern;
a first gate insulation film formed between the first gate electrode and the semiconductor substrate; and
a second insulation film formed between the second gate electrode and the semiconductor substrate, and between the lamination pattern and the second gate electrode, the second insulation film having a charge storage part in the inside thereof, wherein at the sidewall on the side of the lamination pattern adjacent to the second gate electrode, the first insulation film is retreated from the first gate electrode, and wherein an upper end corner portion of the first gate electrode is rounded.

12. The semiconductor device according to claim 11,
wherein the first gate electrode comprises a first silicon film.

13. The semiconductor device according to claim 11,
wherein into a region in which the first insulation film is retreated at the sidewall on the side of the lamination pattern adjacent to the second gate electrode, a portion of the second insulation film penetrates.

14. The semiconductor device according to claim 11,
wherein the thickness of the first insulation film is larger than the thickness of the first gate insulation film, and
wherein at the sidewall on the side of the lamination pattern adjacent to the second gate electrode, the degree of roundness of the upper end corner portion of the first gate electrode is larger than the degree of roundness of a lower end corner portion of the first gate electrode.

15. The semiconductor device according to claim 11,
wherein the second insulation film comprises a lamination film having a first silicon oxide film, a first silicon nitride film over the first silicon oxide film, and a second silicon oxide film over the first silicon nitride film; and
wherein the first silicon nitride film functions as the charge storage part.

16. The semiconductor device according to claim 11,
wherein the second gate electrode has a second silicon film, and a metal silicide layer formed over the second silicon film.

\* \* \* \* \*